United States Patent
Ishii et al.

(10) Patent No.: US 9,599,681 B2
(45) Date of Patent: Mar. 21, 2017

(54) MAGNETIC SENSOR AND MAGNETIC DETECTING METHOD OF THE SAME

(71) Applicant: ASAHI KASEI MICRODEVICES CORPORATION, Tokyo (JP)

(72) Inventors: Hironori Ishii, Tokyo (JP); Hiromi Fujita, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 133 days.

(21) Appl. No.: 14/377,079

(22) PCT Filed: Feb. 6, 2013

(86) PCT No.: PCT/JP2013/000648
§ 371 (c)(1),
(2) Date: Aug. 6, 2014

(87) PCT Pub. No.: WO2013/118498
PCT Pub. Date: Aug. 15, 2013

(65) Prior Publication Data
US 2014/0375311 A1    Dec. 25, 2014

(30) Foreign Application Priority Data

Feb. 7, 2012 (JP) ................................ 2012-024335
Sep. 25, 2012 (JP) ................................ 2012-211168
(Continued)

(51) Int. Cl.
*G01R 33/02* (2006.01)
*G01R 33/09* (2006.01)
*H01L 43/08* (2006.01)

(52) U.S. Cl.
CPC ....... *G01R 33/0206* (2013.01); *G01R 33/093* (2013.01); *H01L 43/08* (2013.01)

(58) Field of Classification Search
CPC .. G01R 33/093; G01R 33/0206; G01R 33/07; G01R 33/075; G01R 15/202; G01R 33/0035; G01R 33/077; G01R 33/09
See application file for complete search history.

(56) References Cited

U.S. PATENT DOCUMENTS

| 5,465,185 A | 11/1995 | Heim et al. |
| 2002/0021124 A1 | 2/2002 | Schott et al. |

(Continued)

FOREIGN PATENT DOCUMENTS

| EP | 2 664 940 A1 | 11/2013 |
| JP | H07-169026 A | 7/1995 |

(Continued)

OTHER PUBLICATIONS

International Preliminary Report on Patentability dated Aug. 21, 2014, for the corresponding International application No. PCT/JP2013/000648.

(Continued)

*Primary Examiner* — Alesa Allgood
(74) *Attorney, Agent, or Firm* — Morgan, Lewis & Bockius LLP

(57) ABSTRACT

The present invention relates to a magnetic sensor and a magnetic detecting method. A first arrangement pattern includes: a first magnetic detection unit (201) including a magnetic sensitivity material (201a) and a magnetic convergence material (201b) having a length different from a length of the magnetic sensitivity unit on a substrate, and being arranged to be parallel to the substrate and arranged horizontally so that a median line (Ma) passing through a midpoint of the magnetic sensitivity material in a longitudinal direction and a median line (Mb) of the magnetic convergence material in the longitudinal direction do not cross with each other; a second magnetic detection unit (202) having the structure same as the structure of the first (Continued)

magnetic detection unit; and a connecting unit electrically connecting the magnetic sensitivity material of the first magnetic detection unit in series with a magnetic sensitivity material of the second magnetic detection unit.

15 Claims, 34 Drawing Sheets

(30) Foreign Application Priority Data

Sep. 27, 2012 (JP) .................................. 2012-214666
Oct. 18, 2012 (JP) .................................. 2012-230600

(56) References Cited

U.S. PATENT DOCUMENTS

| | | |
|---|---|---|
| 2004/0137275 A1 | 7/2004 | Jander et al. |
| 2010/0156405 A1 | 6/2010 | Furukawa et al. |
| 2012/0200292 A1 | 8/2012 | Sugihara et al. |
| 2012/0217961 A1* | 8/2012 | Ando .................... B82Y 25/00 324/252 |

FOREIGN PATENT DOCUMENTS

| | | |
|---|---|---|
| JP | 2002-071381 A | 3/2002 |
| JP | 2003-282996 A | 10/2003 |
| JP | 2004-006752 A | 1/2004 |
| JP | 2006-003116 A | 1/2006 |
| JP | 2009-175120 A | 8/2009 |
| JP | WO 2011089978 * | 7/2011 |
| JP | 2012-112689 A | 6/2012 |
| JP | 2012-127788 A | 7/2012 |
| JP | 5066576 B2 | 11/2012 |
| JP | H05-066576 B2 | 11/2012 |
| WO | 2008/146809 A1 | 12/2008 |
| WO | 2009/048018 A1 | 4/2009 |
| WO | 2009/151024 A1 | 12/2009 |
| WO | 2011/068146 A1 | 6/2011 |
| WO | 2011/089978 A1 | 7/2011 |
| WO | 2012/096132 A1 | 7/2012 |

OTHER PUBLICATIONS

International Search Report dated Apr. 23, 2013 for International application No. PCT/JP2013/000648.
Supplementary Partial European Search Report issued in European Patent Application No. 13 74 6123 on Mar. 14, 2016.

* cited by examiner $\Delta Rx = aHx$

*a IS AN EFFICIENCY OF MAGNETIC FIELD CONVERSION BY A MAGNETIC SUBSTANCE

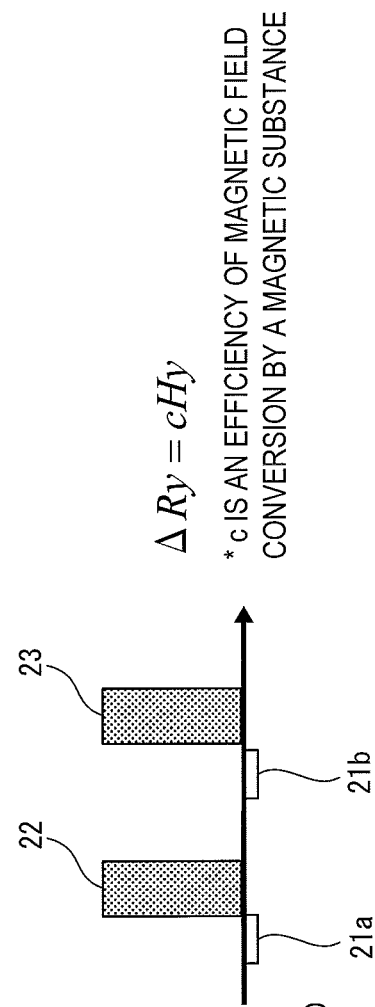
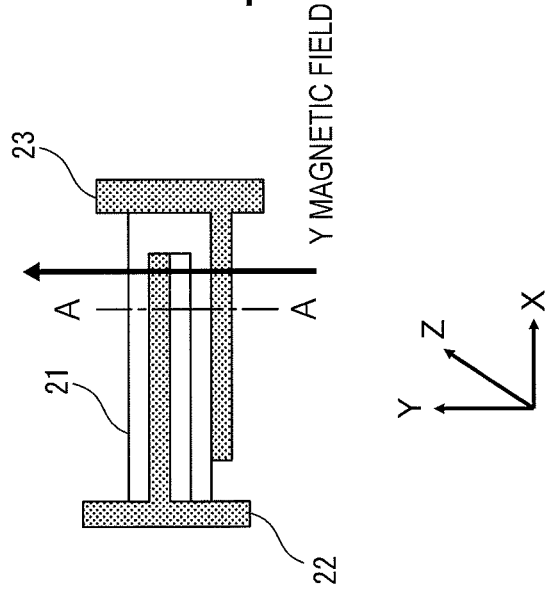

$\Delta Rz = dHz$

* d IS AN EFFICIENCY OF MAGNETIC FIELD CONVERSION BY A MAGNETIC SUBSTANCE

LOCATE POSITIONS SANDWICHING
TWO MAGNETIC SENSITIVITY UNITS
(Z DIRECTION IS NOT CANCELLED)

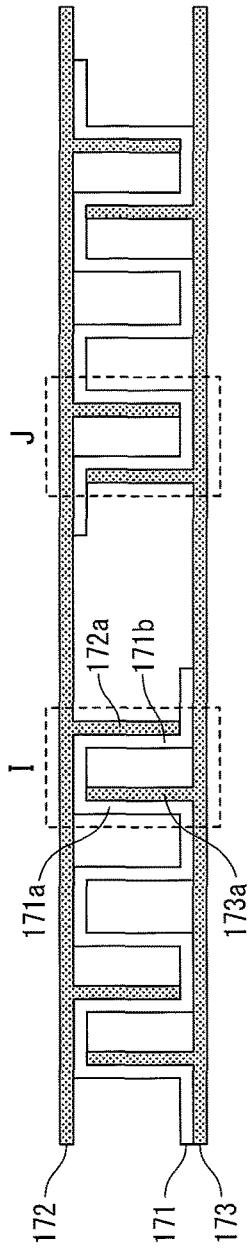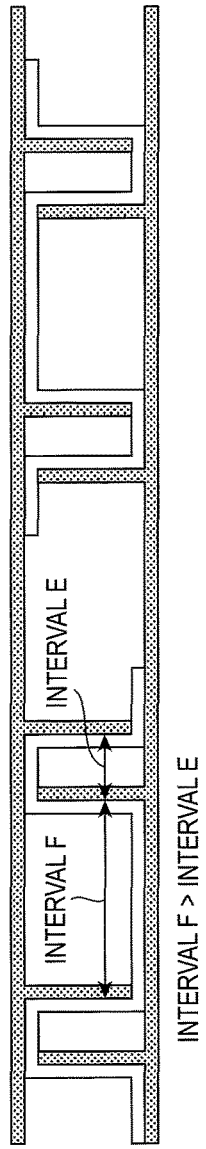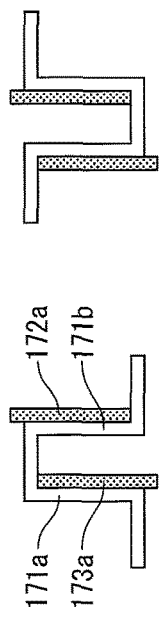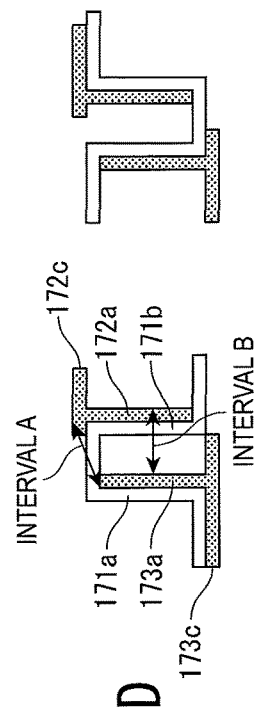
FIG. 19A
FIG. 19B
FIG. 19C
FIG. 19D

MAGNETIC SENSOR AND MAGNETIC DETECTING METHOD OF THE SAME

TECHNICAL FIELD

The present invention relates to a magnetic sensor and a magnetic detecting method of the same, and in more details, relates to a magnetic sensor including a magnetoresistance element and capable of detecting magnetic fields in X, Y, and Z directions on an identical substrate without an increase in electric current consumption, and a magnetic detecting method of the same.

BACKGROUND ART

Generally, Giant Magnet Resistance (GMR) elements for detecting presence or absence of magnetism are widely known. The phenomenon that electric resistivity fluctuates when a magnetic field is applied is called magnetoresistive effect. Although its change rate of a common substance would be several percent, the change rate of such GMR element reaches several tens of percent. For this reason, the GMR elements are widely used for heads of hard disks.

FIG. 1 is a perspective view illustrative of the operation principle of a conventional GMR element, and FIG. 2 is a partial cross-sectional view of FIG. 1. In the drawings, a reference numeral 1 denotes an antiferromagnetic layer, a reference numeral 2 denotes a pinned layer (fixed layer), a reference numeral 3 denotes a Cu layer (spacer layer), and a reference numeral 4 denotes a free layer (free rotation layer). A magnetization direction of a magnetic material changes electronic spin scattering, and changes a resistance. In other words, it is represented by $\Delta R = (R_{AP} - R_P) R_P$ (where $R_{AP}$: when magnetization directions on upper and lower sides are not parallel, and $R_P$: when magnetization directions on upper and lower sides are parallel).

As for the magnetic moment of the fixed layer 2, the direction is fixed by magnetic coupling with the antiferromagnetic layer 1. When the direction of the magnetic moment of the magnetization free rotation layer 4 changes due to leakage field, the resistance which a current flowing through the Cu layer 3 receives changes, and a change of the leakage field can be detected.

FIG. 3 is a schematic diagram illustrative of a laminate structure of the conventional GMR element. In the drawing, a reference numeral 11 denotes an insulating film, a reference numeral 12 denotes a free layer (free rotation layer), a reference numeral 13 denotes a conductive layer, a reference numeral 14 denotes a pinned layer (fixed layer), a reference numeral 15 denotes an antiferromagnetic layer, and a reference numeral 16 denotes an insulating film. The free layer (free rotation layer) 12 is a layer in which a magnetization direction rotates freely, and is made of NiFe or CoFe/NiFe. The conductive layer 13 is a layer in which a current flows and the spin scattering occurs, and is made of Cu. The pinned layer (fixed layer) 14 is a layer in which a magnetization direction is fixed in a fixed direction, and is made of CoFe or CoFe/Ru/CoFe. The antiferromagnetic layer 15 is a layer for fixing the magnetization direction of the pinned layer 14, and is made of PtMn or IrMn. The insulating films 11 and 16 are made of Ta, Cr, NiFeCr, or AlO. The pinned layer may use a self-bias structure instead of the antiferromagnetic layer.

For example, a system described in PTL 1 relates to a magnetic recording system using a GMR element, and is a spin-valve magnetoresistance (MR) sensor including a fixed ferromagnetic layer which has been improved so that the magnetostatic coupling of a free ferromagnetic layer is the minimum. In FIG. 4 of PLT 1, a lamination structure including the free ferromagnetic layer and a fixed ferromagnetic layer is illustrated.

In addition, a magnetic sensor using a Hall device is proposed as a terrestrial magnetism sensor for detecting a three-dimensional magnetic field vector. This type of Hall device can detect a magnetic field in a direction perpendicular to an element face, and can detect a magnetic field in Z direction when the element is arranged on the flat surface. For example, PTL 2 describes that Hall devices are arranged in a cross shape, i.e. on the upper and lower sides, and right and left sides with respect to a symmetry center under a circular magnetic convergence plate. By utilizing a magnetic field in a horizontal direction that is converted into a Z-axis direction at an end of the magnetic convergence plate, not only the Z direction which is a magnetic sensitivity direction of a Hall device of the magnetic field but also the horizontal direction are detected, so that the magnetic fields in X-, Y-, and Z-axis directions can be detected on the identical substrate.

In addition, for example, a sensor described in PTL 3 relates to a magnetic sensor including magnetoresistance effect elements arranged so as to cross in three dimensional directions on a single substrate. Its description is made for a magnetic sensor using the magnetoresistance element including a pinned layer and a free layer, in particular, a magnetic sensor with high sensitivity measuring a magnetic field in a direction perpendicular to a surface of the magnetic sensor. PTL 3 proposes that X-, Y-, and Z magnetic fields are detectable on the same substrate, by performing vector decomposition for the Z magnetic field applied in the vertical direction which is originally undetectable, by forming the magnetic sensor with a magnetoresistance element detecting a horizontal magnetic field on an oblique slope.

In addition, for example, what is described in PTL 4 relates to a three-axis magnetic sensor having a high sensitivity for azimuth detection, being compact, and having excellent mass production nature. The magnetic sensor includes: a two-axis magnetic sensor unit for detecting terrestrial magnetism components in the two-axis directions (X and Y axes) which are set parallel to the substrate surface and perpendicular to each other; and a magnetic member concentrating a magnetic field in the perpendicular direction (Z axis) to a surface including the two axes and arranged on the two-axis magnetic sensor unit. Proposed is that coils are formed on a magnetoresistance element, and the direction of a magnetic field is converted by a magnetic body with 4-fold rotational symmetry with a magnetization direction being controlled by a magnetic field occurred by a current flowing through the coils, so that the X-, Y-, and Z magnetic fields can be detected on the identical substrate.

In addition, for example, an element described in PTL 5 relates to a giant magnet resistance element which receives few influence of a direction of a magnetic field, and which can detect a magnitude of a magnetic field with sufficient accuracy. The GMR element is formed by a pattern with one polygonal line against a GMR chip, and the GMR chip is implemented on the substrate.

CITATION LIST

Patent Literature

PTL 1: JP H07-169026 A
PTL 2: JP 2002-71381 A
PTL 3: JP 2004-6752 A

PTL 4: JP 2006-3116 A
PTL 5: JP 2003-282996 A

SUMMARY OF INVENTION

Technical Problem

However, PTL 1 discloses the GMR element provided with a lamination structure including the free ferromagnetic layer and the fixed ferromagnetic layer, but does not disclose an arrangement pattern in which a magnetoresistance element and magnetic convergence plates are combined like a magnetic sensor of the present invention.

Moreover, as to the sensor described in PTL 2, amplification signal processing is needed in a subsequent stage due to the low sensitivity of the Hall device, in order to detect the terrestrial magnetism with sufficient accuracy. Hence, the electric current consumption may be increased.

Besides, as to the magnetic sensors described in PTLs 3 and 4, their sensitivities are higher than that of the Hall device, since the magnetoresistance elements are used, and therefore it is not necessary to perform complicated signal processing in a subsequent stage. However, there is a problem in mass production performance due to the formation of the slanted substrate or the formation of coils. In addition, in PTL 4, an increase in the electric current consumption due to a coil is worried about.

As for the GMR element described in PTL 5, which discloses an element formed with a pattern of one polygonal line on the GMR chip, but does not disclose an arrangement pattern in which a magnetoresistance element and magnetic convergence plates are combined as a magnetic sensor of the present invention. Furthermore, since PTL 5 does not have a spin valve structure, a polarity of a magnetic field cannot be determined, and thus there is a problem that it is hard to use as a magnetic sensor.

The present invention has been made in view of such problems, and an object is to provide a magnetic sensor which includes a magnetoresistance element and can detect magnetic fields of X-, Y-, and Z-axis directions on the identical substrate without causing an increase of electric current consumption, and a magnetic detecting method of the magnetic sensor.

BRIEF DESCRIPTION OF DRAWINGS

FIGS. 6A and 6B are schematic diagrams illustrative of the magnetic sensor to be used for the magnetic sensor according to the present invention, and are schematic diagrams illustrative of an arrangement pattern of the GMR elements and the magnetic convergence plates (magnetic field conversion of the Y-axis direction);

FIGS. 19A to 19D are schematic diagrams illustrative of a magnetic sensor according to a fifth embodiment of the present invention;

DESCRIPTION OF EMBODIMENTS

Figure 1:
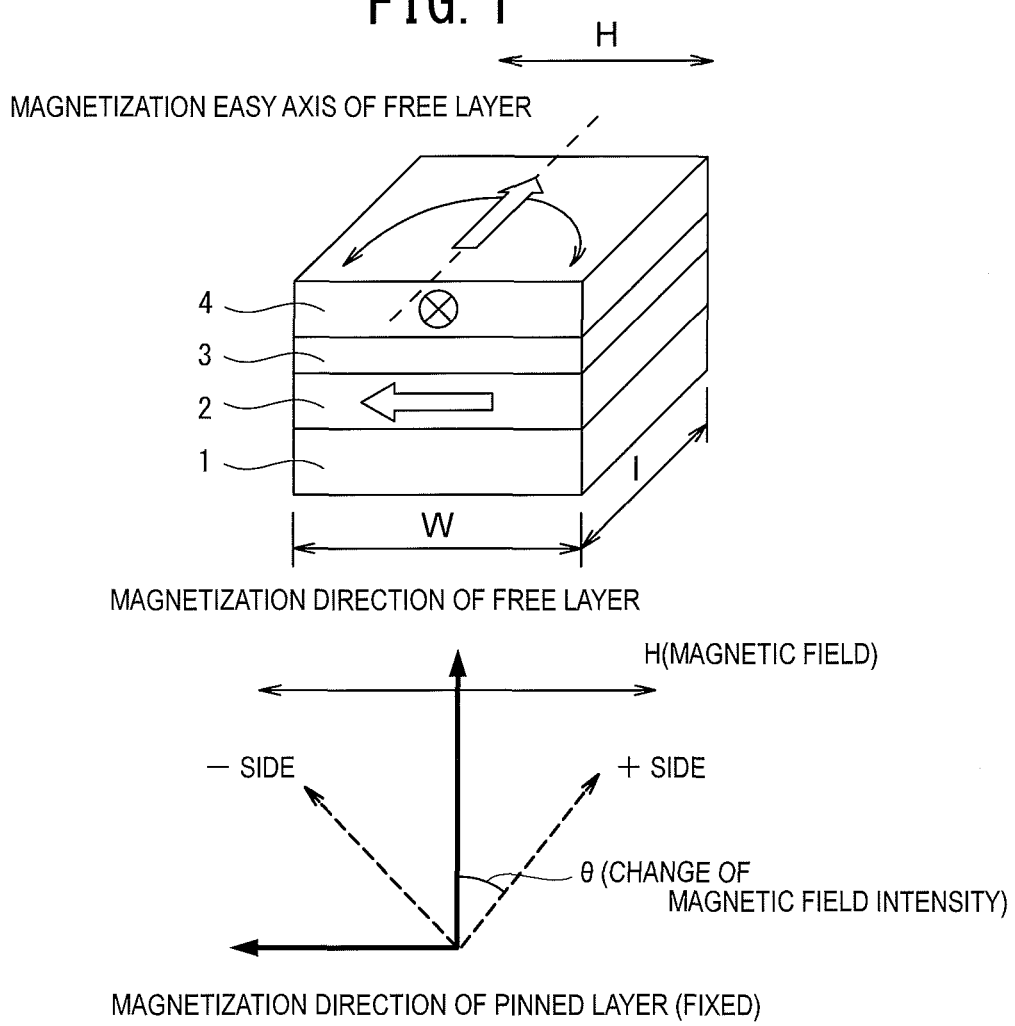
FIG. 1 is a perspective view illustrative of the operation principle of a conventional GMR element.
Figure 2:
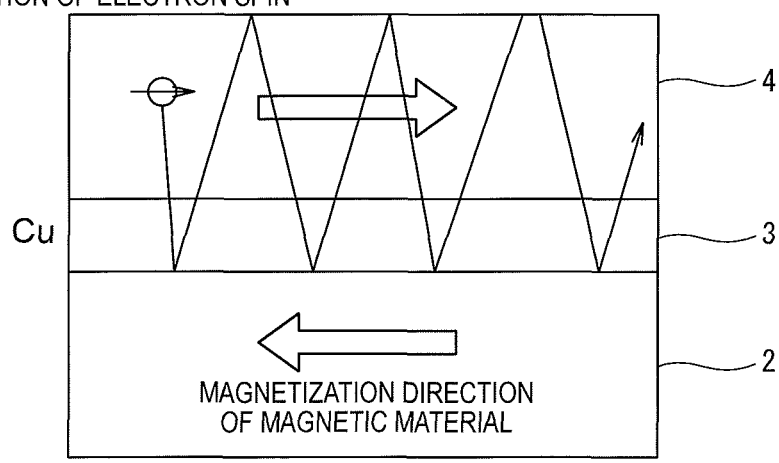
FIG. 2 is a partial cross-sectional view of FIG. 1.
Figure 3:
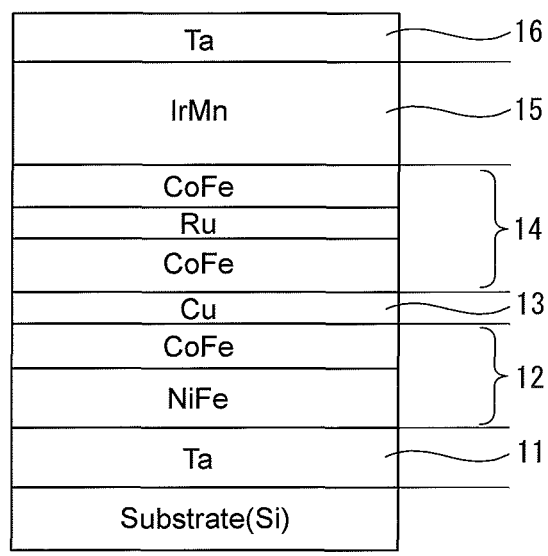
FIG. 3 is a schematic diagram illustrative of a laminate structure of the conventional GMR element.
Figure 4:
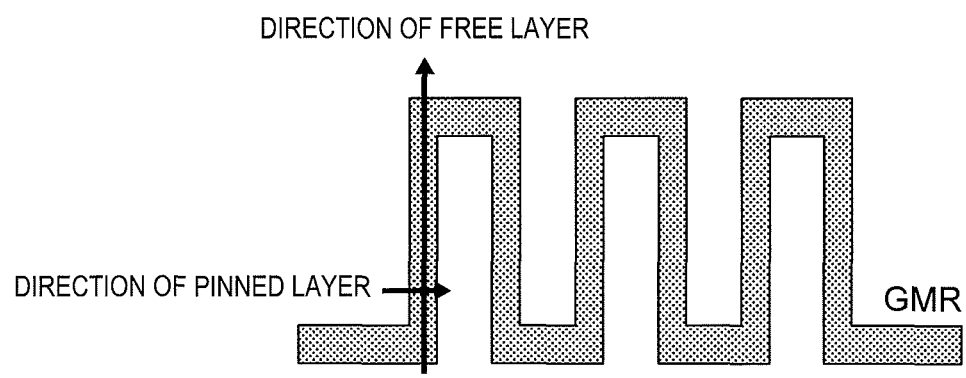
FIG. 4 is a plan view illustrative of a pattern shape of GMR.

First, a fundamental arrangement pattern of a GMR element as a magnetoresistance element and magnetic convergence plates as a magnetic convergence material for a magnetic sensor to be used for a magnetic sensor according to the present invention will be hereinafter described. FIG. 4 is a schematic diagram illustrative of the magnetic sensor to be used for the magnetic sensor according to the present invention, and a schematic diagram illustrative of the fundamental arrangement pattern of the GMR element as the magnetoresistance element and the magnetic convergence plates.

The GMR element has a meander structure with plural turns. The number of turns in the GMR element is not limited, and the GMR element can be arbitrarily designed in accordance with an intended resistance, since its resistance is determined by the length of the turns of the GMR element. Although the folded parts are folded into a letter U shape in the drawing, projections may be arranged at the end parts, or interconnect layers made by a permanent magnet, Cu, or the like may be used for connection.

Moreover, the short side direction of the meander-shaped GMR element is the magnetization direction of a pinned layer, and the longitudinal direction is the magnetization direction of a free layer. The magnetization direction of the pinned layer, i.e. the short side direction of the GMR element is parallel to the sensitivity axis direction.

Figure 5A:
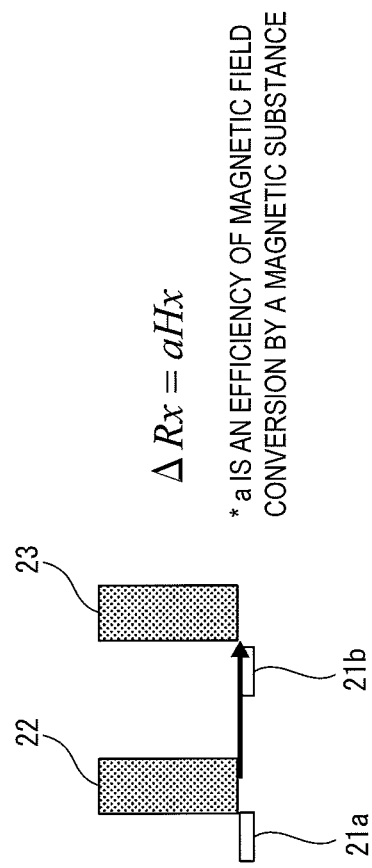
FIGS. 5A and 5B are schematic diagrams illustrative of a magnetic sensor to be used for a magnetic sensor according to the present invention, and are schematic diagrams illustrative of an arrangement pattern of GMR elements and magnetic convergence plates (magnetic field conversion of the X-axis direction)
Figure 5B:
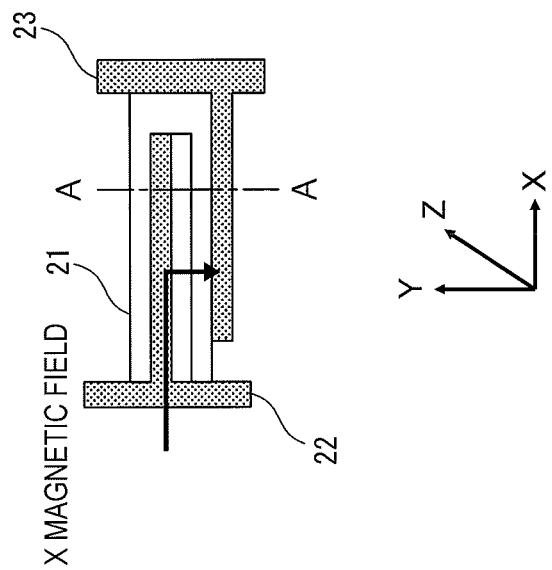
Figure 7A:
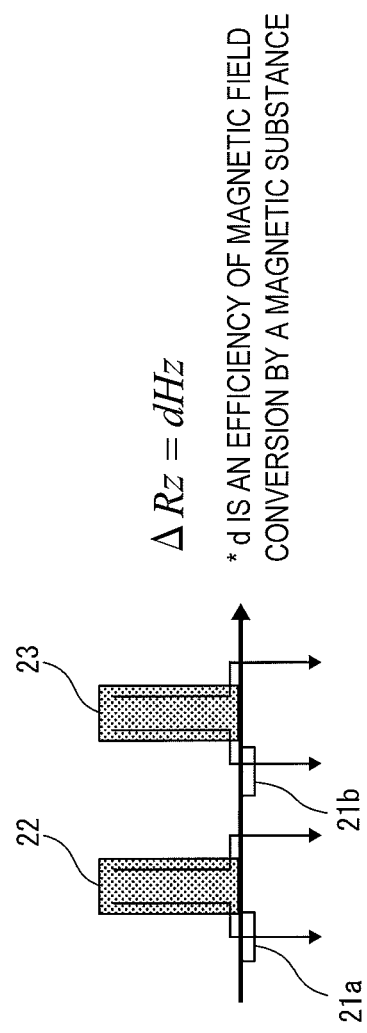
FIGS. 7A and 7B are schematic diagrams illustrative of the magnetic sensor to be used for the magnetic sensor according to the present invention, and are schematic diagrams illustrative of an arrangement pattern of the GMR elements and the magnetic convergence plates (magnetic field conversion of the Z-axis direction)
Figure 7B:
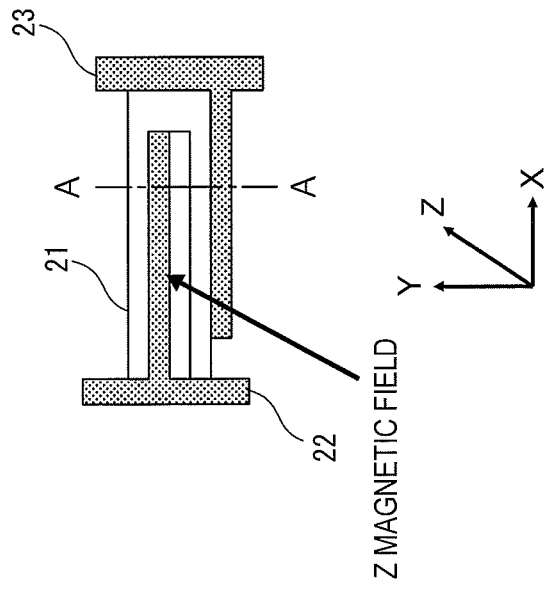

FIGS. 5A and 5B to FIGS. 7A and 7B are schematic diagrams illustrative of the magnetic sensor to be used for the magnetic sensor according to the present invention, and schematic diagrams illustrative of the fundamental arrangement patterns of the GMR element as the magnetoresistance element, and magnetic convergence plates. FIGS. 5A and 5B are drawings illustrative of an embodiment of the magnetic field conversion in the X-axis direction according to magnetic convergence plates. FIGS. 6A and 6B are drawings illustrative of an embodiment of the magnetic field conversion in the Y-axis direction according to magnetic convergence plates. FIGS. 7A and 7B are drawings illustrative of an embodiment of the magnetic field conversion in the Z-axis direction according to magnetic convergence plates.

The substrate for forming the magnetoresistance element is not limited to a specific substrate, such as a silicon substrate, a compound semiconductor substrate, a ceramic substrate, or the like. It does not matter, even if a circuit is formed on the substrate.

The GMR element is herein used as the magnetoresistance element, but it is not limited to the GMR element. A tunnel magnetoresistance (TMR) element, or any other magnetoresistance varying elements may be used. Any magnetic convergence plates may be used as far as the magnetic material exhibits a soft magnetic property, such as NiFe, NiFeB, NiFeCo, or CoFe.

First, based on FIGS. 5A and 5B, the embodiment of the magnetic field conversion in the X-axis direction by use of the magnetic convergence plates will be described. FIG. 5A is a schematic diagram illustrative of the arrangement pattern of the GMR element and magnetic convergence units, and FIG. 5B is a cross-sectional view cut along A-A line in FIG. 5A. In the drawings, a reference numeral 21 denotes the GMR element, and a reference numeral 22 denotes a magnetic convergence unit. One magnetic convergence plate 22 is arranged opposite to another magnetic convergence plate 23.

As for the GMR element 21, the width and length of the GMR element can be adjusted arbitrarily to conform to the resistance and the sensitivity of the GMR element. However, the pitch of the meandering form is preferably greater than the width of the magnetic convergence plates, since the magnetic convergence plates are arranged between the GMR elements.

Moreover, as the width of the GMR element also determines the sensitivity and the operating magnetic field range of the sensor, the width should be optimized. The width in the direction of the pinned layer, which is the short side direction of the GMR element, 0.1 to 20 micrometers are desirable. This is because the element size becomes large too much when the width of the GMR element is wide, and the sensitivity degrades when the width is too narrow. Therefore, 0.1 to 10 micrometers are desirable.

The magnetic convergence unit 22 includes two magnetic convergence units which are independent from each other and arranged in positions to sandwich the GMR element, and a magnetic convergence unit perpendicularly connected with the units. Herein, the magnetic convergence units arranged in the positions to sandwich the GMR element are referred to as comb-teeth-like magnetic convergence plates, and the part perpendicularly connected with the comb-teeth-like magnetic convergence plates is referred to as a beam-like magnetic convergence plate.

FIG. 5B illustrates a positional relationship of the comb-teeth-like magnetic convergence plates and the GMR elements. As for the horizontal positional relationship between the GMR 21b and the magnetic convergence unit 23, it is desirable that the right end of the GMR 21b be arranged on the magnetic convergence unit 23 side from a midpoint of the magnetic convergence units 22 and 23, and the left end of the GMR 21b is arranged on the left side from of the left end of the magnetic convergence unit 23. The right end of the GMR 21b preferably contacts the magnetic convergence unit 23. As for the positional relationship between the GMR 21b and the magnetic convergence unit 23 in the cross-section direction, it is desirable that the bottom surface of the GMR 21b be located below the bottom surface of the magnetic convergence unit 23. The upper surface of the GMR 21b may be arranged below the bottom surface of the magnetic convergence plate 23, and specifically, it may be arranged within 2 microns of a height interval.

The magnetic amplification effect can be more improved, as the comb-teeth-like magnetic convergence plate is thinner and the magnetic convergence plate is thicker. It is desirable that an aspect ratio which is obtained by dividing the thickness of the magnetic convergence plate by the width of the magnetic convergence plate be 1 or more, and the width of the comb-teeth-like magnetic convergence plate is preferably 1 to 40 micrometers.

Note that the right direction of the sheet is defined as a positive (+) X-axis direction, the upward direction is defined as a positive (+) Y-axis direction, and a direction perpendicular to the sheet is defined as a positive (+) Z-axis direction. A change in resistance with such a configuration when the X, Y, and Z magnetic fields are applied to the GMR 21 will be described.

When the magnetic field in +X direction is applied, the magnetic field applied to the magnetic convergence plate 22 is bent to a negative Y-direction side, and the GMR element 21 receives a magnetic field having an opposite polarity. The change in resistance at that time satisfies the following relational expression.

$\Delta Rx = aHx$ (where "$a$" is an efficiency of magnetic field conversion by a magnetic substance)

The efficiency of the magnetic field conversion can be arbitrarily adjusted by the shape of the magnetic convergence plates and relative positions of GMR and the magnetic convergence plates, and is not limited especially.

Next, based on FIGS. 6A and 6B, an embodiment of the magnetic field conversion for the Y-axis direction according to the magnetic convergence plates will be described. FIG. 6A is a schematic diagram illustrative of the arrangement pattern of the GMR element and the magnetic convergence plates. FIG. 6B is a cross-sectional view cut along an A-A line in FIG. 5A. A magnetic field the direction of which is similar to the external magnetic field is applied to all GMR elements 21. In other words, the following relational expression is satisfied.

$\Delta Ry = cHy$ (where $c$ is an efficiency of magnetic field conversion by a magnetic substance)

Next, based on FIGS. 7A and 7B, an embodiment of the magnetic field conversion for the Z-axis direction on the magnetic convergence plates will be described. FIG. 7A is a schematic diagram illustrative of the arrangement pattern of the GMR element and the magnetic convergence plates. FIG. 7B is a cross-sectional view cut along an A-A line in FIG. 7A The Bz magnetic field converged by the comb-like magnetic convergence plate of the magnetic convergence plates 23 is bent in positive and negative (+, −) Y-axis direction, when exiting from the comb-like magnetic convergence plate. However, the GMR element 21 closest to the comb-teeth-like magnetic convergence plate only detects the magnetic field on one side (in +Y-axis direction). In other words, the following relational expression is satisfied.

$\Delta Rz = dHz$ (where $d$ is an efficiency of the Z-axis magnetic field conversion)

Figure 8A:
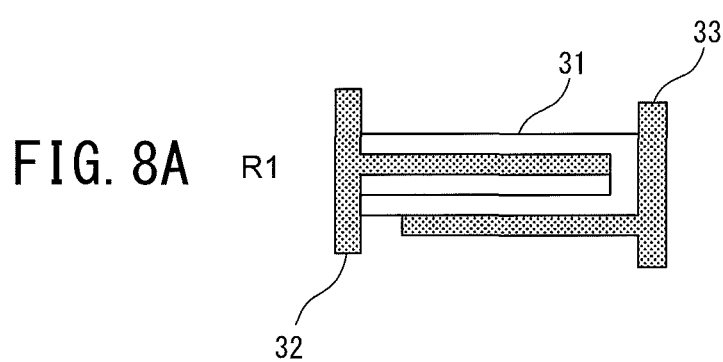
FIGS. 8A and 8B are schematic diagrams illustrative of the magnetic sensor to be used for the magnetic sensor according to the present invention.
Figure 8B:
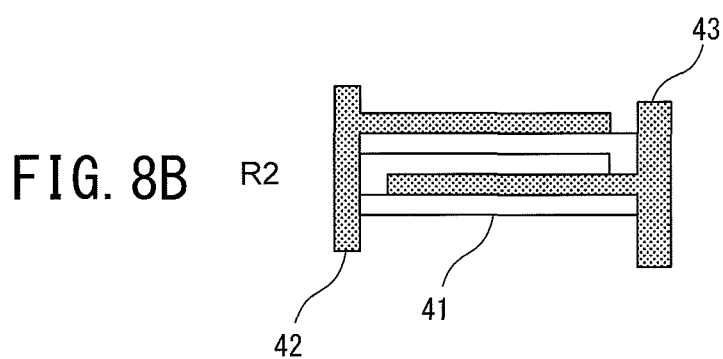

FIGS. 8A and 8B are schematic diagrams illustrative of the magnetic sensor to be used for the magnetic sensor according to the present invention, and are schematic diagrams illustrative of an arrangement pattern of the GMR element and the magnetic convergence plates (magnetic field conversions in X-axis, Y-axis, and Z-axis directions). The arrangement patterns of the GMR element and the magnetic convergence plates in FIGS. 8A and 8B have the substantially the same configuration as the arrangement pattern illustrated in FIG. 5A.

R1 represents a magnetic detection unit including a GMR 31 and magnetic convergence plates 32 and 33. R2 represents a magnetic detection unit including a GMR 41 and magnetic convergence plates 42 and 43. R represents each of resistances when no magnetic field is applied.

According to such a configuration, the resistance change when the resistance of the GMR element changes in accordance with the magnetic fields is represented by the following relational expression.

$R' = R(1 + \Delta R/R)$

The difference between R1 and R2 when the magnetic field of Z/Y/Z is applied to R1 and R2 at the same time is represented by the following relational expression.

$$R1 = R(1 + (\Delta Rx1 + \Delta Ry1 + \Delta Rz1)/R)$$

$$R2 = R(1 + (\Delta Rx2 + \Delta Ry2 + \Delta Rz2)/R)$$

$$\Delta R = R2 - R1$$
$$= R(1 + (\Delta Rx2 + \Delta Rx2 + \Delta Rz2)/R) -$$
$$R(1 + (\Delta Rx2 + \Delta Ry1 + \Delta Rz1)/R)$$
$$= (\Delta Rx2 - \Delta Rx1) + (\Delta Rx2 - \Delta Ry1) + (\Delta Rz2 - \Delta Rz1)$$

Constant terms are canceled by obtaining a difference between the two resistances, and an amount of the resistance change can be found only from the difference between the amounts of resistance changes due to the magnetic field. Since an output is represented by the following expression in a constant current drive, the amount of the resistance change (that is magnetic field intensity) is calculable from the output.

$$V\text{out}=(\Delta R/R)\times R1 = \Delta R \times I$$

Although the present embodiment illustrates an example of a constant current drive, a drive system is not limited to this.

Hereinafter, embodiments of the present invention will be described below in detail with reference to the drawings.

First Embodiment

Figure 9:
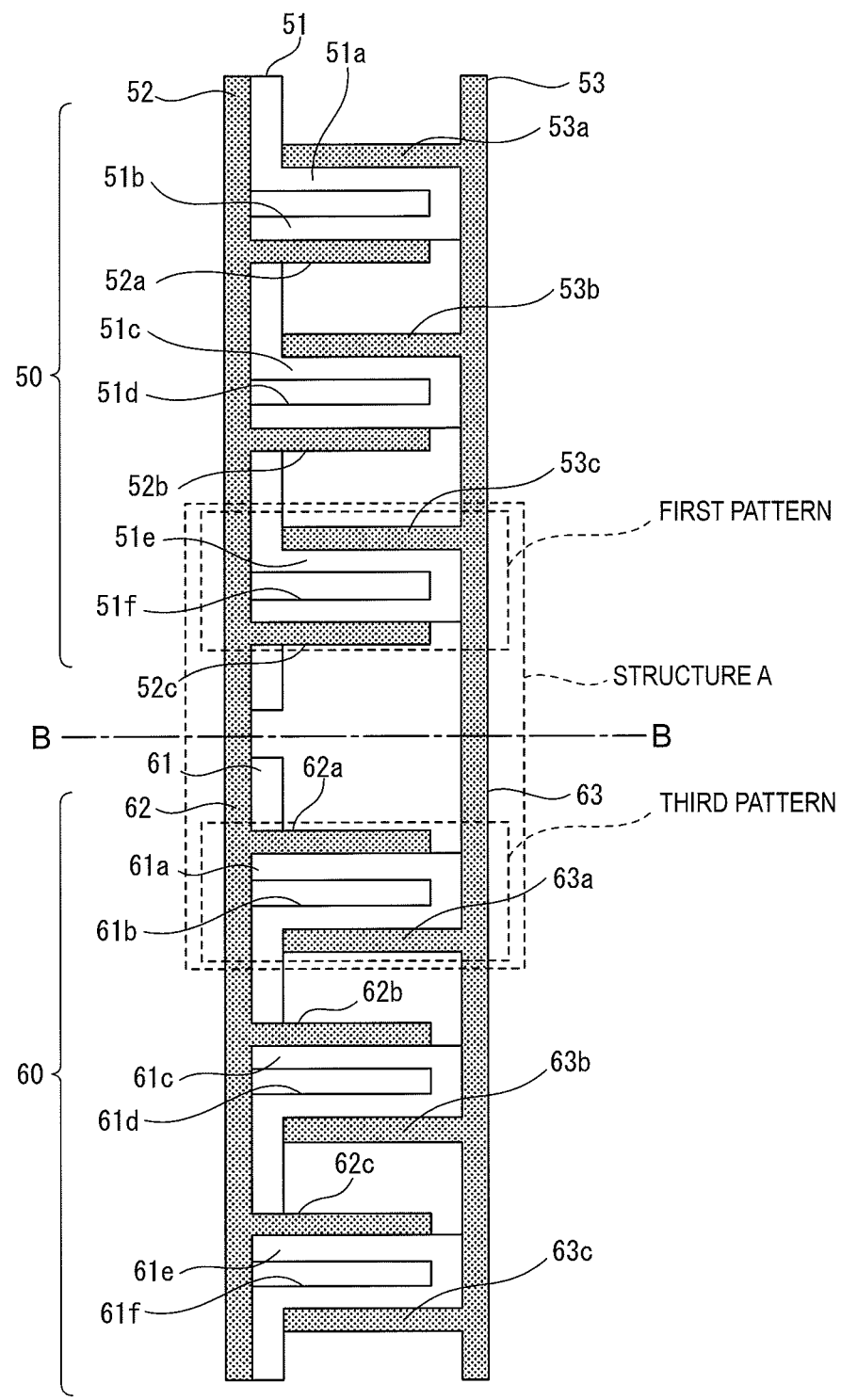
FIG. 9 is a schematic diagram illustrative of the magnetic sensor according to a first embodiment of the present invention.

FIG. 9 is a schematic diagram illustrative of the magnetic sensor according to a first embodiment of the present invention, and is a schematic diagram illustrative of the arrangement pattern of the GMR element and the magnetic convergence plates in an X-axis magnetic sensor.

In the drawing, a reference numeral 50 denotes a first magnetic sensor unit, a reference numeral 51 denotes a GMR element, a reference numeral 51a denotes a first part of the GMR element 51, a reference numeral 51b denotes a second part of the GMR element 51, a reference numeral 51c denotes a third part of the GMR element 51, a reference numeral 51d denotes a fourth part of the GMR element 51, a reference numeral 51e denotes a fifth part of the GMR element 51, a reference numeral 51f denotes a sixth part of the GMR element 51, a reference numeral 52 denotes a magnetic convergence plate, a reference numeral 52a denotes a first part of comb-teeth of the magnetic convergence plate 52, a reference numeral 52b denotes a second part of comb-teeth of the magnetic convergence plate 52, a reference numeral 52c denotes a third part of comb-teeth of the magnetic convergence plate 52, a reference numeral 53 denotes another magnetic convergence plate, a reference numeral 53a denotes a first part of comb-teeth of the magnetic convergence plate 53, a reference numeral 53b denotes a second part of comb-teeth of the magnetic convergence plate 53, and a reference numeral 53c denotes a third part of comb-teeth of the magnetic convergence plate 53.

In addition, in the drawing, a reference numeral 60 denotes a second magnetic sensor unit, a reference numeral 61 denotes a GMR element, a reference numeral 61a denotes a first part of the GMR element 61, a reference numeral 61b denotes a second part of the GMR element 61, a reference numeral 61c denotes a third part of the GMR element 61, a reference numeral 61d denotes a fourth part of the GMR element 61, a reference numeral 61e denotes a fifth part of the GMR element 61, a reference numeral 61f denotes a sixth part of the GMR element 61, a reference numeral 62 denotes a magnetic convergence plate, a reference numeral 62a denotes a first part of comb-teeth of the magnetic convergence plate 62, a reference numeral 62b denotes a second part of comb-teeth of the magnetic convergence plate 62, a reference numeral 62c denotes a third part of comb-teeth of the magnetic convergence plate 62, a reference numeral 63 denotes another magnetic convergence plate, a reference numeral 63a denotes a first part of comb-teeth of the magnetic convergence plate 63, a reference numeral 63b denotes a second part of comb-teeth of the magnetic convergence plate 63, and a reference numeral 63c denotes a third part of comb-teeth of the magnetic convergence plate 63.

Each of the magnetic convergence plates 52 and 62 is provided with plural comb-teeth-like magnetic convergence plates in the direction orthogonal to a beam-like member and at equal interval from the beam-like member toward one side. Each of the magnetic convergence plates 53 and 63 is provided opposite to the magnetic convergence plate 52, and is provided with plural magnetic convergence plates in the direction orthogonal to another beam-like member and at equal interval from another beam-like member toward one side. The GMR elements 51 and 61 are arranged in the form of a meander structure along with protruding magnetic convergence plates of the magnetic convergence plates, and are arranged so as to contact the long sides of the comb-teeth-like magnetic convergence plates.

According to such a configuration, a first magnetic detection unit is provided such that the comb-teeth-like magnetic convergence plate 53c adjoins the GMR element 51e which is a magnetic sensitivity unit in the longitudinal direction, and a midpoint of the comb-teeth-like magnetic convergence plate 53c is arranged at outside from a midpoint of the GMR element 51e. In addition, a second magnetic detection unit is provided such that the comb-teeth-like magnetic convergence plate 52c adjoins the GMR element 51f which is a magnetic sensitivity unit in the longitudinal direction, and a midpoint of the comb-teeth-like magnetic convergence plate 52c is arranged at outside from a midpoint of the GMR element 51f. Thus, a first arrangement pattern which is a single pattern is provided to connect the magnetic sensitivity units of the first magnetic detection unit in series with the second magnetic detection unit are connected.

Furthermore, at a point symmetric position to the first pattern, a first magnetic detection unit is provided such that the comb-teeth-like magnetic convergence plate 62a adjoins the GMR element 61a which is a magnetic sensitivity unit in the longitudinal direction, and a midpoint of the comb-teeth-like magnetic convergence plate 62a is arranged at outside from a midpoint of the GMR element 61a. In addition, a second magnetic detection unit is provided such that the comb-teeth-like magnetic convergence plate 63a adjoins the GMR element 61b which is a magnetic sensitivity unit in the longitudinal direction, and a midpoint of the comb-teeth-like magnetic convergence plate 63a is arranged at outside from a midpoint of the GMR element 61b. Thus, a third arrangement pattern which is a single pattern is provided to connect the magnetic sensitivity units of the first magnetic detection unit in series with the second magnetic detection unit.

Moreover, a first magnetic sensor unit 50 including the first arrangement pattern, and a second magnetic sensor 60 including the third arrangement pattern are provided, and the first arrangement pattern of the first magnetic sensor unit 50 and the third arrangement pattern of the second magnetic sensor unit 60 are line symmetry with each other.

Additionally, in the first magnetic sensor unit 50, the GMR element 51e and the GMR element 51d is connected in series with the GMR element 51c and the GMR element 51b so that plural first arrangement patterns can be arranged adjacent to each other by connecting an end of the magnetic sensitivity unit in series with an end of another magnetic sensitivity unit, with the units being connected in each first arrangement pattern.

The beam-like magnetic convergence plate is arranged so that length in the longitudinal direction is longer than an interval between the comb-teeth-like magnetic convergence plates 52c and 53c. Moreover, it is arranged so that the interval between the comb-teeth-like magnetic convergence plates 52c and 53c is shorter than an interval between the comb-teeth-like magnetic convergence plates 52b and 53c.

In the second magnetic sensor unit 60, the GMR element 61b and the GMR element 61c, and the GMR element 61d and the GMR element 61e are linearly connected so that plural second patterns can be arranged adjacent to each other by connecting an end of the magnetic sensitivity unit in series with an end of another magnetic sensitivity unit, with the units being connected in each third arrangement pattern.

The beam-like magnetic convergence plate is arranged so that a length in the longitudinal direction is longer than an interval between the comb-teeth-like magnetic convergence plates 62a and 63a. Moreover, it is arranged so that the interval between the comb-teeth-like magnetic convergence plates 62a and 63a is shorter than an interval between the comb-teeth-like magnetic convergence plates 62b and 63a.

An axis in the longitudinal direction of the first magnetic sensor unit 50 and an axis in the longitudinal direction of the second magnetic sensor unit 60 are parallel to each other. Moreover, an axis in the longitudinal direction of the first magnetic sensor unit 50 and an axis in the longitudinal direction of the second magnetic sensor unit 60 are parallel to each other, and are coaxially provided.

In other words, the X-axis magnetic sensor in the magnetic sensor according to the present invention includes the first magnetic sensor unit 50, and the second magnetic sensor unit 60. The first magnetic sensor unit 50 and the second magnetic sensor unit 60 are arranged to be line symmetry about a B-B line, in other words, one of the parts classified into two parts bordering on the symmetry-axis B-B line, one of the first magnetic sensor unit 50 and the second magnetic sensor 60 overlap another one when being folded.

With reference to FIG. 9, an independent detecting method of the magnetic field in the X-axis direction will be described. In the above-described configuration, the resistance change when the resistance of the GMR element changes in accordance with the magnetic fields is represented by the following relational expression. In other words, when X1 represents the resistance change of the first magnetic sensor unit 50 in FIG. 9, and X2 represents the resistance change of the second magnetic sensor unit 60, the resistance change X1 of the first magnetic sensor unit 50 satisfies the following relational expression.

$\Delta Rx = aHx$ $\Delta Ry = cHy$ $\Delta Rz = dHz - dHz = 0$ $X1 = \Delta Rx + \Delta Ry + \Delta Rz = aHx + Hy$ Similarly, the resistance change X2 of the second magnetic sensor 60 satisfies the following relational expression.

$\Delta Rx = -aHx$ $\Delta Ry = cHy$ $\Delta Rz = dHz - dHz = 0$ $X2 = \Delta Rx + \Delta Ry + \Delta Rz = -aHx + Hy$ Therefore, calculation with X1 and X2 results in $X2 - X1 = 2aHx$.

In this way, the Z-axis direction can be canceled by positive and negative (+, −) components. Arranging the GMR elements at interval of one bit so as to direct the magnetic field of the X-axis direction into the same direction in one element allows a signal with Hx component to be extracted independently by a calculation. In other words, according to the comb-like magnetic convergence plates of the magnetic sensor, the X-axis direction, the Y-axis direction, and the Z-axis direction are converted, such that a magnetic field conversion is performed on the magnetic field in the X-axis direction so that a magnetic field is applied in a direction opposite to the first and second GMR elements, and the magnetic field in the Y-axis direction is converted to be the same direction, whereas the magnetic fields in the Z-axis direction are canceled since positive/negative (+/−) magnetic fields are respectively applied in the first and second GMR elements arranged at the inside of the letter U-shaped part of the magnetic convergence plates. Further, calculating the difference between the resistances of the first GMR element and the second GMR element cancels the magnetic field in the Y-axis direction, and amplifies double the magnetic field in the X-axis direction.

Figure 10:
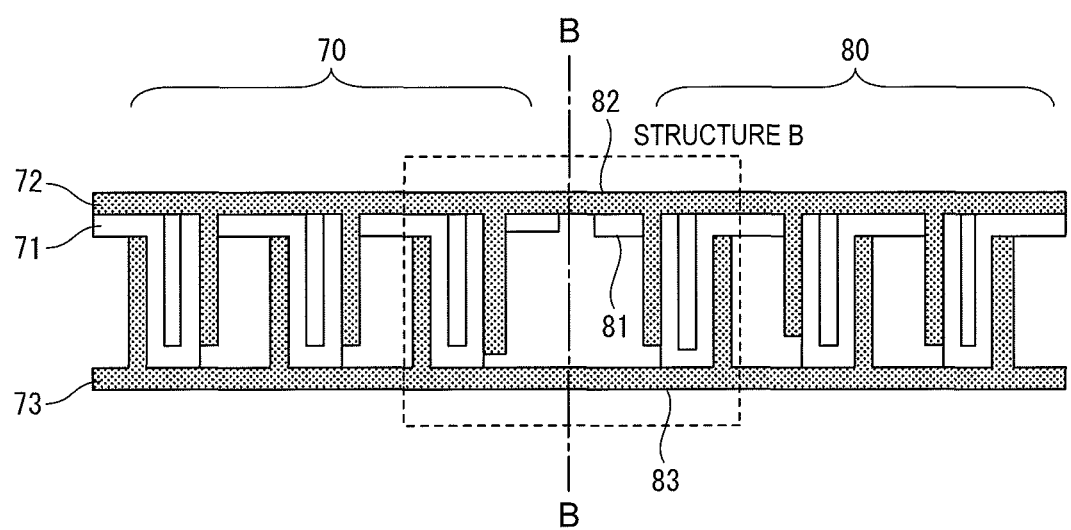
FIG. 10 is another schematic diagram illustrative of the magnetic sensor according to the first embodiment of the present invention.

FIG. 10 is another schematic diagram illustrative of the magnetic sensor according to the first embodiment of the present invention. As for an independent detecting method of the magnetic field in the Y-axis direction, as illustrated in FIG. 10, it is apparent that the magnetic field can be detected when using a Y-axis detecting sensor with an arrangement in which the X-axis detecting sensor is rotated by 90 degrees, and includes a third magnetic sensor unit 70 and a fourth magnetic sensor unit 80. Note that reference numerals 71 and 81 denote GMR elements, each of reference numerals 72 and 82 denotes a magnetic convergence plate, and each of reference numerals 73 and 83 denotes another magnetic convergence plate.

Moreover, a third magnetic sensor unit 70 including the first arrangement pattern, and a fourth magnetic sensor unit 80 including the third arrangement pattern are provided, and the first arrangement pattern of the third magnetic sensor unit 70 and the third arrangement pattern of the third magnetic sensor unit 80 are line symmetry with each other.

Similarly, according to the comb-like magnetic convergence plates of the magnetic sensor, the X-axis direction, the Y-axis direction, and the Z-axis direction are converted, such that a magnetic field conversion is performed on the magnetic field in the Y-axis direction so that a magnetic field is applied in a direction opposite to the first and second GMR elements, and the magnetic field in the X-axis direction is converted to be the same direction, whereas the magnetic fields in the Z-axis direction are canceled since +/− magnetic fields are respectively applied in the first and second GMR elements arranged at the inside of the letter U-shaped part of the magnetic convergence plates. Further, calculating the difference between the resistances of the first GMR element and the second GMR element cancels the magnetic field in the X-axis direction, and amplifies double the magnetic field in the Y-axis direction.

Figure 11:
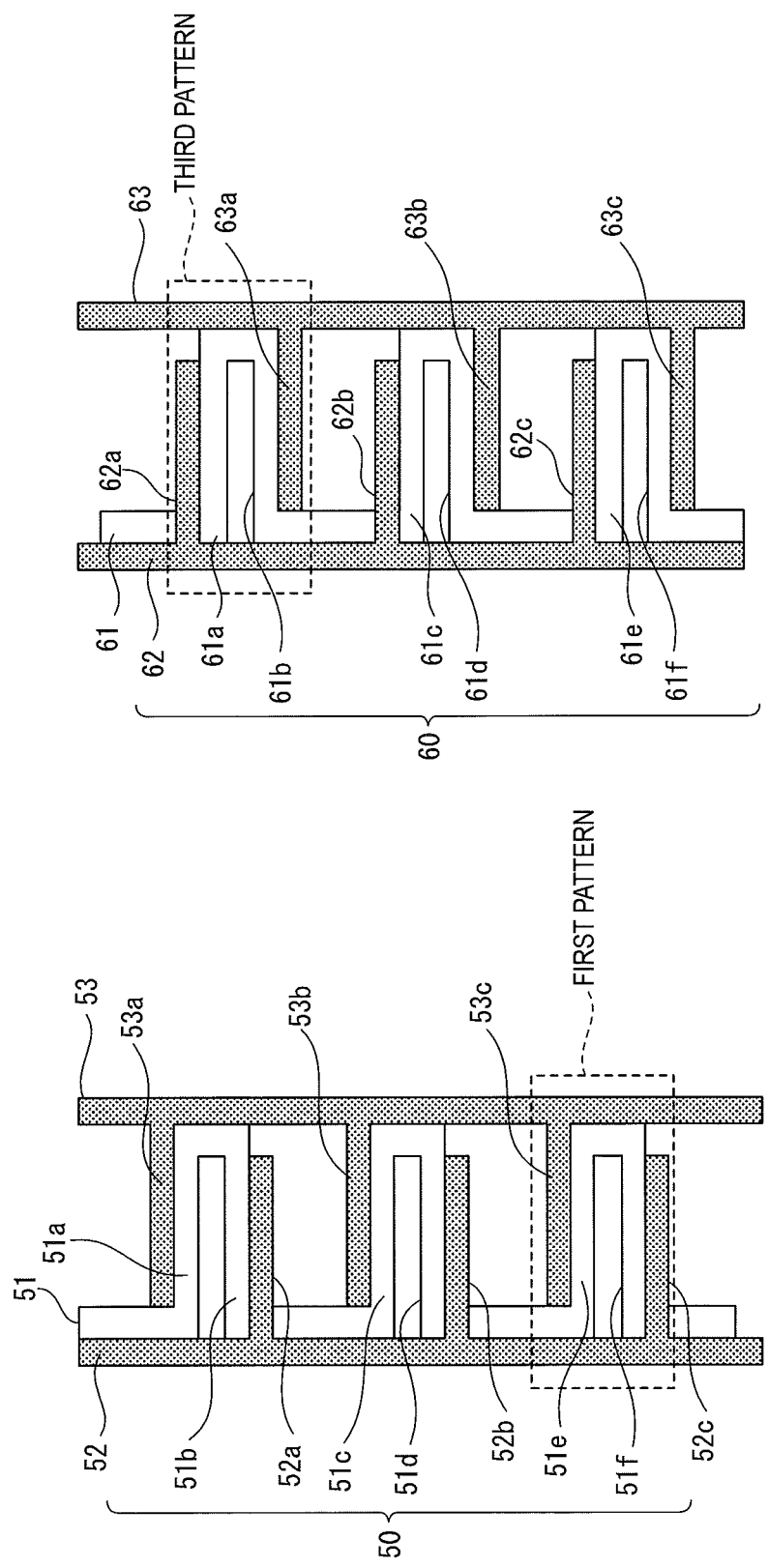
FIG. 11 is a schematic diagram illustrative of another example of the magnetic sensor illustrated in FIG. 9 according to the first embodiment of the present invention.

FIG. 11 is a schematic diagram illustrative of another example of the magnetic sensor illustrated in FIG. 9 according to the first embodiment of the present invention, in which the first magnetic sensor unit 50 and the second magnetic sensor unit 60 are separately arranged parallel to each other. In other words, an axis of the first magnetic sensor unit 50 in the longitudinal direction and an axis of the second magnetic sensor unit 60 in the longitudinal direction are parallel to each other and are provided on different axes.

Second Embodiment

Figure 12:
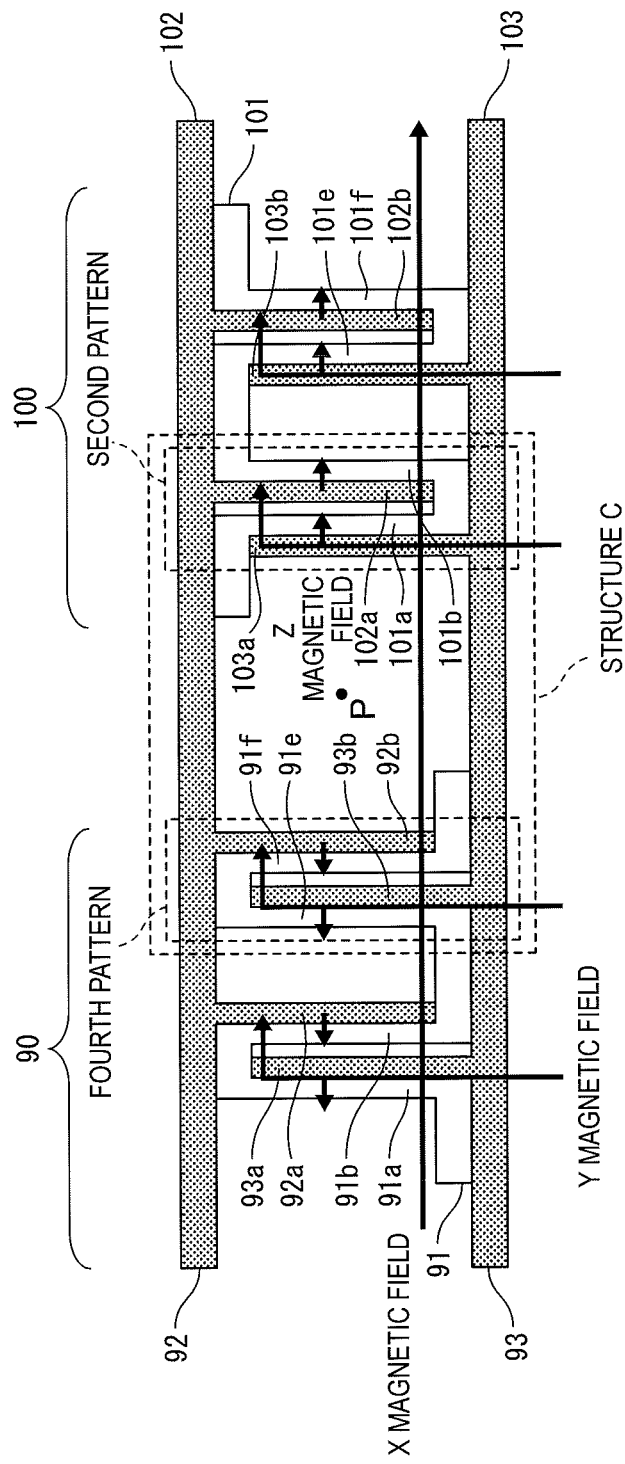
FIG. 12 is a schematic diagram illustrative of an example of a magnetic sensor according to a second embodiment of the present invention.

FIG. 12 is a schematic diagram illustrative of the magnetic sensor according to a second embodiment of the present invention, and is a schematic diagram illustrative of the arrangement pattern of a GMR element of a Z-axis magnetic sensor and the magnetic convergence plates. Moreover, it is a drawing illustrative of the Z-axis magnetic sensor.

In the drawing, a reference numeral 90 denotes a fifth magnetic sensor unit, a reference numeral 91 denotes a GMR element, a reference numeral 91a denotes a first part of the GMR element 91, a reference numeral 91b denotes a second part of the GMR element 91, a reference numeral 91e denotes a third part of the GMR element 91, a reference numeral 91f denotes a fourth part of the GMR element 91, a reference numeral 92 denotes a magnetic convergence plate, a reference numeral 92a denotes a first part of the magnetic convergence plate 92, a reference numeral 92b denotes a second part of the magnetic convergence plate 92, a reference numeral 93 denotes another magnetic convergence plate, a reference numeral 93a denotes a first part of the magnetic convergence plate 93, and a reference numeral 93b denotes a second part of the magnetic convergence plate 93.

In the drawing, a reference numeral 100 denotes a sixth magnetic sensor unit, a reference numeral 101 denotes a GMR element, a reference numeral 101a denotes a first part of the GMR element 101, a reference numeral 101b denotes a second part of the GMR element 101, a reference numeral 101e denotes a third part of the GMR element 101, a reference numeral 101f denotes a fourth part of the GMR element 101, a reference numeral 102 denotes a magnetic convergence plate, a reference numeral 102a denotes a first part of the magnetic convergence plate 102, a reference numeral 102b denotes a second part of the magnetic convergence plate 102, a reference numeral 103 denotes another magnetic convergence plate, a reference numeral 103a denotes a first part of the magnetic convergence plate 103, and a reference numeral 103b denotes a second part of the magnetic convergence plate 103.

The Z-axis magnetic sensor in the magnetic sensor according to the present invention includes the fifth magnetic sensor unit 90 and the sixth magnetic sensor unit 100, and the fifth magnetic sensor unit 90 and the sixth magnetic sensor unit 100 form a structure where both are point symmetry (i.e., rotational symmetry) with each other about a center point P.

According to such a configuration, a third magnetic detection unit is provided such that the comb-teeth-like magnetic convergence plate 93b adjoins the GMR element 91e which is a magnetic sensitivity unit in the longitudinal direction, and a midpoint of the comb-teeth-like magnetic convergence plate 93b is arranged at outside from a midpoint of the GMR element 91e. In addition, a fourth magnetic detection unit is provided such that the comb-teeth-like magnetic convergence plate 92b adjoins the GMR element 91f which is a magnetic sensitivity unit in the longitudinal direction, and a midpoint of the comb-teeth-like magnetic convergence plate 92b is arranged at outside from a midpoint of the GMR element 91f. Thus, a fourth arrangement pattern which is a single pattern is provided to connect the magnetic sensitivity units of the third magnetic detection unit in series with the fourth magnetic detection unit.

According to such a configuration, the third magnetic detection unit is provided such that the comb-teeth-like magnetic convergence plate 102a adjoins the GMR element 101b which is a magnetic sensitivity unit in the longitudinal direction, and the comb-teeth-like magnetic convergence plate 102a is arranged at outside from a midpoint of the GMR element 101b. In addition, the fourth magnetic detection unit is provided such that the comb-teeth-like magnetic convergence plate 103a adjoins the GMR element 101a which is a magnetic sensitivity unit in the longitudinal direction, and a midpoint of the comb-teeth-like magnetic convergence plate 103a is arranged at outside from a midpoint of the GMR element 101a, at a line symmetry position to the third magnetic detection unit, and a second arrangement pattern is provided which is a single pattern to connect the magnetic sensitivity units of the third magnetic detection unit in series with the fourth magnetic detection unit.

Moreover, the fifth magnetic sensor unit 90 including the fourth arrangement pattern, and the sixth magnetic sensor unit 100 including the second arrangement pattern are provided. The fourth arrangement pattern of the fifth magnetic sensor unit 90 and the second arrangement tern of the sixth magnetic sensor unit 100 are point symmetry with each other.

In the fifth magnetic sensor unit 90 including the fourth arrangement pattern, the GMR element 91e and the GMR element 91b are linearly connected so that plural fourth arrangement patterns can be arranged adjacent to each other by connecting an end of a magnetic sensitivity unit in series with an end of another magnetic sensitivity unit, with the units being connected in each fourth arrangement pattern.

The beam-like magnetic convergence plate is arranged so that the length in the longitudinal direction is longer than an interval between the comb-teeth-like magnetic convergence plates 92a and 93a. Moreover, it is arranged so that the interval between the comb-teeth-like magnetic convergence plates 92a and 92b is shorter than an interval between the comb-teeth-like magnetic convergence plates 92a and 93b.

In the second magnetic sensor unit 100 including the second arrangement pattern, the GMR element 101b and the GMR element 101e are linearly connected so that plural second arrangement patterns can be arranged adjacent to each other by connecting an end of a magnetic sensitivity unit in series with an end of another magnetic sensitivity unit, with the units being connected in each second arrangement pattern.

The beam-like magnetic convergence plate is arranged so that length in the longitudinal direction is longer than an interval between the comb-teeth-like magnetic convergence plates 102a and 103a. Moreover, it is arranged so that the interval between the comb-teeth-like magnetic convergence plates 102a and 103a is shorter than an interval between the comb-teeth-like magnetic convergence plates 102a and 103b.

According to such a configuration, the resistance change Z1 in the fifth sensor unit 90 satisfies the relational expression as follows.

$$\Delta Rx = cHx$$

$$\Delta Ry = aHy$$

$$\Delta Rz = -dHz$$

$$Z1 = \Delta Rx + \Delta Ry + \Delta Rz = Hx + aHy - dHz$$

Similarly, the resistance change Z2 in the sixth magnetic sensor unit 100 satisfies the following relational expression.

$$\Delta Rx = cHx$$

$$\Delta Ry = aHy$$

$$\Delta Rz = dHz$$

$$Z2 = \Delta Rx + \Delta Ry + \Delta Rz = Hx + aHy + dHz$$

Therefore, calculation with Z1 and Z2 results in $Z2 - Z1 = 2dHz$.

In this way, when arranging the comb-like parts having protrusion shape at the interval equal to or more than one pitch in order to cause a conversion of By to the X-axis direction into one direction, a signal with Bz component can be extracted independently by the calculation.

Figure 13:
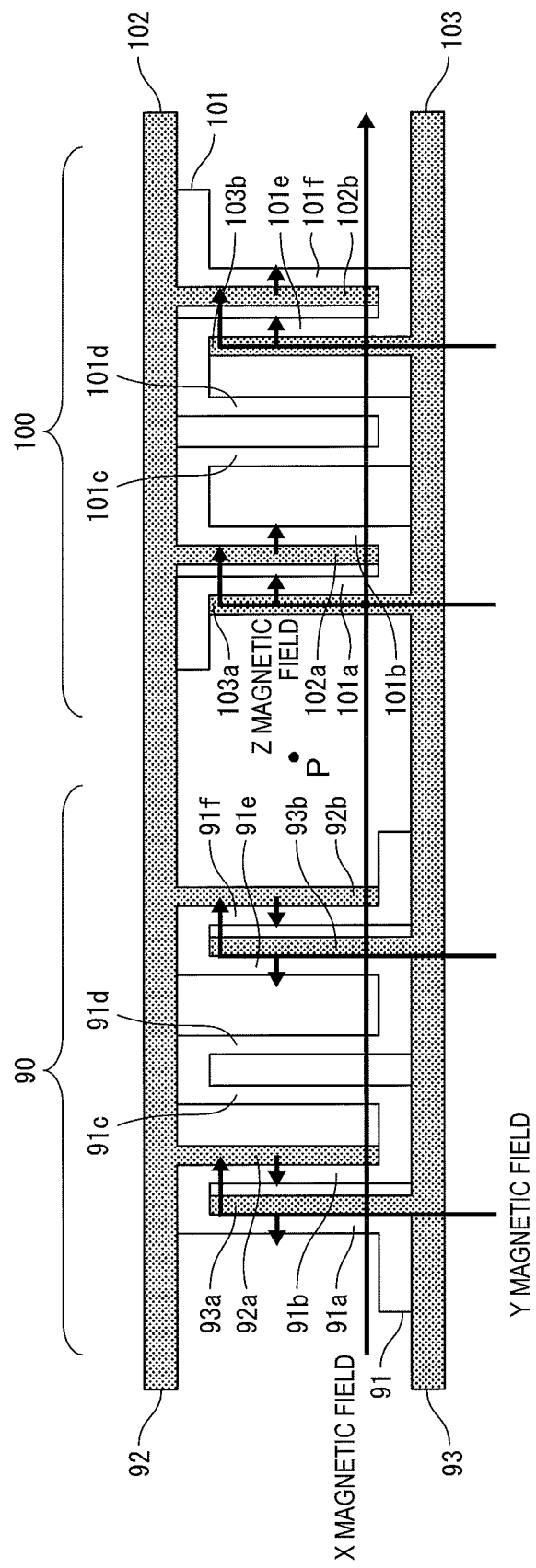
FIG. 13 is a schematic diagram illustrative of another example of the magnetic sensor according to the second embodiment of the present invention.

FIG. 13 is a schematic diagram illustrative of another example of the magnetic sensor according to the second embodiment of the present invention. Note that, as illustrated in FIG. 13, it is also possible to adjust the resistance of GMR by arranging GMRs 91c and 91d between the GMRs 91b and 91e, or by arranging GMRs 101c and 101d between the GMRs 101b and 101e.

An axis in the longitudinal direction of the fifth magnetic sensor unit 90 and an axis in the longitudinal direction of the sixth magnetic sensor unit 100 are parallel to each other, and are provided on different axes.

Example 1

Figure 14:
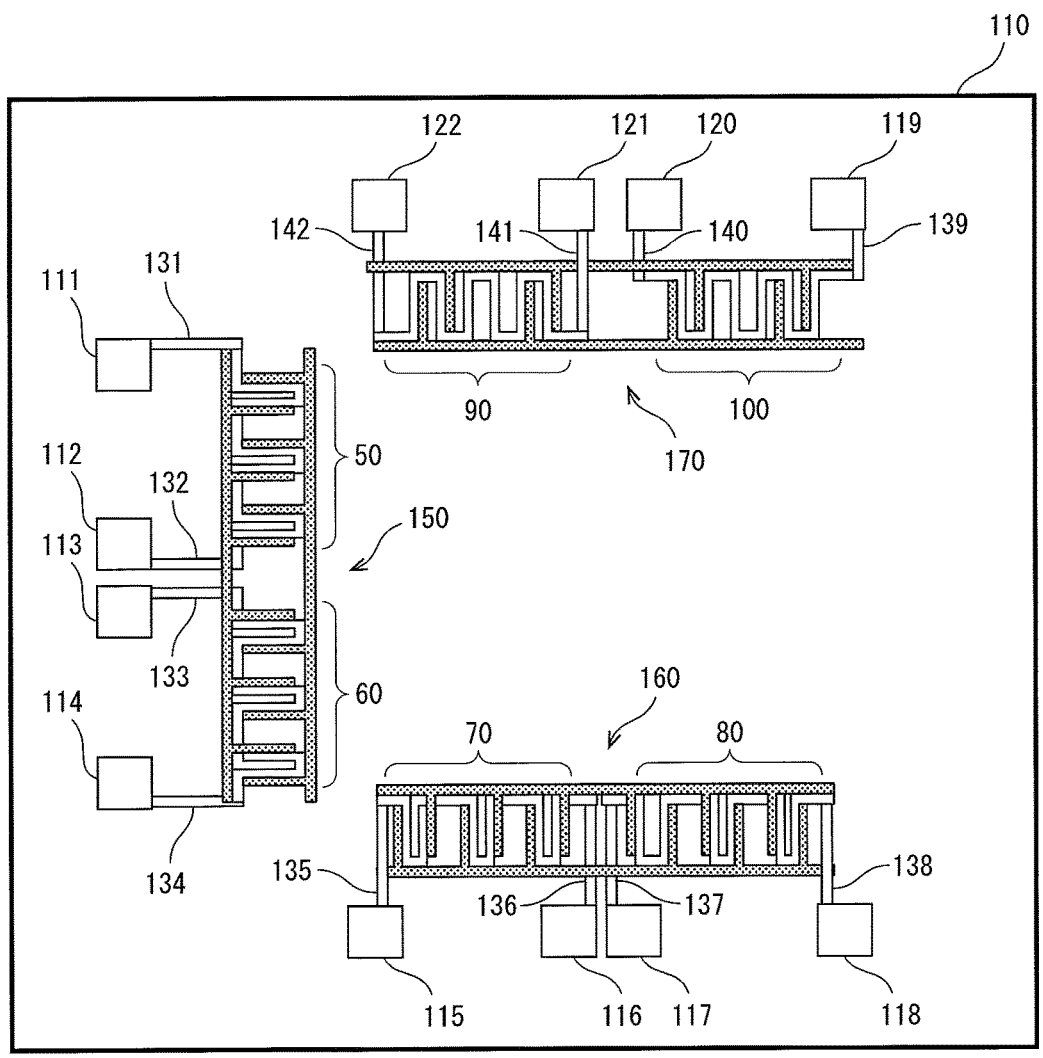
FIG. 14 is a schematic diagram illustrative of a sensor arrangement pattern and a detection output by the arrangement pattern of the magnetic sensor according to an example 1 of the present invention.

FIG. 14 is a schematic diagram illustrative of a sensor arrangement pattern and a detection output by the arrangement pattern of the magnetic sensor according to an example 1 of the present invention, and is a schematic diagram illustrative of the sensor arrangement pattern, in which the magnetic sensors according to the first and second embodiments of the present invention are arranged on the identical flat substrate 110, and the detection output by the arrangement pattern. In the drawing, a reference numeral 110 denotes a substrate on which sensors for respective axes are mounted, reference numerals 111 to 122 denote electrode pads, and 131 to 142 are wirings for electrically connecting respective GMR elements and electrode pads.

In addition, a reference numeral 150 denotes an X-axis sensor including the first magnetic sensor unit 50 and the second magnetic sensor unit 60, a reference numeral 160 denotes a Y-axis sensor including the third magnetic sensor unit 70 and the fourth magnetic sensor unit 80, and a reference numeral 170 denotes a Z-axis sensor including the fifth magnetic sensor unit 90 and the sixth magnetic sensor unit 100.

Each of detection outputs from the sensors for X, Y, and Z axes can be obtained by measuring a resistance between the assembled both ends and calculating the resistance in an IC circuit or the like on a later stage.

The resistance change X1 between the electrodes 112-113 of the first magnetic sensor unit 50 of the X-axis sensor 150 is aHx+cHy, the resistance change X2 between 113-114 of the second magnetic sensor unit 60 of the X-axis sensor 150 is −aHx+cHy, and the detection output of the X-axis sensor 150 is X2−X1=2aHx, by calculating a difference between the resistance changes of the magnetic sensor units 50 and 60 by an IC or the like on the latter stage.

The resistance change Y1 between the electrodes 115-116 of the third magnetic sensor unit 70 of the Y-axis sensor 160 is cHx+aHy, the resistance change Y2 between the electrodes 117-118 of the fourth magnetic sensor unit 80 of the Y-axis sensor 160 is cHx−aHy, and the detection output of the Y-axis sensor 140 is Y2−Y1=2aHy, by calculating a difference between the resistance changes of the magnetic sensor units 70 and 80 by an IC or the like on the latter stage.

Moreover, the resistance change Z1 of the electrodes 121-122 of the fifth magnetic sensor unit 90 of the Z-axis sensor 170 is cHx+aHy−dHz, the resistance change Z2 between the electrodes 119-120 of the sixth magnetic sensor unit 100 of the Z-axis sensor 170 is cHx+aHy+dHz, and the detection output of the Z-axis sensor 170 is Z2−Z1=2dHz, by calculating a difference between the resistance changes of the magnetic sensor units 90 and 100 by an IC or the like on the latter stage.

In other words, according to the comb-like magnetic convergence plates of the magnetic sensor, the X-axis direction, the Y-axis direction, and the Z-axis direction are converted, such that the magnetic fields of the X-axis direction and the Y-axis direction are converted in the same direction with respect to the first and second GMR elements, whereas the magnetic field in the Z-axis direction is converted so that a magnetic field is applied in a direction opposite to the first and second GMR elements, and the magnetic fields in the X-axis direction and the Y-axis direction are canceled by calculating the difference of resistances of the first GMR element and the second GMR element, and the difference of resistances of the third GMR elements and the fourth GMR element. Further, calculating the difference between the resistances of the fifth GMR element and the sixth GMR element amplifies double the magnetic field in the Z-axis direction.

Although the electrode pads are connected to the both ends of each GMR element in the present example, a terminal that can be commonly used such as a GND terminal may be used in common.

Example 2

Figure 15:
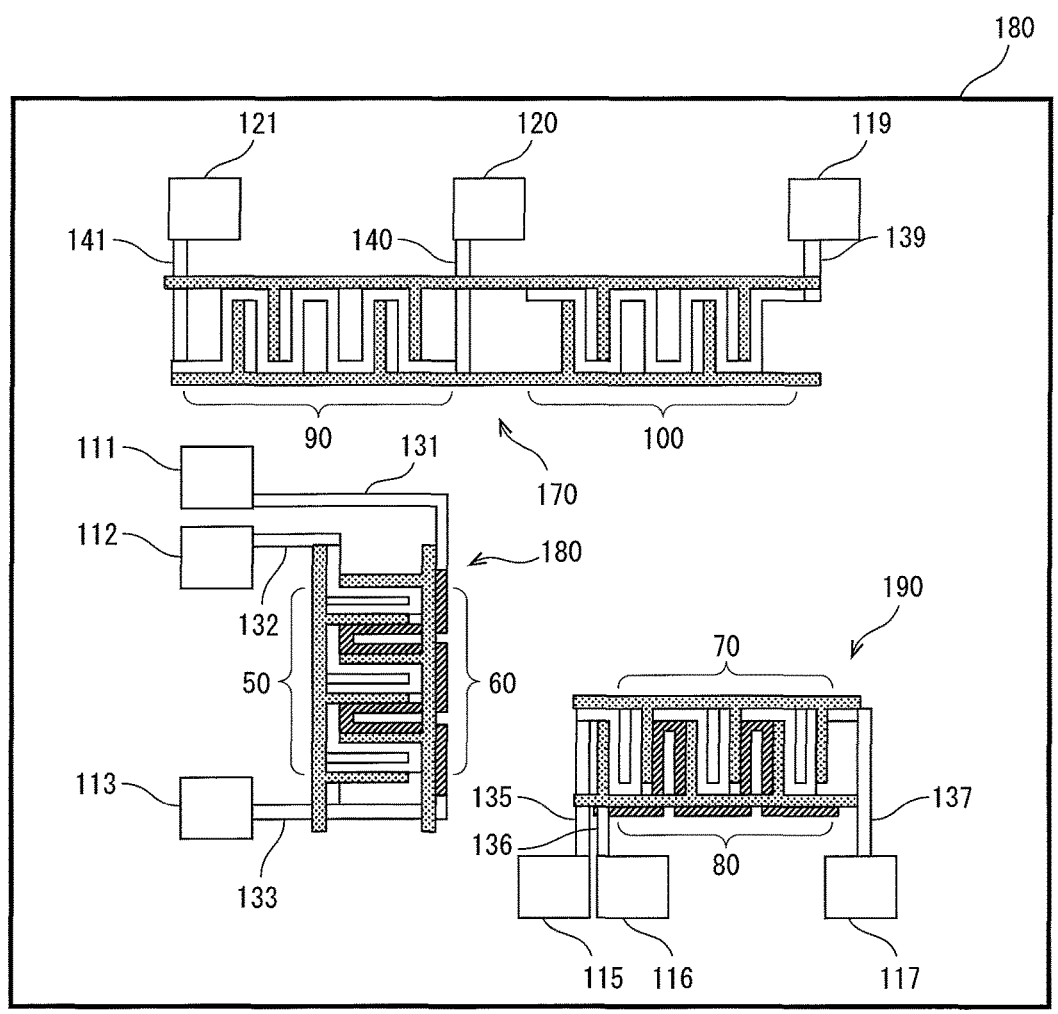
FIG. 15 is a schematic diagram illustrative of a sensor arrangement pattern of the magnetic sensor according to an example 2 of the present invention.

FIG. 15 is a schematic diagram illustrative of a sensor arrangement pattern of the magnetic sensor according to an example 2 of the present invention, and is a schematic diagram illustrative of the sensor arrangement pattern arranged on the identical flat substrate of the magnetic sensor according to the example 2 of the present invention. In the drawing, each reference numeral relates to a chip on which a sensor for each axis, and the same numerals are assigned to the components having the same functions as those in FIG. 13. As compared to the sensor arrangement pattern in FIG. 14, an X-axis sensor 180 and a Y-axis sensor 190 are different, whereas the Z-axis sensor 170 is similar to that in FIG. 14.

Figure 16:
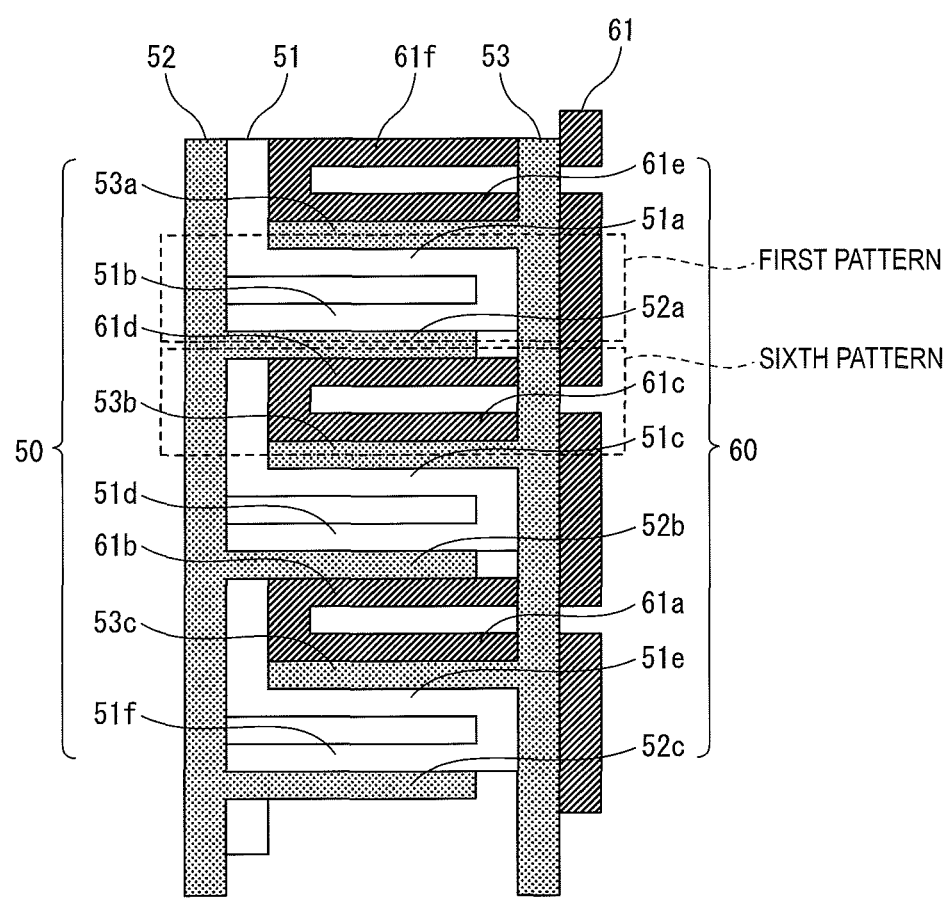
FIG. 16 is a schematic diagram illustrative of still another sensor arrangement pattern of an X-axis sensor illustrated in FIG. 15.

FIG. 16 is a schematic diagram illustrative of still another sensor arrangement pattern of an X-axis sensor illustrated in FIG. 15.

The X sensor 180, a drawing describing the configuration of the X-axis sensor 180 using FIG. 16, includes a GMR element 51, a magnetic convergence plate 52, and another magnetic convergence plate 53, and includes the above-described first arrangement pattern. The GMR element 61 is further arranged which passes through a structural center point of the comb-teeth-like magnetic convergence plate 52a included in the first arrangement pattern, and is arranged at a line symmetrical position about a structural center line of the comb-teeth-like magnetic convergence plate 52a. The GMR element 61 adjoins the magnetic convergence plate 52, similar to a GMR element 62, and the magnetic convergence plate 53, and the GMR element 61 includes a sixth arrangement pattern where a connecting unit for electrically connecting the GMR elements 61c and 61d is arranged a direction opposite to the first arrangement pattern.

Furthermore, as illustrated in FIG. 16, plural first patterns and plural sixth patterns are alternately arranged, and respective first patterns and sixth patterns are arrayed so as to form an electrical series array. Moreover, magnetic convergence plates are arranged so that an interval between the magnetic convergence plates 52a and 53a and an interval between 52a and 53b in the first pattern are equal. Moreover, the Y-axis sensor 190 has the same configuration as that of the X-axis sensor 180, and includes a magnetic sensor other than the X-axis sensor 180 rotated 90 degrees.

Such a configuration reduces a project area of the X-axis sensor and the Y-axis sensor, reduces an area for mounting the sensors on a chip, and achieves a compact size of the magnetic sensor.

Moreover, in FIG. 15, the GND terminals of the magnetic sensor units 90 and 100 are shared by an electrode pad 120, the GND terminals of the magnetic sensor units 50 and 60 are shared by an electrode pad 113, the GND terminals of the magnetic sensor units 70 and 80 are shared by an electrode pad 117. Therefore, it is possible to decrease the number of electrode pads and to achieve a compact size.

Third Embodiment

FIGS. 17A to 17E are schematic diagrams illustrative of a magnetic sensor according to a third embodiment of the present invention, and is a schematic diagram illustrative of an arrangement pattern of the GMR element and the magnetic convergence plates of the X-axis and Y-axis magnetic sensors.

Figure 17A:
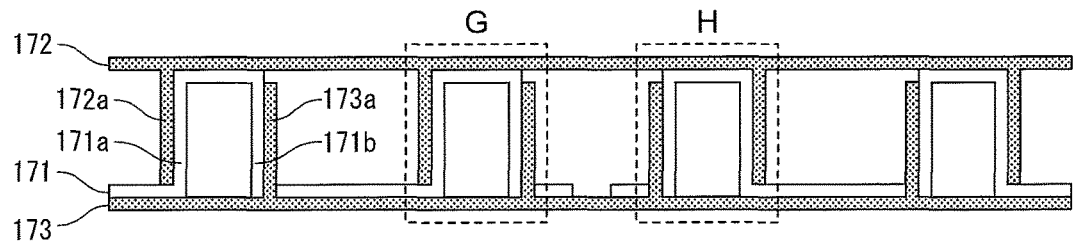
FIGS. 17A to 17E are schematic diagrams illustrative of a magnetic sensor according to a third embodiment of the present invention.

Single arrangement patterns G and H have arrangement patterns of line symmetry with each other, as illustrated in FIG. 17A. As for a configuration of the single arrangement pattern G, a first part 172a of the magnetic convergence plate 172 contacts with an outside of one part of a letter U-shaped part of the GMR element (magnetic sensitivity units 171a and 171b) 171, and a first part 173a of the magnetic convergence plate 173 contacts with the outside of another part of the letter U-shaped part of the GMR element 171. According to the configuration with a repetition of two or more such arrangement pattern, the single arrangement pattern G and the single arrangement pattern H form the arrangement pattern of line symmetry with each other. Note that the magnetic convergence plates (beams) are not necessarily required, but the magnetic convergence is possible efficiently, when provided.

Figure 17B:
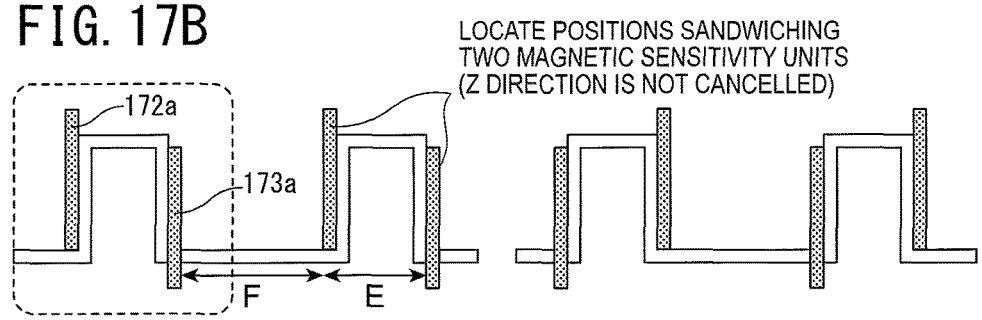

FIG. 17B is a drawing illustrating a structure excluding the magnetic convergence plates (beams) 172 and 173 from FIG. 17A, and the first part 172a of the magnetic convergence plate 172 is projected to the magnetic convergence plate 172 side. Similarly, the first part 173a of the magnetic convergence plate 173 is projected to the magnetic convergence plate 173 side. As for the single arrangement pattern, when plural the single arrangement patterns are connected, the sensitivity increases. Moreover, the first part 172a of the magnetic convergence plate 172 and the first part 173a of the magnetic convergence plate 173 are located in positions sandwiching the two magnetic sensitivity units 171a and 171b. The distance E between the first part 172a of the magnetic convergence plate 172 and the first part 173a of the magnetic convergence plate 173 which sandwich the magnetic sensitivity units 171a and 171b is narrower than the distance F between the magnetic convergence plates over the arrangement patterns.

Figure 17C:
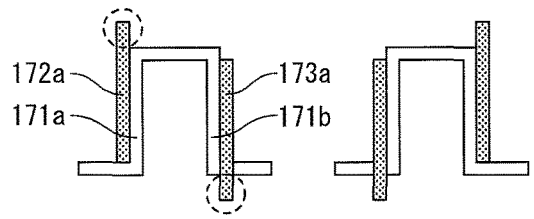

FIG. 17C is a drawing illustrating the single arrangement pattern illustrated in FIG. 17B, and as illustrated in the drawing on left side, the first part 172a of the magnetic convergence plate 172 is projected to the magnetic convergence plate 172 side. Similarly, the first part 173a of the magnetic convergence plate 173 is projected to the magnetic convergence plate 173 side. In this case, as illustrated in the drawing on the right side, since a connection part for the magnetic sensitivity units 171a and 171b may as well be connected electrically, it does not always integrate with the magnetic sensitivity units 171a and 171b.

Figure 17D:
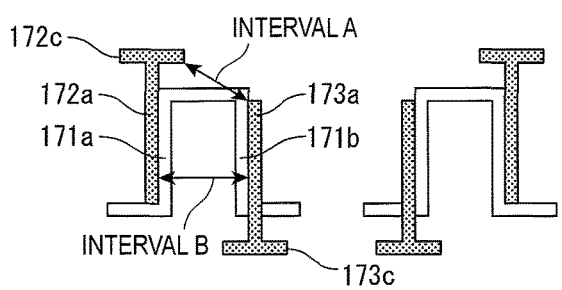

In FIG. 17D, a letter T-shaped magnetic convergence members 172c and 173c are attached to the first part 172a of the magnetic convergence plate 172 in FIG. 17C and the first part 173a of the magnetic convergence plate 173. In this case, the arrangement is made in the positional relationship where a distance A between each of the magnetic convergence members 172c and 173c and adjacent magnetic convergence material is longer than a distance B between two magnetic convergence materials in the arrangement pattern. The distance A is the shortest distance between an end of a beam and a comb tooth.

Figure 17E:
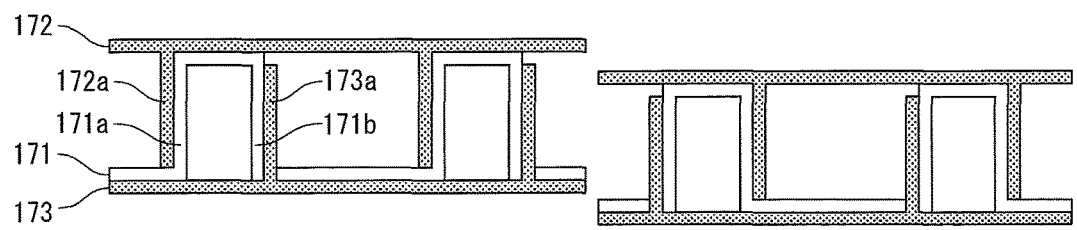

Although the single arrangement patterns G and H are connected in FIG. 17A, the position is shifted in the X direction in FIG. 17E.

Fourth Embodiment

Figure 18A:
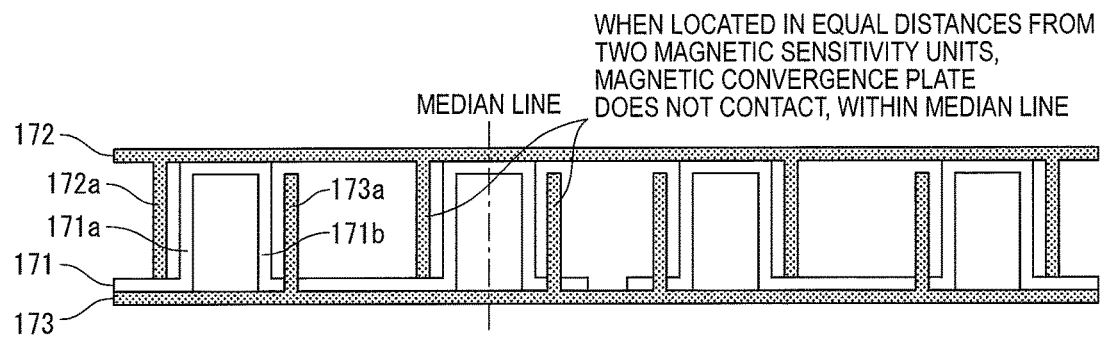
FIGS. 18A to 18C are schematic diagrams illustrative of a magnetic sensor according to a fourth embodiment of the present invention.
Figure 18B:
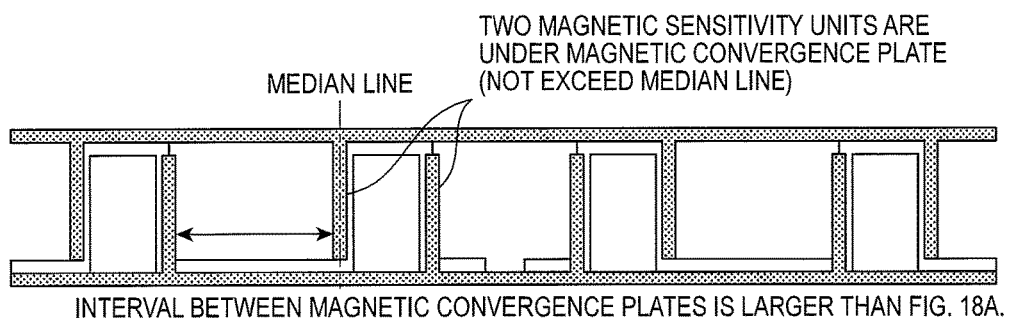
Figure 18C:
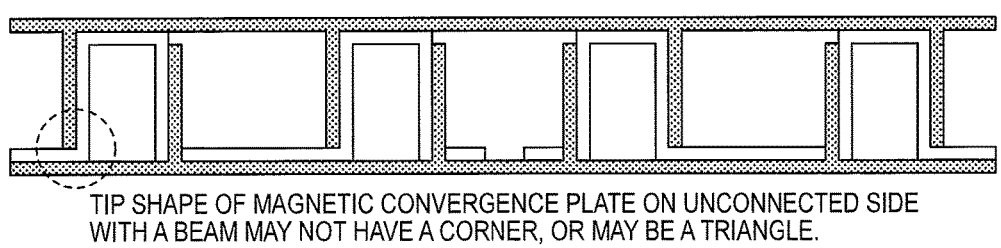

FIGS. 18A to 18C are schematic diagrams illustrative of a magnetic sensor according to a fourth embodiment of the present invention, and are schematic diagrams illustrative of the arrangement pattern of the GMR element and the magnetic convergence plates of the X-axis and Y-axis magnetic sensors.

In FIG. 17A, the first part 172a of the magnetic convergence plate 172 contacts with the outside of one part of the letter U-shaped part of the GMR element (magnetic sensitivity units 171a and 171b) 171, and the first part 173a of the magnetic convergence plate 173 contacts with the outside of another part of the letter U-shaped part of the GMR element 171, but it does not necessarily contact with the first part 172a of the magnetic convergence plate 172 with the magnetic sensitivity unit 171a, and the first part 173a of the magnetic convergence plate 173 with the magnetic sensitivity unit 171ba, as illustrated in FIG. 18A. The magnetic convergence plate may not necessarily contact with the magnetic sensitivity unit, if the first part 172a of the magnetic convergence plate 172 and the first part 173a of the magnetic convergence plate 173 are located in equal distances from the two magnetic sensitivity units 171a and 171b, respectively.

As illustrated in FIG. 18B, the two magnetic sensitivity units 171a and 171b may as well be arranged under the first part 172a of the magnetic convergence plate 172 and the first part 173a of the magnetic convergence plate 173, in the cross-section. In this case, each of the magnetic sensitivity units 171a and 171b does not exceed the median line of corresponding magnetic convergence plate. Such a configuration allows an increase of the interval between the magnetic convergence plates.

As illustrated in FIG. 18C, a shape of a tip of each magnetic convergence plate not connected with a beam may be a shape without a corner such as a semicircle, and may be a triangle. It is not necessary to be a quadrangle (i.e., a rectangle).

Fifth Embodiment

FIGS. 19A to 19E are schematic diagrams illustrative of a magnetic sensor according to a fifth embodiment of the present invention, and are schematic diagrams illustrative of the arrangement pattern of the GMR element and the magnetic convergence plates of the Z-axis magnetic sensor.

Single arrangement patterns I and J are arrangement patterns of point symmetry with each other, as illustrated in FIG. 19A. As for a structure of the single arrangement pattern I, a first part 173a of the magnetic convergence plate 173 contacts with an inside of one part of the letter U-shaped part of the GMR element (magnetic sensitivity units 171a and 171b) 171, and a first part 172a of the magnetic convergence plate 172 contacts with the outside of another part of the letter U-shaped part of the GMR element 171. According to a structure with repetition of two or more arrangement patterns as described above, the single arrangement pattern I and the single arrangement pattern J form the arrangement pattern of the point symmetry with each other.

As illustrated in FIG. 19B, the magnetic sensitivity unit of adjacent intermediate parts in the single arrangement pattern I illustrated in FIG. 19A is omissible. In other words, the distance E between the magnetic convergence plates in the single arrangement pattern I should be narrower than the distance F between adjacent single arrangement patterns I.

As illustrated in FIG. 19C, in a drawing illustrating a structure where the magnetic convergence plates (beams) 172 and 173 in FIG. 19A are excluded, the first part 172a of the magnetic convergence plate 172 is projected to the magnetic convergence plate 172 side. Similarly, the first part 173a of the magnetic convergence plate 173 is projected to the magnetic convergence plate 173 side. When plural single arrangement patterns are connected, the sensitivity increases.

As illustrated in FIG. 19D, the letter T-shaped magnetic convergence members 172c and 173c are attached to the first part 172a of the magnetic convergence plate 172 in FIG. 19C, and the first part 173a of the magnetic convergence plate 173. In this case, the arrangement is made in the positional relationship where a distance A between each of the magnetic convergence members 172c and 173c and adjacent magnetic convergence material is longer than a distance B between two magnetic convergence materials in the arrangement pattern. The distance A is the shortest distance between an end of a beam and a comb tooth.

Next, fundamental arrangement patterns in which the magnetoresistance element and magnetic convergence plates are combined in the present invention will be described.

Figure 20A:
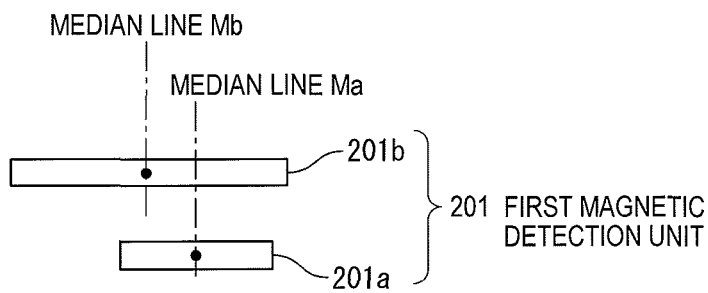
FIGS. 20A to 20C are schematic diagrams of fundamental arrangement patterns of the magnetic sensor detecting the magnetic field in the X/Y-axis direction.
Figure 20B:
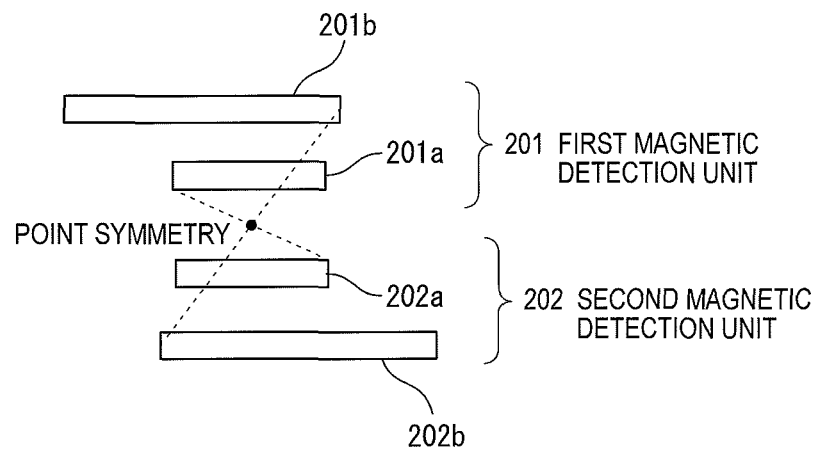
Figure 20C:
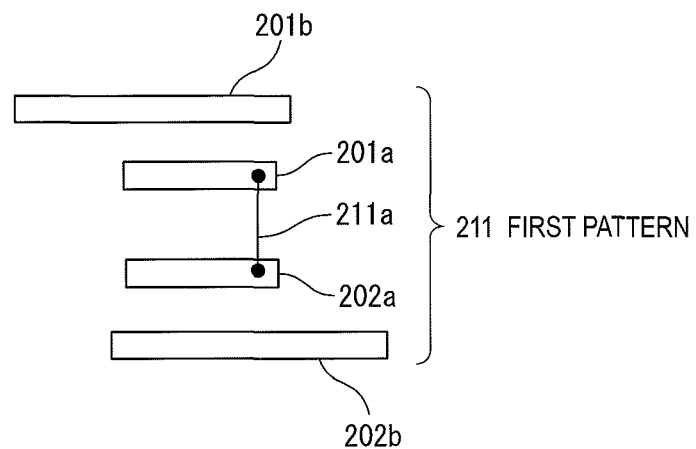
Figure 21A:
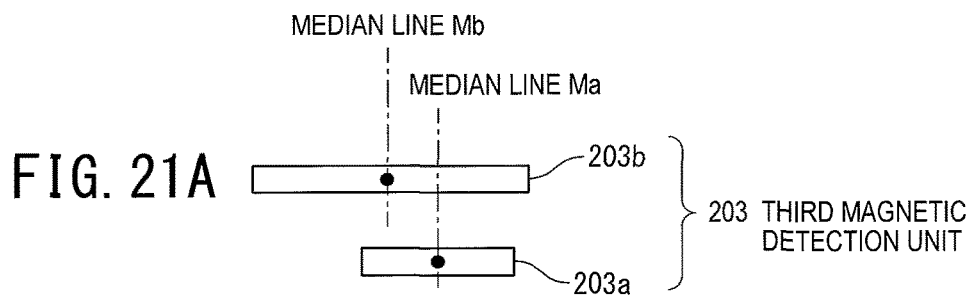
FIGS. 21A to 21D are schematic diagrams of fundamental arrangement patterns of the magnetic sensor detecting the magnetic field in the Z-axis direction.
Figure 21B:
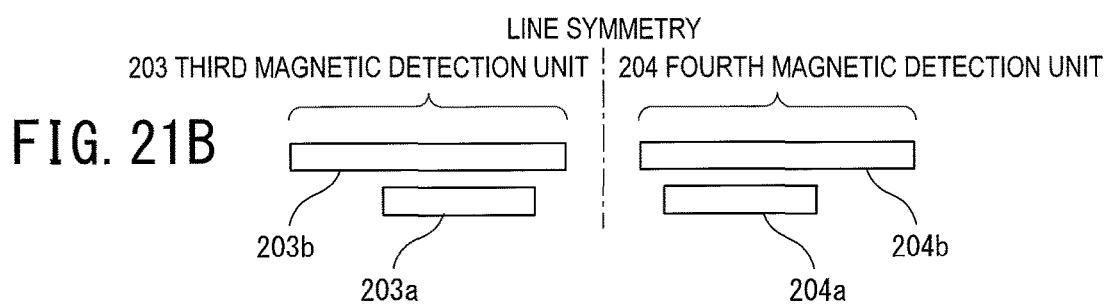
Figure 21C:
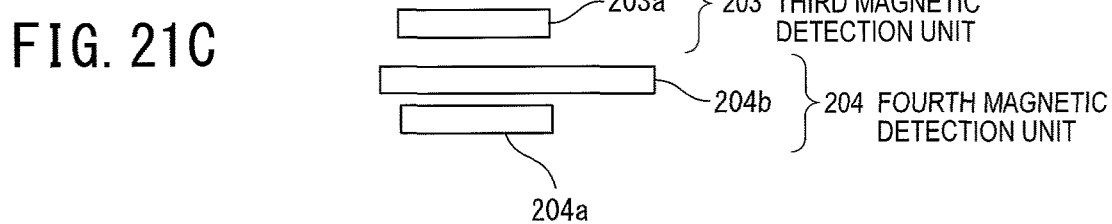
Figure 21D:
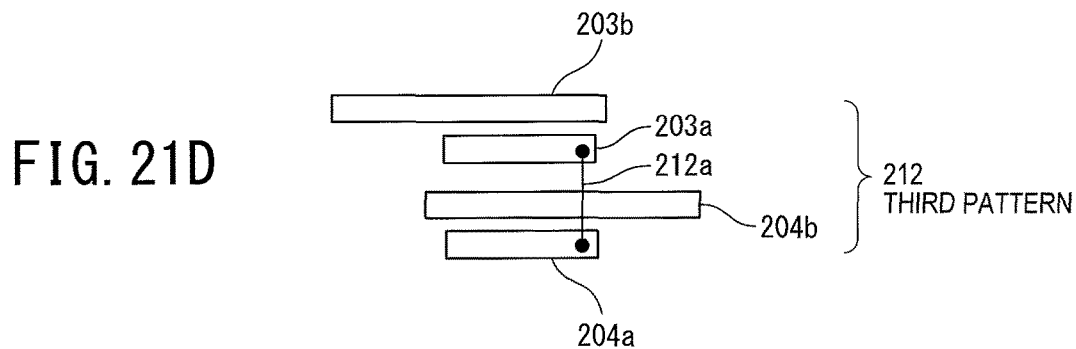

FIGS. 20A to 20C are schematic diagrams of fundamental arrangement patterns of the magnetic sensor capable of detecting the magnetic field in an arbitrary axis direction parallel to a flat substrate, and the magnetic sensor being enabled to detect a magnetic field in a direction parallel to the flat substrate on the identical substrate.

There are provided: a first magnetic detection unit 201 including a quadrangular magnetic sensitivity material 201a and a quadrangular magnetic convergence material 201b having a length different from the magnetic sensitivity unit, such that a median line Ma of the magnetic sensitivity material in the longitudinal direction and a median line Mb of the magnetic convergence material in the longitudinal direction are horizontally arranged so as not to cross with each other; and a second magnetic detection unit 202 having the same structure as the first magnetic detection unit, so that both of the magnetic sensitivity material of the first magnetic detection unit and the magnetic sensitivity material of the second magnetic detection unit are arranged in a positional relationship of point symmetry such that these material are sandwiched by the magnetic convergence material of the first magnetic detection unit, and the magnetic convergence material of the second magnetic detection unit, and so that the first magnetic detection unit and the second magnetic detection unit do not overlap each other. Herein, "both of the magnetic sensitivity material of the first magnetic detection unit and the magnetic sensitivity material of the second magnetic detection unit" "are sandwiched by the magnetic convergence materials of the first magnetic detection unit, and the second magnetic detection unit" includes: an embodiment where, in a planar view, both the magnetic sensitivity material of the first magnetic detection unit and the magnetic sensitivity material of the second magnetic detection unit are arranged between the magnetic convergence material of the first magnetic detection unit, and the magnetic convergence material of the second magnetic detection unit; and an embodiment where both the median line of the magnetic sensitivity material of the first magnetic detection unit in the longitudinal direction and the median line of the magnetic sensitivity material of the second magnetic detection unit in the longitudinal direction are arranged between the median lines of the magnetic convergence material of the first magnetic detection unit and the magnetic convergence material of the second magnetic detection unit in the longitudinal direction. The meaning of the above-described "sandwiched" is also applied in the following description.

Moreover, a first arrangement pattern 211 is provided to include the magnetic sensitivity material of the first magnetic detection unit, and a connecting unit 211a electrically connecting in series with the magnetic sensitivity material of the second magnetic detection unit.

FIGS. 21A to 21D are schematic diagrams of fundamental arrangement patterns of the magnetic sensor capable of detecting the magnetic field perpendicular to the flat substrate, and the magnetic sensor being enabled to detect the magnetic field perpendicular to the flat substrate on the identical substrate.

There are provided: a third magnetic detection unit 203 including a quadrangular magnetic sensitivity material 203a and a quadrangular magnetic convergence material 203b having a length different from that of the magnetic sensitivity unit, so that the median line Ma of the magnetic sensitivity material in the longitudinal direction and the median line Mb of the magnetic convergence material in the longitudinal direction are horizontally arranged so as not to cross with each other; and a fourth magnetic detection unit 204 having a structure of line symmetry about a line perpendicular to the longitudinal direction of the magnetic convergence material of the third magnetic detection unit, such that the magnetic sensitivity material of the third magnetic detection unit is arranged so as to be sandwiched by the magnetic convergence material of the third magnetic detection unit and the magnetic convergence material 204b of the fourth magnetic detection unit, and the third magnetic detection unit and the fourth magnetic detection unit are arranged parallel to each other, and so as not to overlap each other.

Moreover, a third arrangement pattern 212 is provided to include the magnetic sensitivity material of the third magnetic detection unit and a connecting unit 212a electrically connecting in series with the magnetic sensitivity material of the fourth magnetic detection unit.

Figure 22:
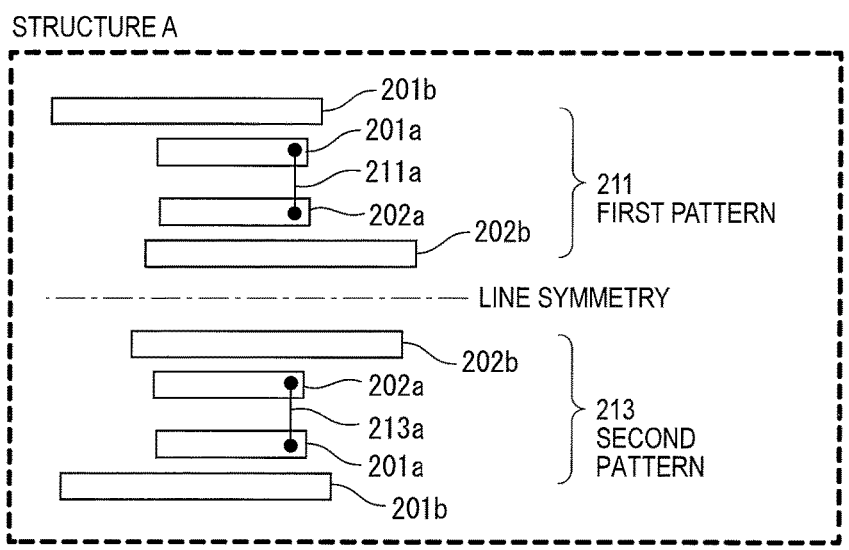
FIG. 22 is a drawing illustrating a fundamental structure of the magnetic sensor detecting the magnetic field in the X/Y-axis direction.

FIG. 22 is a drawing illustrating the fundamental structure of the magnetic sensor capable of detecting the magnetic field in an arbitrary axis direction (in FIG. 22, an axis parallel to the flat substrate and perpendicular to the longitudinal direction of the magnetic convergence material) parallel to the flat substrate. A first structure A is provided to include a first arrangement pattern, and a second arrangement pattern 213 which has the same structure as the first arrangement pattern 211, arranged in an opposite manner and separated so as not to overlap each other, and in a positional relationship of line symmetry and parallel to the longitudinal directions of the magnetic convergence materials 201b and 202b of the first arrangement pattern.

Figure 23:
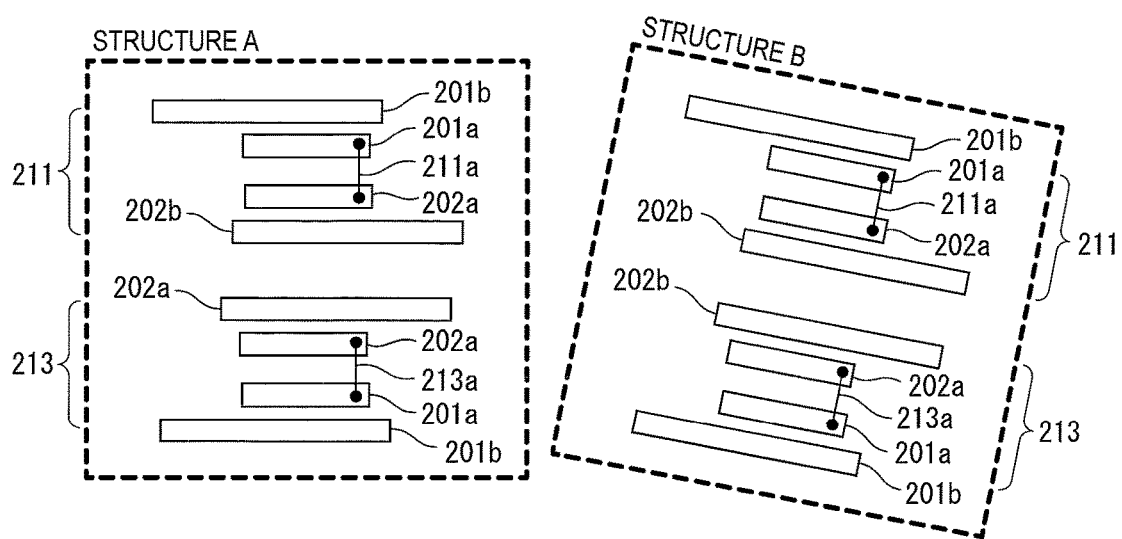
FIG. 23 is a drawing illustrating a fundamental structure of the magnetic sensor detecting the magnetic field in the Y-axis direction.

FIG. 23 is a drawing illustrating a fundamental structure of the magnetic sensor detecting the magnetic field in arbitrary directions of two axes parallel to the flat substrate (in FIG. 23, two axes includes an axis parallel to the flat substrate and perpendicular to the longitudinal direction of the magnetic convergence material of the structure A, and an axis parallel to the flat substrate and perpendicular to the longitudinal direction of the magnetic convergence material of the structure B). The first structure A and a second structure B having the same structure as the first structure A are arranged so as not to overlap each other and not parallel to each other.

Figure 24:
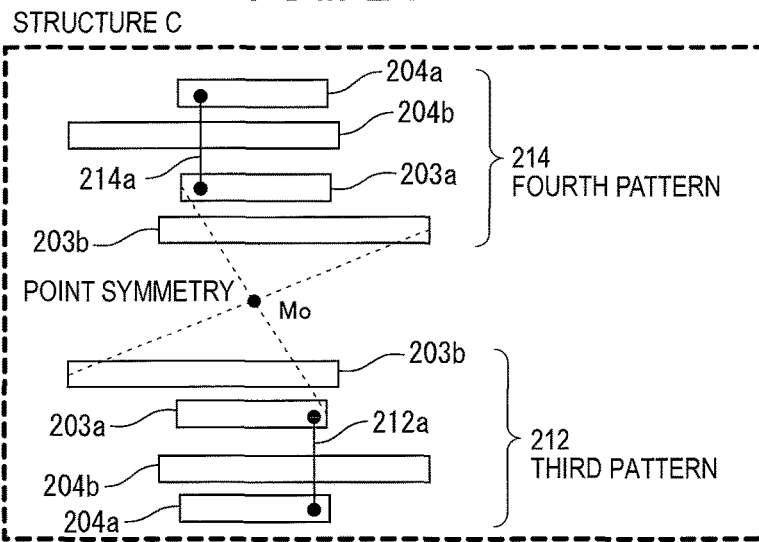
FIG. 24 is a drawing illustrating a fundamental structure of the magnetic sensor detecting the magnetic field in the Z-axis direction.

FIG. 24 is a drawing illustrating the fundamental structure of the magnetic sensor detecting the magnetic field in a direction perpendicular to the flat substrate. A third structure C is provided such that the third arrangement pattern 212 and a fourth arrangement pattern 214 having substantially the same structure as the second arrangement pattern are arranged in an opposite manner, and is arranged separately so that the second arrangement pattern and the fourth arrangement pattern have a positional relationship of point symmetry with each other about a point on the longitudinal direction side of the magnetic convergence material of the second arrangement pattern and do not overlap each other.

Figure 25:
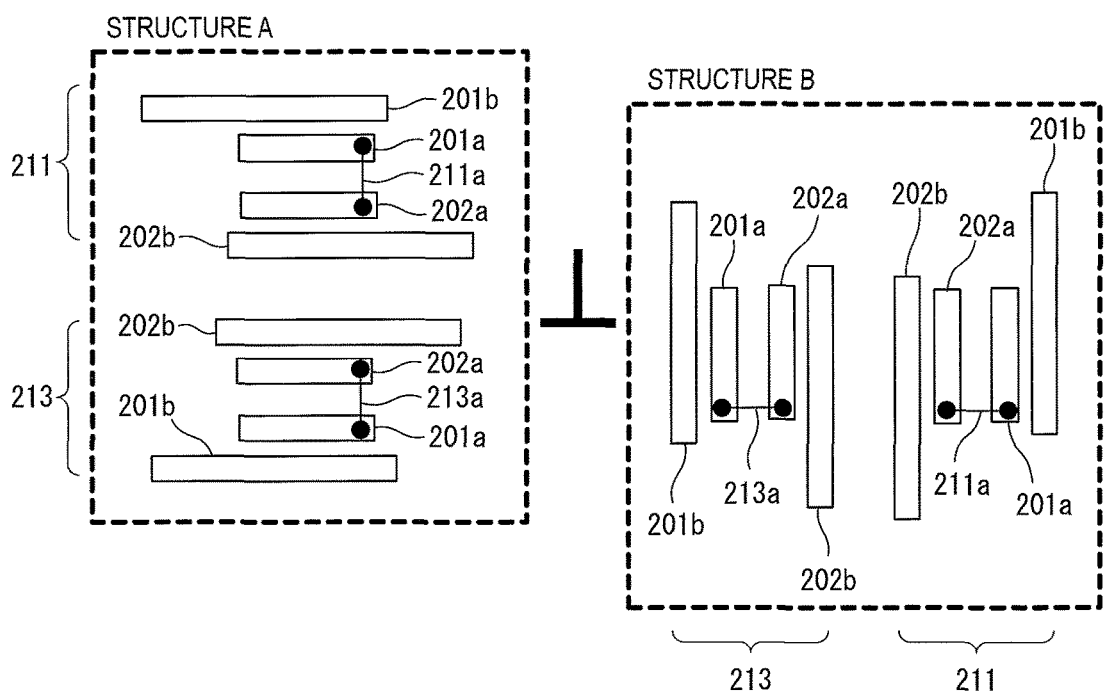
FIG. 25 is a drawing illustrating another fundamental structure of the magnetic sensor detecting the magnetic field in the Y-axis direction.

FIG. 25 is a drawing illustrating another fundamental structure of the magnetic sensor detecting the magnetic field of the magnetic field in arbitrary directions of two axes parallel to the flat substrate (in FIG. 23, two axes includes an axis parallel to the flat substrate and perpendicular to the longitudinal direction of the magnetic convergence material of the structure A, and an axis parallel to the flat substrate and perpendicular to the longitudinal direction of the magnetic convergence material of the structure B). The first structure A and the second structure B are arranged in a positional relationship perpendicular to each other.

Moreover, the first structure A and the second structure B are arranged on the identical flat surface, or the first structure A and the third structure C, or the second structure B and the third structure C, or the first structure A, the second structure B and the third structure C are arranged on the identical flat surface.

Figure 26:
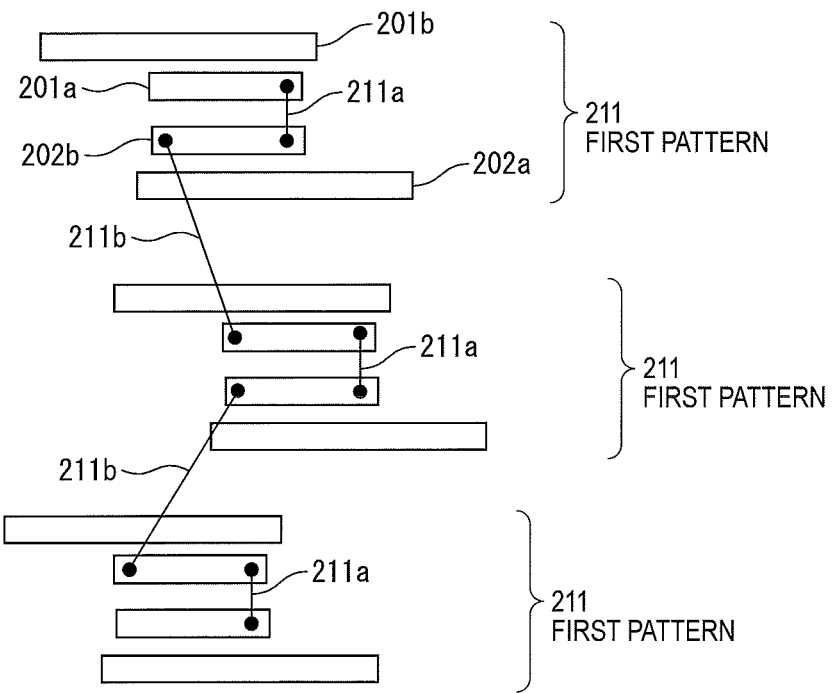
FIG. 26 is a drawing illustrating a fundamental structure of the magnetic sensor in which plural arrangement patterns are arrayed.

FIG. 26 is a drawing illustrating a fundamental structure of the magnetic sensor in which plural arrangement patterns are arrayed. As for the first arrangement pattern 211 to the fourth arrangement pattern 214, in each arrangement pattern, plural arrangement patterns having the same structure are provided to constitute arrangement pattern groups, the arrangement pattern groups are arranged parallel to each other without an overlap, and the magnetic sensitivity units included in each arrangement pattern are electrically connected so as to be a single series connection.

Figure 27:
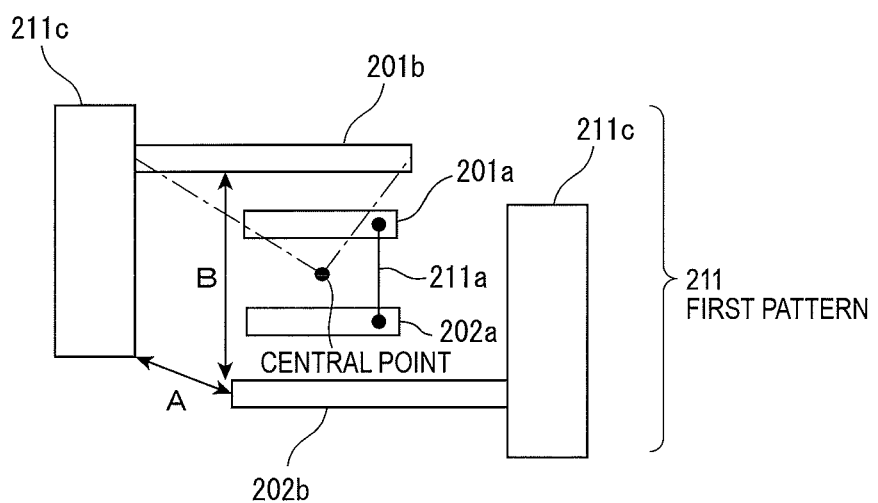
FIG. 27 is a drawing illustrating shapes of ends of magnetic convergence plates.

FIG. 27 is a drawing illustrating shapes of ends of magnetic convergence plates. In each magnetic convergence material of the first arrangement pattern 211 to the fourth arrangement pattern 214, a magnetic convergence member 211c is arranged so as to contact with the short side of the magnetic convergence material on a far side from a structural center point of the arrangement pattern to form a letter T shape, and arranged in a positional relationship where a distance A between the magnetic convergence member 211c and adjacent magnetic convergence material is longer than a distance B between two magnetic convergence materials in the arrangement pattern.

Figure 28:
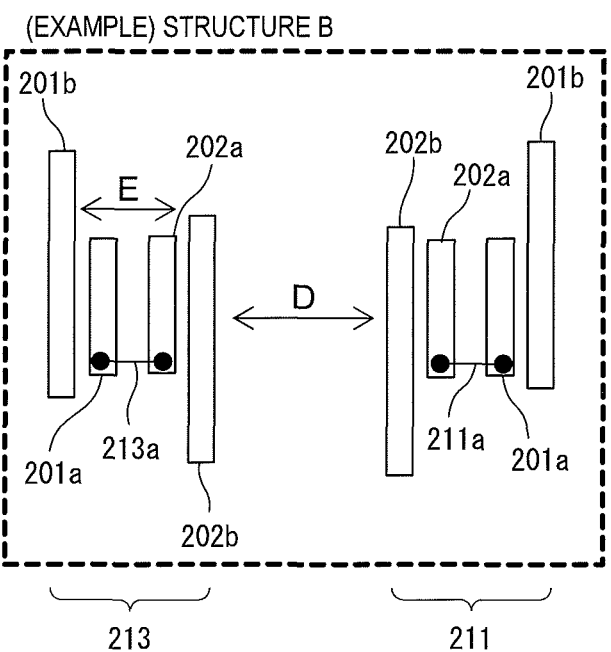
FIG. 28 is a drawing illustrative of a distance between magnetic convergence plates and a distance with a magnetic resistance (GMR) element.

FIG. 28 is a drawing illustrative of a distance between magnetic convergence plates and a distance with a magnetic resistance (GMR). A distance D between the magnetic convergence materials over respective arrangement patterns is configured to be longer than a distance E between two magnetic convergence materials in each arrangement pattern.

Figure 29A:
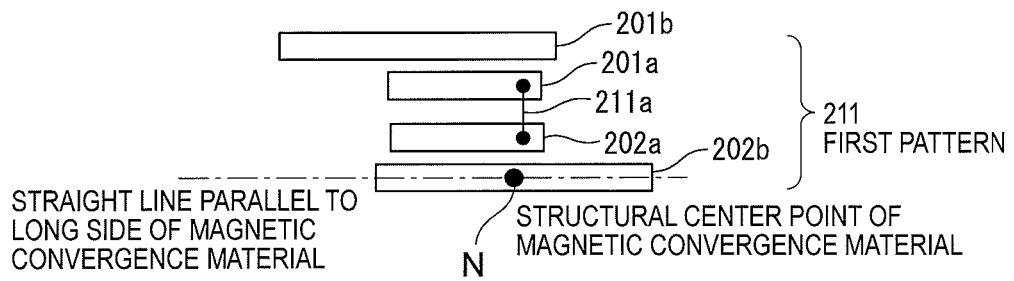
FIGS. 29A to 29C are drawings illustrating shrink structures of the arrangement patterns.
Figure 29B:
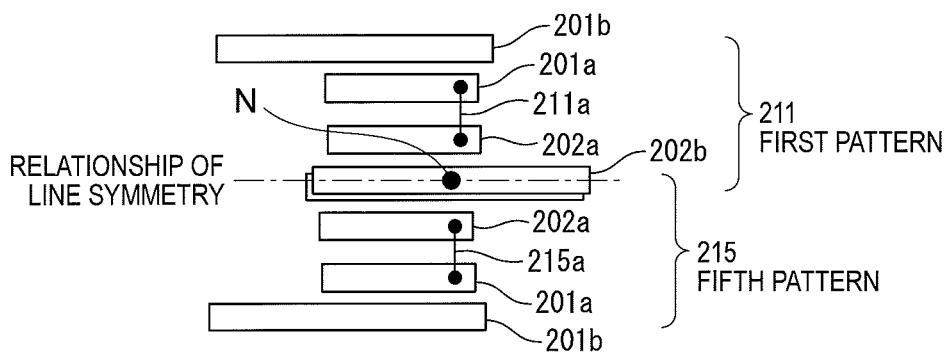
Figure 29C:
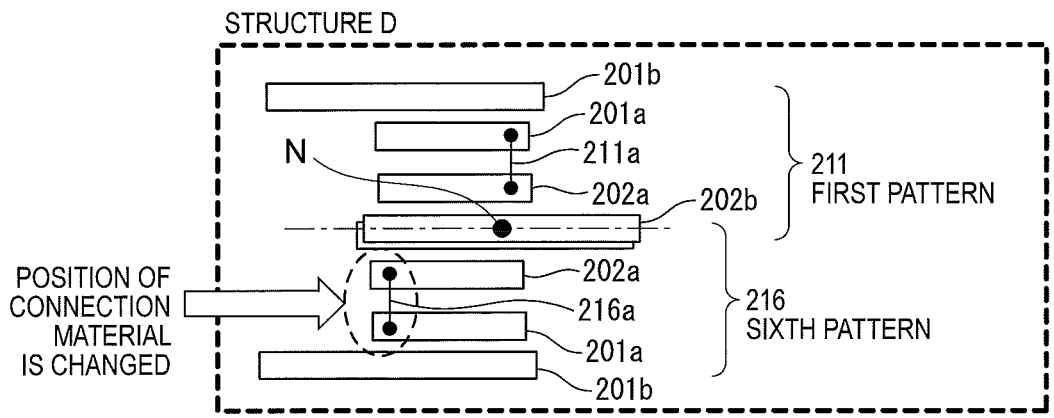

FIGS. 29A to 29C are drawings illustrating shrink structures of the arrangement patterns. A structure D is provided to include the first arrangement pattern 211 and a sixth arrangement pattern 216 in which, with respect to a fifth arrangement pattern 215 which passes through a structural center point N of a magnetic convergence material 202b of the two magnetic convergence materials 201b and 202b included in the first arrangement pattern, and has a relationship of line symmetry with the first arrangement pattern 211 about a straight line horizontal to the long side of the magnetic convergence material 202b, a connecting unit 216a electrically connecting the magnetic sensitivity materials 201a and 202a are arranged over the ends of the magnetic sensitivity materials 201a and 202a on the opposite side to the connecting unit 215a in the fifth arrangement pattern 215.

Figure 30:
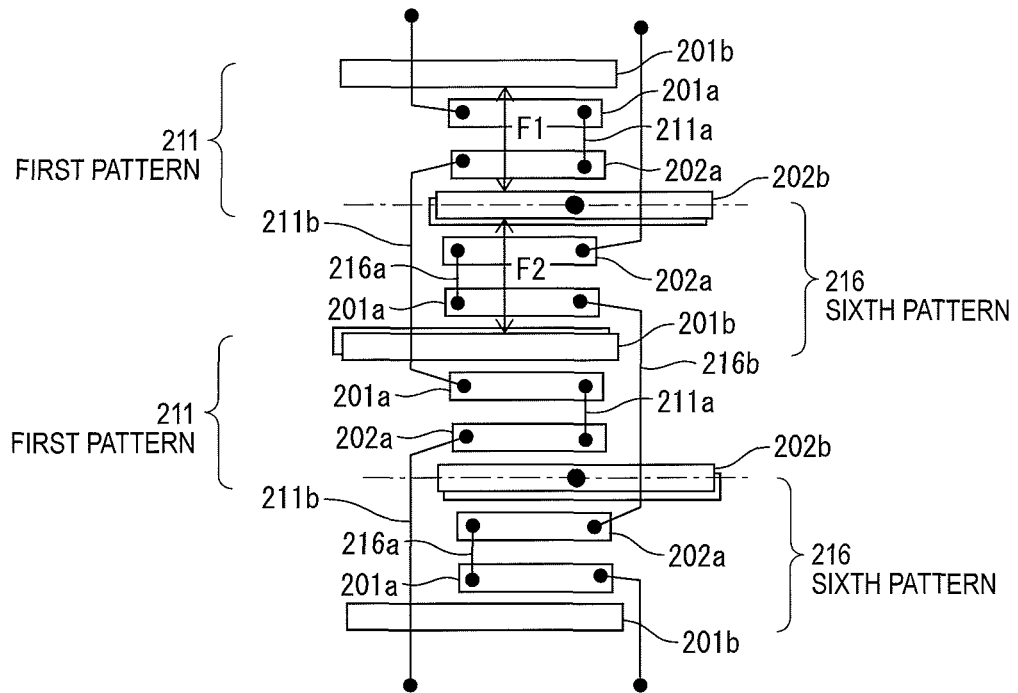
FIG. 30 is a drawing illustrating an array of the shrink structure illustrated in FIGS. 29A to 29C.

FIG. 30 is a drawing illustrating an array of the shrink structure illustrated in FIGS. 29A to 29C. Plural first arrangement patterns 211 and sixth arrangement patterns 216 are configured to be alternately arrayed in a repetitive manner, the magnetic sensitivity materials in the first arrangement pattern are connected by a connecting unit 211b so as to be an electrically single series connection, the magnetic sensitivity materials in the sixth arrangement pattern are connected by a connecting unit 216b so as to be the electrically single series connection, and the distance F1 between the magnetic convergence materials 201b and 202b in the first arrangement pattern is equal to the distance F2 between the magnetic convergence materials 201b and 202b in the sixth arrangement pattern.

Figure 31:
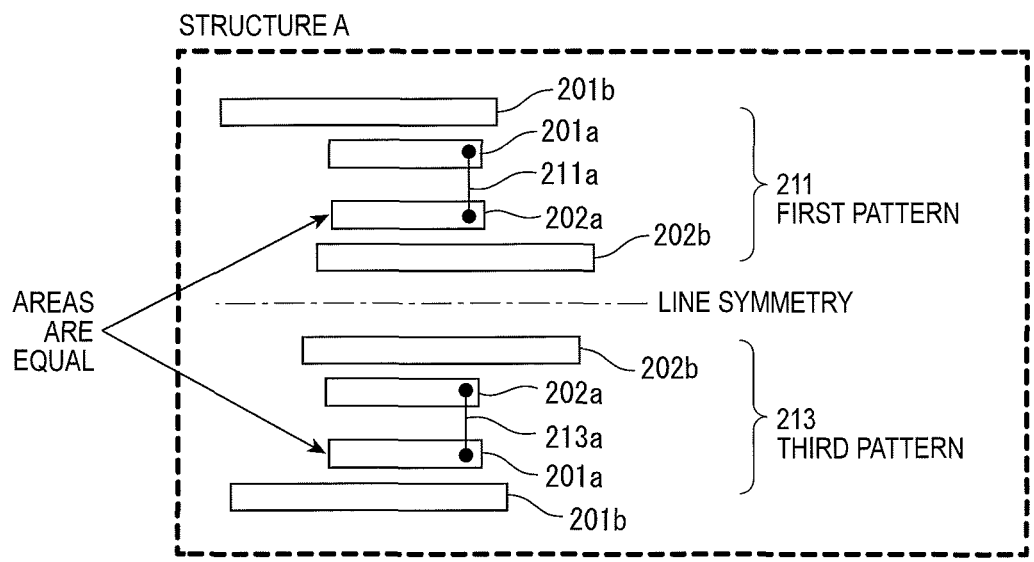
FIG. 31 is a drawing illustrating a case where the magnetic resistance (GMR) elements have the same resistance (area) in each of above-mentioned structures.

FIG. 31 is a drawing illustrating a case where the magnetic resistance (GMR) elements have the same resistance (i.e., area) in each of above-mentioned structures. Respective magnetic sensitivity material 201a and 202a which constitute two arrangement patterns in respective structures are configured to have an equal area.

Figure 32:
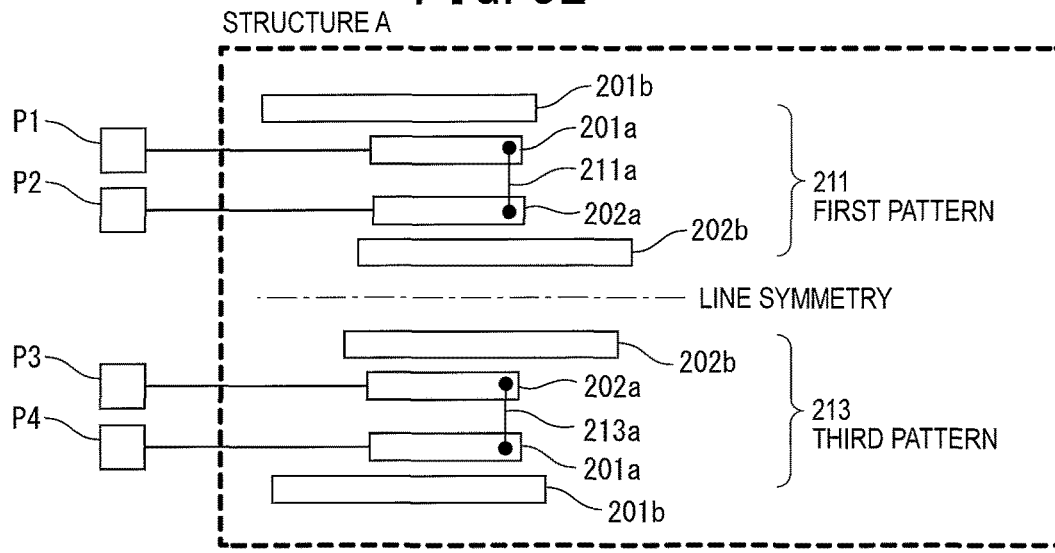
FIG. 32 is a drawing illustrating electrical coupling with electrode pads and a signal processing circuit.

FIG. 32 is a drawing illustrating electrical coupling with electrode pads and a signal processing circuit. Ends of the magnetic sensitivity materials 201a and 202a which are not electrically coupled by the connecting units 211a and 213a are electrically coupled to electrode pads (i.e., P1 to P4) or a signal processing circuit (i.e., IC).

Figure 33:
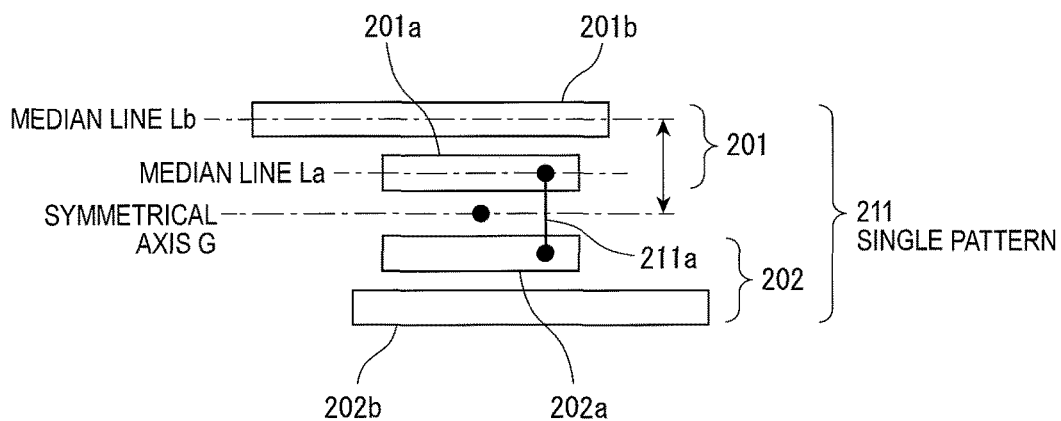
FIG. 33 is a drawing illustrating a positional relationship (in a plane) between the magnetic resistance (GMR) element and the magnetic convergence plates.

FIG. 33 is a drawing illustrating a positional relationship (on a plane) between the magnetic resistance (GMR) element and the magnetic convergence plates. In the single arrangement pattern 211, each median line La of the magnetic sensitivity materials 201a and 202a in the longitudinal direction of the first and second magnetic detection units 201 and 202, which constitute the single arrangement pattern, is arranged between a median line Lb of the magnetic convergence materials 201b and 202b in the longitudinal direction of the first and second magnetic detection units 201 and 202, and the point of symmetry or the line of symmetry in the single arrangement pattern.

Figure 34:
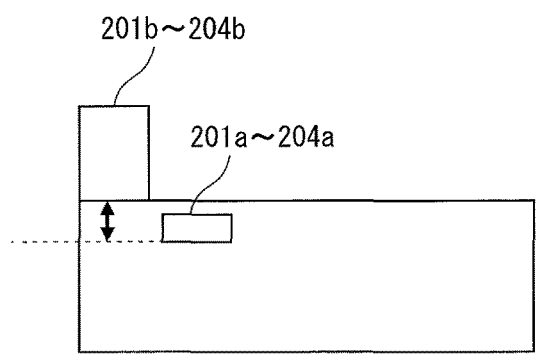
FIG. 34 is a drawing illustrating a positional relationship in height direction between a magnetic convergence material and a magnetic sensitivity material.

FIG. 34 is a drawing illustrating a positional relationship in height direction between a magnetic convergence material and a magnetic sensitivity material. The magnetic sensitivity materials 201a to 204a and the magnetic convergence materials 201b to 204b are formed on the identical flat substrate, and a bottom surface of each magnetic sensitivity material is arranged under a bottom surface of each magnetic convergence material.

As have been described above, the fundamental arrangement patterns in which the magnetoresistance element and the magnetic convergence plates are combined in the present invention have been described, but each magnetoresistance element is may be a giant magnet resistance element (GMR) or a tunnel magnetoresistance element (TMR).

Moreover, the width of each magnetoresistance element in the short side direction is preferably 0.1 to 20 microns. Each magnetic convergence unit may include a soft magnetic material, such as NiFe, NiFeB, NiFeCo, or CoFe. Furthermore, the thickness of each magnetic convergence material may be 1 to 40 microns.

Hereinafter, the magnetic detecting method of a magnetic sensor will be described. By using the magnetic sensor having the first structure A including the first arrangement pattern and the third arrangement pattern, the magnetic field (i.e., X magnetic field) parallel to a longitudinal direction of the magnetic convergence material is converted into directions opposite to the first arrangement pattern and the third arrangement pattern, the magnetic field (i.e., Y magnetic field) perpendicular to the longitudinal direction of the magnetic convergence material is converted into the same direction, the magnetic field (i.e., Z magnetic field) perpendicular to a plane direction of the magnetic convergence material is applied so that the magnetic fields in the magnetic sensitivity units adjacent to each other in a single pattern is + and − to be canceled respectively, and a difference of resistances of the magnetic sensor including the first arrangement pattern, and of the magnetic sensor including the third arrangement pattern is calculated, so that only the magnetic field (i.e., X magnetic field) parallel to the longitudinal direction of the magnetic convergence material in the structure A is calculated independently.

By using the magnetic sensor having the second structure (B) where the arrangement patterns of the first structure A are arranged not to be parallel to each other and so as not to overlap each other, the magnetic field (i.e., Y magnetic field) parallel to a longitudinal direction of the magnetic convergence material are converted into directions opposite to the first arrangement pattern and the third arrangement pattern, the magnetic field (i.e., X magnetic field) perpendicular to the longitudinal direction of the magnetic convergence material is converted into the same direction, the magnetic field (i.e., Z magnetic field) perpendicular to a plane direction of the magnetic convergence material are applied so that the magnetic fields in the magnetic sensitivity units adjacent to each other in a single pattern is + and − to be canceled respectively, and the difference of resistances of the magnetic sensors including the second structure (B) is calculated. Thus, only the magnetic field (i.e., Y magnetic field) parallel to the longitudinal direction of the magnetic convergence material with the structure B is calculated independently.

Moreover, by using the magnetic sensor having the second arrangement pattern and the fourth arrangement pattern, the magnetic field (i.e., X magnetic field) parallel to a longitudinal direction of the magnetic convergence material are converted into the same direction against the second arrangement pattern and the fourth arrangement pattern, the magnetic field (i.e., Y magnetic field) perpendicular to the longitudinal direction of the magnetic convergence material is converted into the same direction, the magnetic field (i.e., Z magnetic field) perpendicular to a plane direction of the magnetic convergence material are converted into directions opposite to the second arrangement pattern and the fourth arrangement pattern, a difference of resistances of the magnetic sensor including the fourth arrangement pattern and of the magnetic sensor including the second arrangement pattern is calculated, so that only the magnetic field (i.e., Z magnetic field) perpendicular to the plane direction of the magnetic convergence material is calculated independently.

Moreover, by combining the above-described magnetic detecting methods, it is possible to separate mixed magnetic fields of three axes, X magnetic field, Y magnetic field and Z magnetic field, and detect each of the magnetic fields independently on the identical flat surface.

Example 3

FIGS. 35A to 35E are schematic diagrams of arrangement patterns illustrative of the magnetic sensor according to an example 3 of the present invention, and are schematic diagrams illustrative of the sensor arrangement patterns of the seventh arrangement pattern and the eighth arrangement pattern, as the magnetic sensor for detecting X magnetic field on the identical substrate. In other words, these are schematic diagrams of the arrangement patterns of the magnetic sensor in which it is possible to detect a magnetic field in an arbitrary axis direction parallel to the flat substrate, and it is made possible for the magnetic sensor to detect the magnetic field perpendicular to the flat substrate on the identical substrate.

Figure 35A:
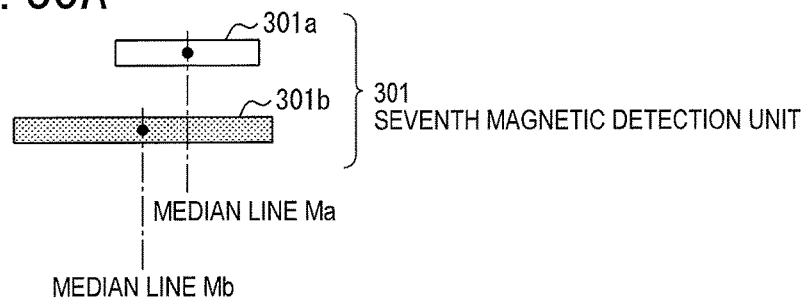
FIGS. 35A to 35E are schematic diagrams of arrangement patterns illustrative of a magnetic sensor according to an example 3 of the present invention.
Figure 35B:
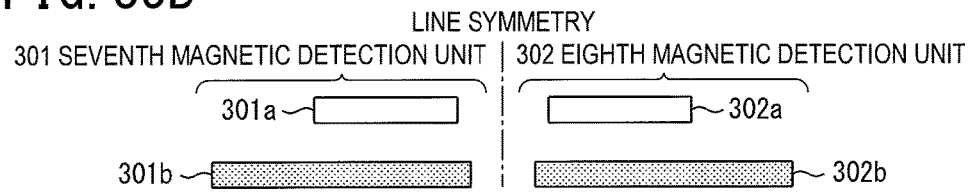
Figure 35C:
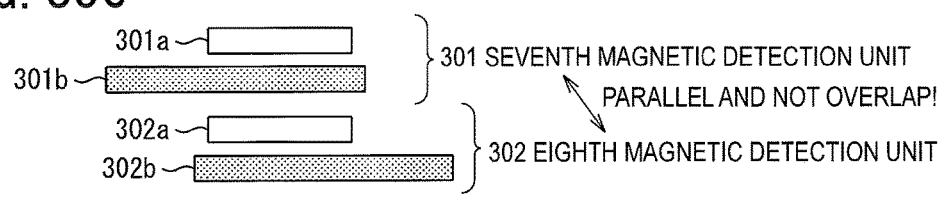
Figure 35D:
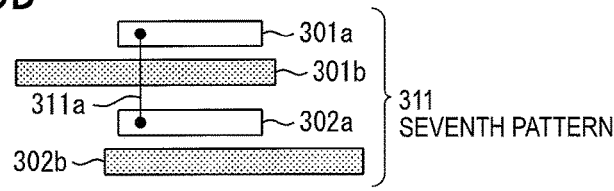
Figure 35E:
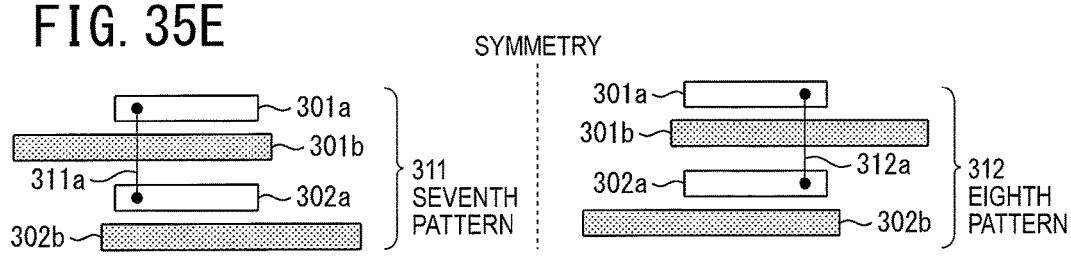

FIG. 35A illustrates the seventh magnetic detection unit, FIG. 35B illustrates the eighth magnetic detection unit arranged in line symmetry with the seventh magnetic detection unit, FIG. 35C illustrates the eighth magnetic detection unit arranged parallel to but not to overlap the seventh magnetic detection unit, FIG. 35D illustrates the seventh arrangement pattern including two seventh magnetic detection units and the eighth magnetic detection unit electrically connected with the seventh magnetic detection units, and FIG. 35E illustrates the eighth arrangement pattern arranged in line symmetry with the seventh arrangement pattern.

The seventh magnetic detection unit 301 includes, as illustrated in FIG. 35A, a quadrangular magnetic sensitivity material 301a and a quadrangular magnetic convergence material 301b having a length different from that of the magnetic sensitivity material 301a. The eighth magnetic detection unit 302 is arranged, as illustrated in FIG. 35B, to be parallel to the substrate, so that a median line Ma passing through a midpoint of the magnetic sensitivity material 301a in the longitudinal direction and a median line Mb passing through a midpoint of the magnetic convergence material 301b in the longitudinal direction do not cross to each other, and has the same structure as that of the seventh magnetic detection unit 301 to be arranged in line symmetry therewith.

Moreover, as illustrated in FIG. 35C, a magnetic sensitivity material 302a of the eighth magnetic detection unit 302 is arranged so as to be sandwiched by the magnetic convergence material 301b of the seventh magnetic detection unit 301 and a magnetic convergence material 302b of the eighth magnetic detection unit 302, so that the seventh magnetic detection unit 301 and the eighth magnetic detection unit 302 are parallel to each other and do not overlap each other.

As illustrated in FIG. 35D, the seventh arrangement pattern 311 is provided to include the magnetic sensitivity material 301a of the seventh magnetic detection unit 301, and a connecting unit 311a electrically connecting in series with the magnetic sensitivity material 302a of the eighth magnetic detection unit 302.

Further, as illustrated in FIG. 35E, the eighth arrangement pattern 312 having the same structure as that of the seventh arrangement pattern 311 is arranged parallel to the flat substrate, symmetric about a line parallel to a short side direction of the magnetic convergence materials 301b and 302b of the seventh arrangement pattern 311, and in an opposite manner and separated so as not to overlap each other.

Figure 36:
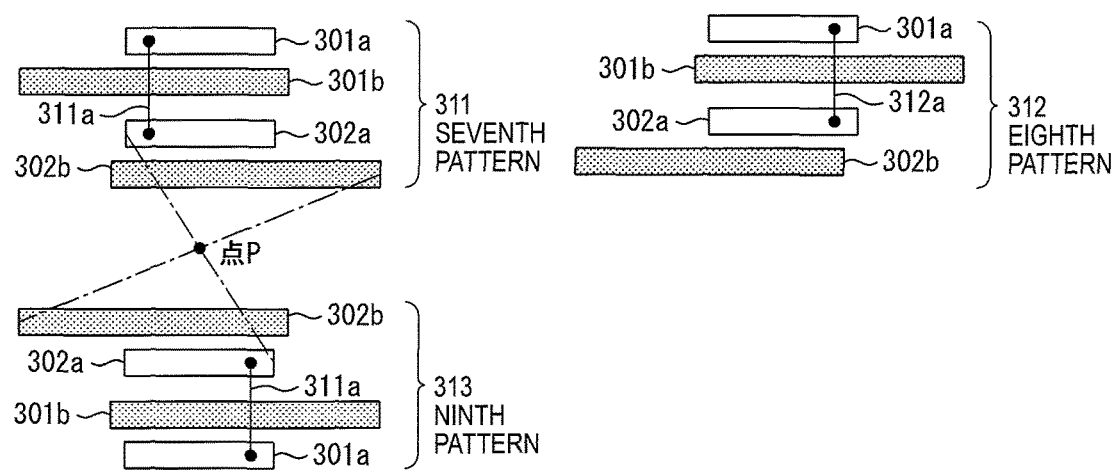
FIG. 36 is a schematic diagram illustrative of a sensor arrangement pattern of a ninth arrangement pattern as a magnetic sensor for detecting X- to Z-magnetic fields on the identical substrate in the magnetic sensor according to the example 3 of the present invention, in addition to a seventh arrangement pattern and an eighth arrangement pattern.

FIG. 36 is a schematic diagram illustrative of a sensor arrangement pattern of a ninth arrangement pattern as a magnetic sensor for detecting the X magnetic field to Z magnetic field on the identical substrate of the magnetic sensor according to the example 3 of the present invention, in addition to the seventh arrangement pattern and the eighth arrangement pattern.

The seventh arrangement pattern 311 and the eighth arrangement pattern 312 are provided on the identical substrate, the ninth arrangement pattern 313 having the same structure as that of the seventh arrangement pattern 311 is further provided, the ninth arrangement pattern 313 is arranged in symmetric with an arbitrary point P and so that the longitudinal directions of the magnetic convergence materials 301b and 302b of the seventh arrangement pattern 311 and the longitudinal directions of the magnetic convergence materials 301b and 302b of the ninth arrangement pattern 313 are parallel to one another not to overlap one another. The seventh arrangement pattern 311, the eighth arrangement pattern 312, and the ninth arrangement pattern 313 are arranged parallel to one another, and in different positions.

Figure 37:
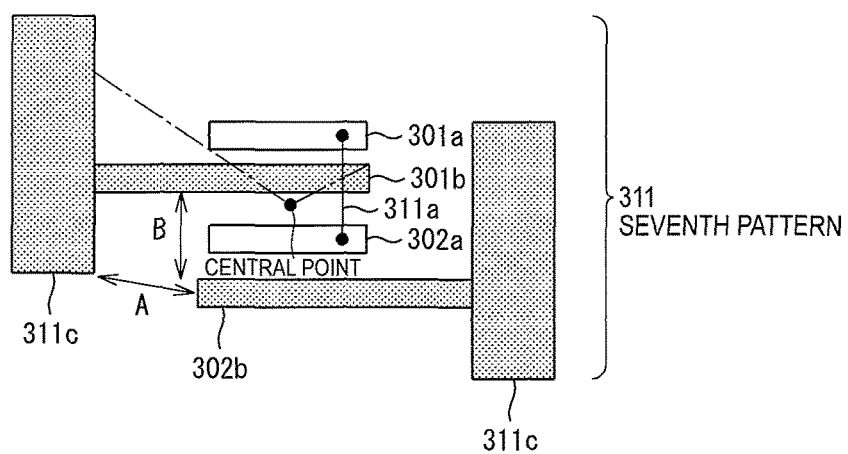
FIG. 37 is a drawing illustrating a form of magnetic convergence materials as the magnetic sensor of the magnetic sensor according to the example 3 of the present invention.

FIG. 37 is a drawing illustrating a form of magnetic convergence materials as the magnetic sensor of the magnetic sensor according to the example 3 of the present invention. A magnetic convergence member 311c is arranged so as to contact the short side of the magnetic convergence materials 301b and 302b on a far side from a structural center point of the seventh arrangement pattern 311 to form a letter T shape, and is arranged at the same time in a positional relationship where a distance A between the magnetic convergence member 311c and adjacent and opposite magnetic convergence material 301b or 302b is longer than a distance B between two magnetic convergence materials 301b and 302b in the arrangement pattern 311.

Figure 38:
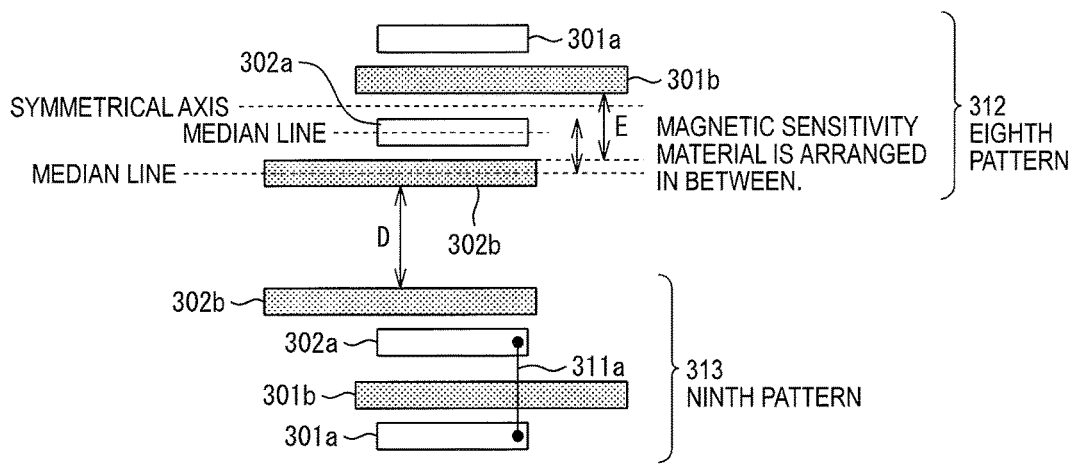
FIG. 38 is a drawing illustrating a positional relationship between magnetic convergence materials and magnetic sensitivity material, as the magnetic sensor of the magnetic sensor according to the example 3 of the present invention.

FIG. 38 is a drawing illustrating a positional relationship between the magnetic convergence materials and magnetic sensitivity material as the magnetic sensor of the magnetic sensor according to the example 3 of the present invention. The distance D between the magnetic convergence materials 302b and 302b over the respective arrangement patterns 312 and 313 are longer than the distance E between the two magnetic convergence materials 301b and 302b in each arrangement pattern 312 and 313.

Figure 39:
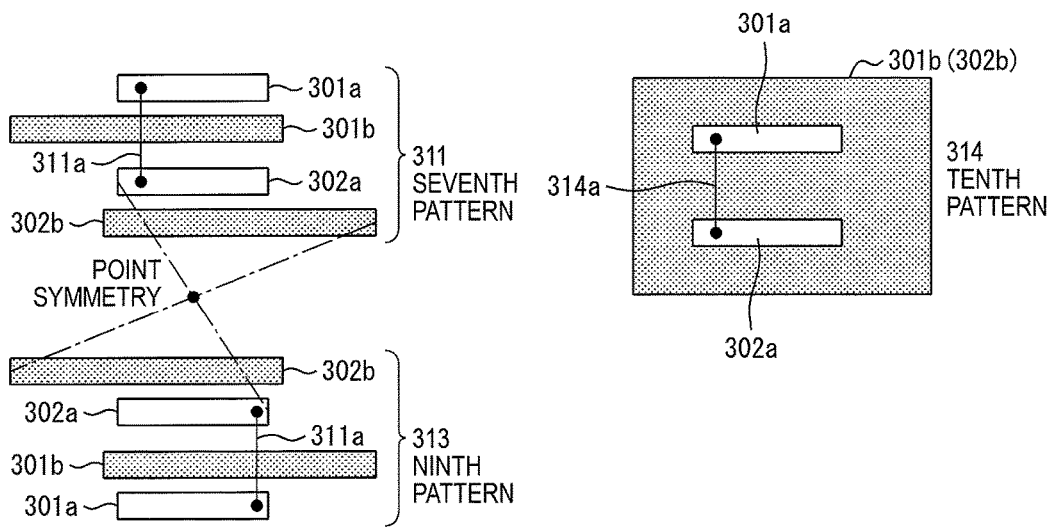
FIG. 39 is a schematic diagram illustrative of a tenth arrangement pattern as the magnetic sensor of the magnetic sensor according to the example 3 of the present invention.

FIG. 39 is a schematic diagram illustrative of a tenth arrangement pattern as the magnetic sensor of the magnetic sensor according to the example 3 of the present invention, and illustrates the tenth arrangement pattern as the magnetic sensor for detecting the X to Z magnetic fields on the identical substrate.

The seventh arrangement pattern 311 and the ninth arrangement pattern 313 are provided, an in addition, the magnetic sensitivity materials 301a and 302a and the magnetic convergence material 301b (302b) arranged on upper side than the magnetic sensitivity materials 301a and 302a are provided, the tenth arrangement pattern 314 arranged to provide the magnetic convergence material 301b (302b) covers at least the whole flat surface of the magnetic sensitivity materials 301a and 302a. The seventh arrangement pattern 311, the eighth arrangement pattern 312, and the tenth arrangement pattern 314 are arranged parallel to one another and in different positions.

Figure 40:
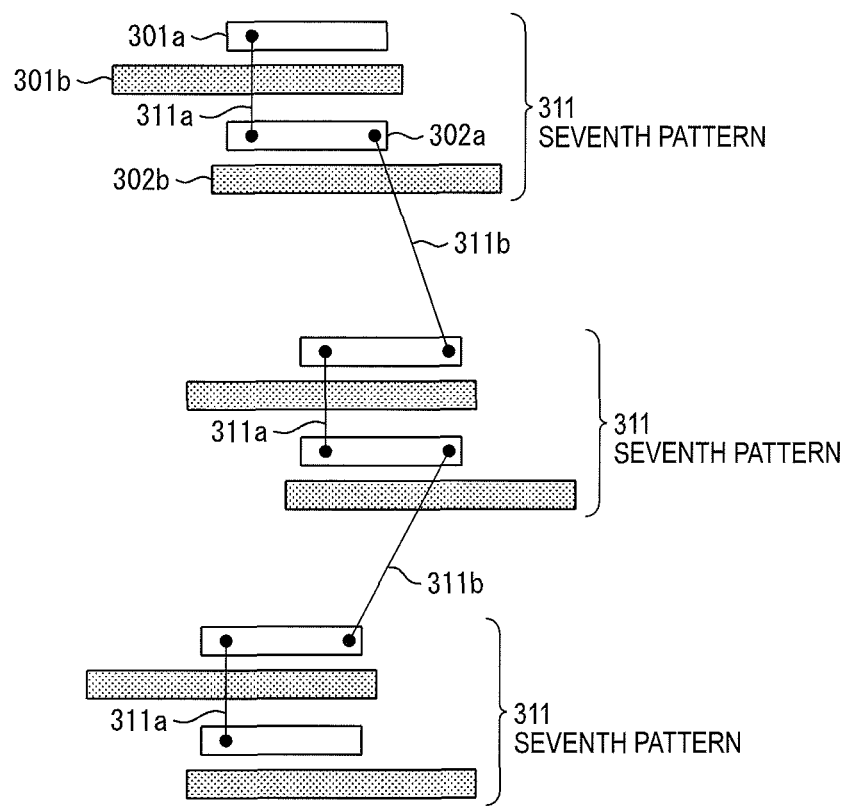
FIG. 40 is a structural drawing of the magnetic sensor in which plural arrangement patterns are arrayed.

FIG. 40 is a structural drawing of the magnetic sensor in which plural arrangement patterns are arrayed, and a drawing illustrating electrical coupling of the magnetic sensitivity materials, as a magnetic sensor of the magnetic sensor according to the example 1 of the present invention. As for the seventh arrangement pattern 311 to the tenth arrangement pattern 314, in each arrangement pattern, plural arrangement patterns having the same structure are provided to constitute arrangement pattern groups. The arrangement pattern groups are arranged parallel to each other and so as not to overlap, and the magnetic sensitivity units included in each arrangement pattern are electrically connected so as to be a single series connection.

Example 4

Figure 41:
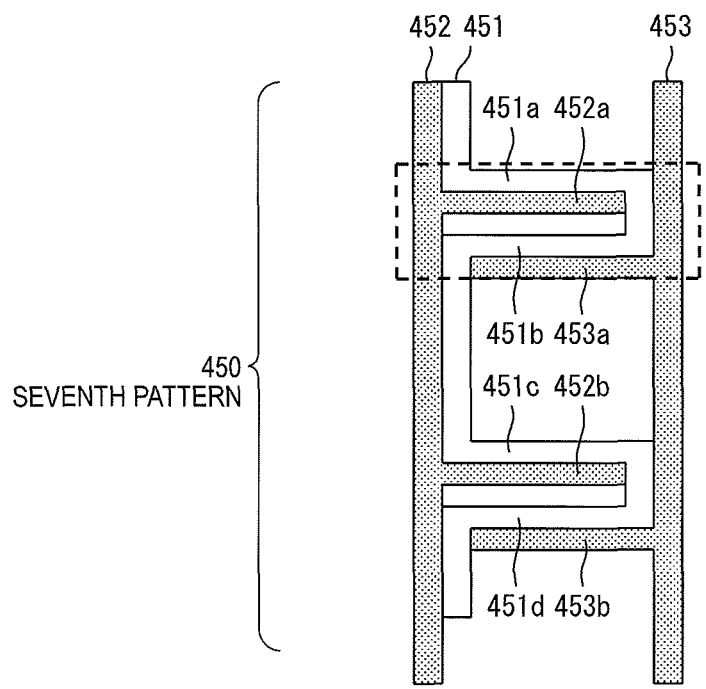
FIG. 41 is a schematic diagram illustrative of a magnetic sensor according to an example 4 of the present invention.

FIG. 41 is a schematic diagram illustrative of a magnetic sensor according to an example 4 of the present invention, and illustrates the magnetic sensor unit including the seventh arrangement pattern 311. In the drawing, a reference numeral 450 denotes a seventh magnetic sensor unit, a reference numeral 451 denotes a GMR element, a reference numeral 451a denotes a first part of the GMR element 451, a reference numeral 451b denotes a second part of the GMR element 451, a reference numeral 451c denotes a third part of the GMR element 451, a reference numeral 451d denotes a fourth part of the GMR element 451, a reference numeral 452 denotes a magnetic convergence plate, a reference numeral 452a denotes a first part of comb-teeth of the magnetic convergence plate 452, a reference numeral 452b denotes a second part of comb-teeth of the magnetic convergence plate 452, a reference numeral 453 denotes another magnetic convergence plate, a reference numeral 453a denotes a first part of comb-teeth of the magnetic convergence plate 453, and a reference numeral 453b denotes a second part of comb-teeth of the magnetic convergence plate 453.

In the seventh magnetic sensor unit 450, the comb-teeth-like magnetic convergence plate 452a adjoins the GMR element 451a which is a magnetic sensitivity unit in the longitudinal direction, the comb-teeth-like magnetic convergence plate 453a adjoins the GMR element 451b in the longitudinal direction, and are connected by a connecting unit. The GMR element 451a and the comb-teeth-like magnetic convergence plate 452a, and the GMR element 451b and the comb-teeth-like magnetic convergence plate 453a form point symmetry structures, respectively, and thus a seventh arrangement pattern 311 includes these elements to provide a single structure pattern.

Figure 42:
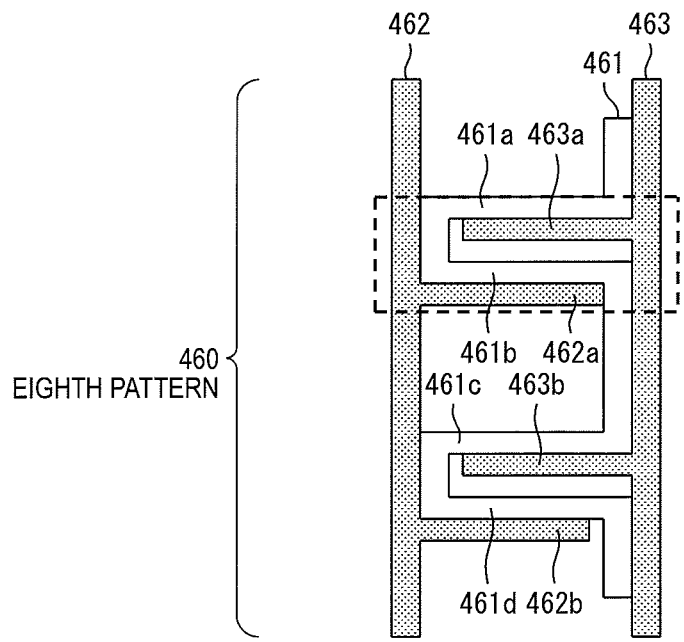
FIG. 42 is another schematic diagram illustrative of the magnetic sensor according to the example 4 of the present invention.

FIG. 42 is another schematic diagram illustrative of the magnetic sensor according to the example 4 of the present invention, and illustrates the magnetic sensor unit including the eighth arrangement pattern. In the drawing, a reference numeral 460 denotes an eighth magnetic sensor unit, a reference numeral 461 denotes a GMR element, a reference numeral 461a denotes a first part of the GMR element 461, a reference numeral 461b denotes a second part of the GMR element 461, a reference numeral 462 denotes a magnetic convergence plate, a reference numeral 462a denotes a first part of comb-teeth of the magnetic convergence plate 462, a reference numeral 462b denotes a second part of comb-teeth of the magnetic convergence plate 462, a reference numeral 463 denotes another magnetic convergence plate, a reference numeral 463a denotes a first part of comb-teeth of the magnetic convergence plate 463, and a reference numeral 463b denotes a second part of comb-teeth of the magnetic convergence plate 463.

In a magnetic convergence plate 462, plural comb-teeth-like magnetic convergence plates are formed at an equal interval from a beam-like member on one side in the direction perpendicular to the aforementioned beam-like member. Moreover, the magnetic convergence plate 463 is provided opposite to the magnetic convergence plate, and plural magnetic convergence plates are formed at an equal interval from another beam-like member on one side in the direction perpendicular to the aforementioned another beam-like member.

In the eighth magnetic sensor unit 460, the comb-teeth-like magnetic convergence plate 463a adjoins the GMR element 461a which is a magnetic sensitivity unit in the longitudinal direction, the comb-teeth-like magnetic convergence plate 462a adjoins the GMR element 461b in the longitudinal direction, and are connected by a connecting unit. The GMR element 461b and the comb-teeth-like magnetic convergence plate 462a form a point symmetry structure, and thus the eighth arrangement pattern 312 which includes the elements to provide a single structure pattern.

Note that the seventh arrangement pattern 311 and the eighth arrangement pattern 312 have a positional relationship of line symmetry about a short side direction of the comb-teeth-like magnetic convergence plate.

Figure 43:
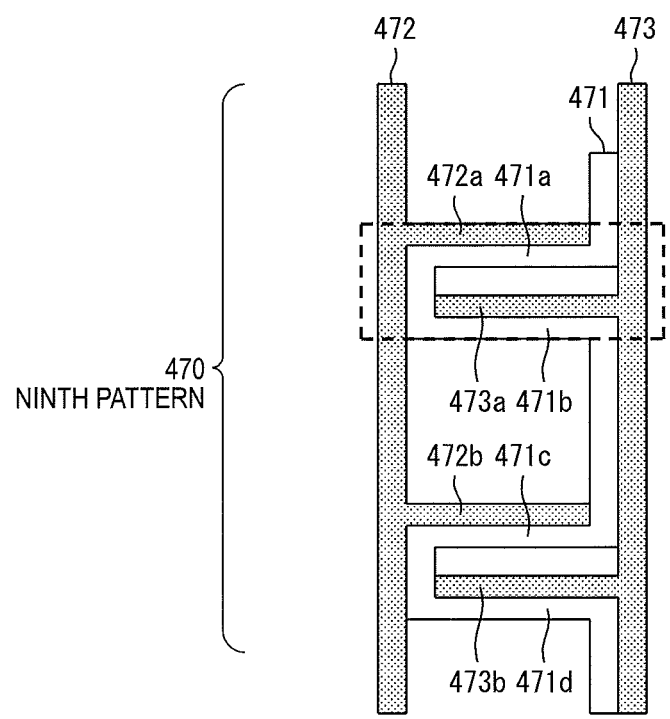
FIG. 43 is still another schematic diagram illustrative of the magnetic sensor according to the example 4 of the present invention.

FIG. 43 is still another schematic diagram illustrative of the magnetic sensor according to the example 4 of the present invention, and illustrates the magnetic sensor unit including the ninth arrangement pattern. In the drawing, a reference numeral 470 denotes a ninth magnetic sensor unit, a reference numeral 471 denotes a GMR element, a reference numeral 471a denotes a first part of the GMR element 471, a reference numeral 471b denotes a second part of the GMR element 471, a reference numeral 472 denotes a magnetic convergence plate, a reference numeral 472a denotes a first part of comb-teeth of the magnetic convergence plate 472, a reference numeral 472b denotes a second part of comb-teeth of the magnetic convergence plate 472, a reference numeral 473 denotes another magnetic convergence plate, a reference numeral 473a denotes a first part of comb-teeth of the magnetic convergence plate 473, and a reference numeral 473b denotes a second part of comb-teeth of the magnetic convergence plate 473.

In the magnetic convergence plate 472, plural comb-teeth-like magnetic convergence plates are formed at an equal interval from the beam-like member on one side in the direction perpendicular to the aforementioned beam-like member. Moreover, the magnetic convergence plate 473 is provided opposite to the magnetic convergence plate, and plural magnetic convergence plates are formed at an equal interval from another beam-like member on one side in the direction perpendicular to the aforementioned another beam-like member.

In the ninth magnetic sensor unit 470, the comb-teeth-like magnetic convergence plate 472a adjoins the GMR element 471a which is a magnetic sensitivity unit in the longitudinal direction, and in addition, the comb-teeth-like magnetic convergence plate 473a adjoins the longitudinal direction of the GMR element 471b, and is connected by a connecting unit. The GMR element 471a and the comb-teeth-like magnetic convergence plate 472a, and the GMR element 471b and the comb-teeth-like magnetic convergence plate 473a form positional relationships of point symmetry, respectively, and thus a ninth arrangement pattern 313 which includes the elements to provide a single structure pattern.

Note that the seventh arrangement pattern 311 and the ninth arrangement pattern 313 have a positional relationship of point symmetry about a longitudinal direction of the comb-teeth-like magnetic convergence plate.

Figure 44:
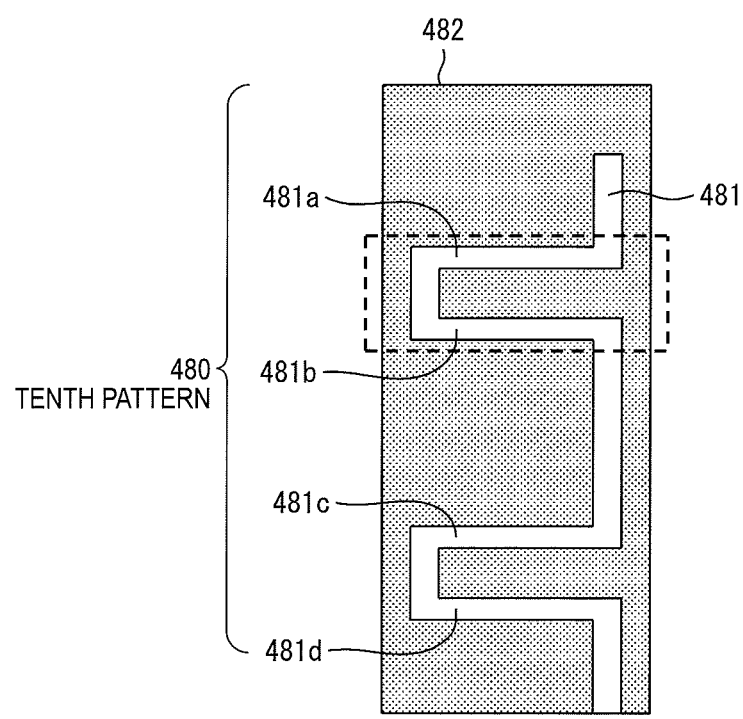
FIG. 44 is yet another schematic diagram illustrative of the magnetic sensor according to the example 4 of the present invention.

FIG. 44 is yet another schematic diagram illustrative of the magnetic sensor according to the example 4 of the present invention, and illustrates the magnetic sensor unit including the tenth arrangement pattern. In the drawing, a reference numeral 480 denotes a tenth magnetic sensor unit, a reference numeral 481 denotes a GMR element, a reference numeral 481a denotes a first part of the GMR element 481, a reference numeral 481b denotes a second part of the GMR element 481, a reference numeral 481c denotes a third part of the GMR element 481, a reference numeral 481d denotes a fourth part of the GMR element 481, and a reference numeral 482 denotes a magnetic convergence plate which covers the whole surface of the GMR. The shape of the magnetic convergence plate 482 is not limited in particular, as far as the concentrator covers the whole surface of the magnetic sensitivity unit of the GMR element 481. In FIG. 44, the magnetic convergence plate having a rectangular shape is arranged.

The short side direction of the GMR element of the tenth magnetic sensor unit 480 is to be parallel to the short side directions of the GMRs of the seventh, eighth, and ninth magnetic sensors.

Figure 45:
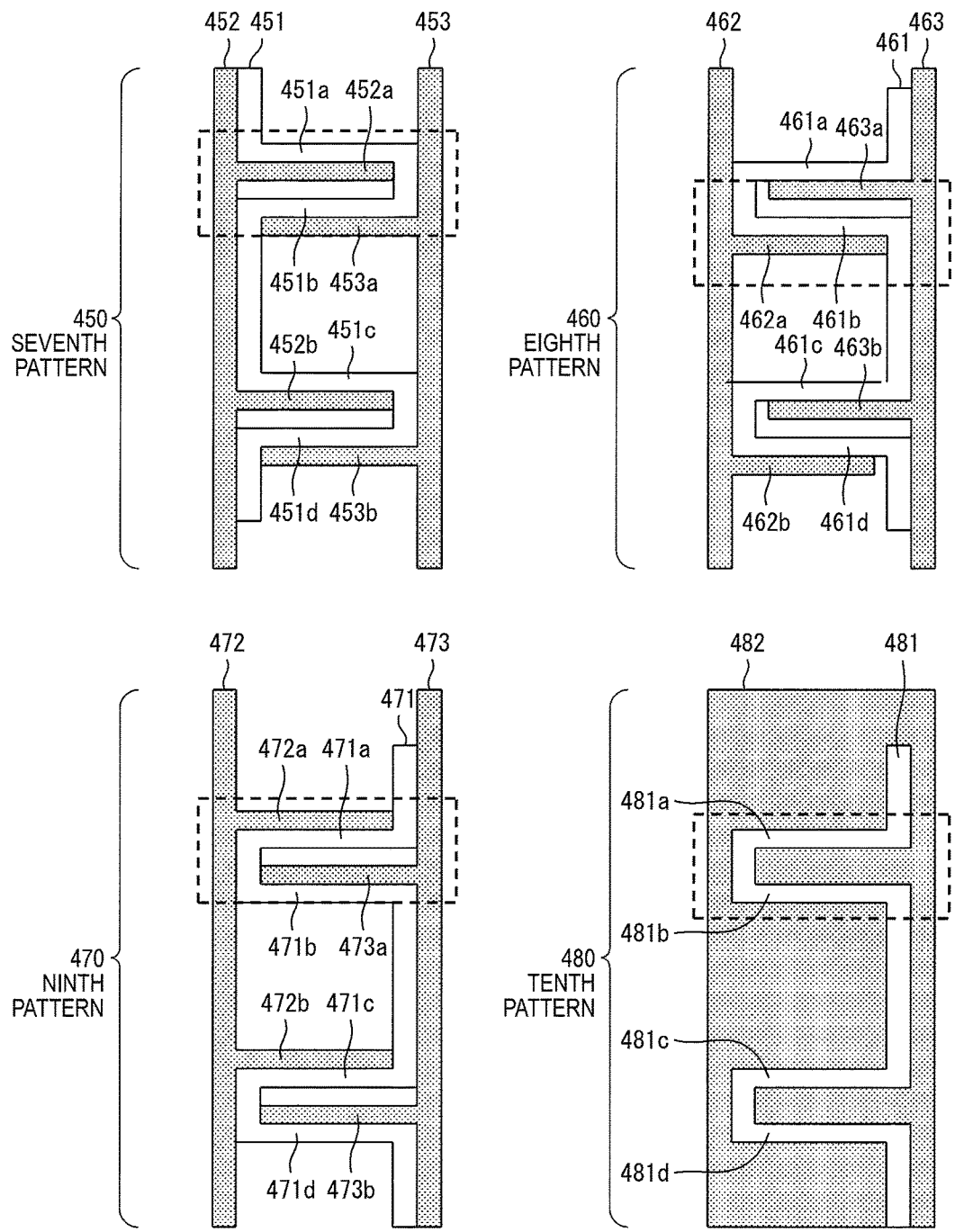
FIG. 45 is a structural drawing in which a seventh magnetic sensor unit having the seventh arrangement pattern, an eighth magnetic sensor unit having the eighth arrangement pattern, a ninth magnetic sensor unit having the ninth arrangement pattern, and a tenth magnetic sensor unit having the tenth arrangement pattern are disposed on the identical substrate.

FIG. 45 is a structural drawing in which a seventh magnetic sensor unit having the seventh arrangement pattern, an eighth magnetic sensor unit having the eighth arrangement pattern, a ninth magnetic sensor unit having the ninth arrangement pattern, and a tenth magnetic sensor unit having the tenth arrangement pattern are disposed on the identical substrate.

The seventh magnetic sensor unit 450 having the seventh arrangement pattern and the magnetic sensor unit 460 having the eighth arrangement pattern have a positional relationship of line symmetry about a short side direction of the comb-teeth-like magnetic convergence plate. Moreover, the seventh magnetic sensor unit 450 having the seventh arrangement pattern and the ninth magnetic sensor unit 470 having the ninth arrangement pattern are in a positional relationship of point symmetry about a longitudinal direction of the comb-teeth-like magnetic convergence plate. The tenth magnetic sensor unit 480 having the tenth arrangement pattern is arranged on the identical substrate parallel to the seventh to ninth magnetic sensor units 450, 460, and 470.

Furthermore, as for the seventh to tenth magnetic sensor units 450, 460, 470 and 480, both ends of each GMR element are electrically connected to electrode pads or a signal processing circuit such as an LSI, so as to output a resistance value.

The sensitivity axes of respective GMR elements of the seventh to tenth magnetic sensor units 450, 460, 470 and 480 are arranged parallel to one another, and all GMR elements have the same length and width, and have the same resistance value.

Figure 46:
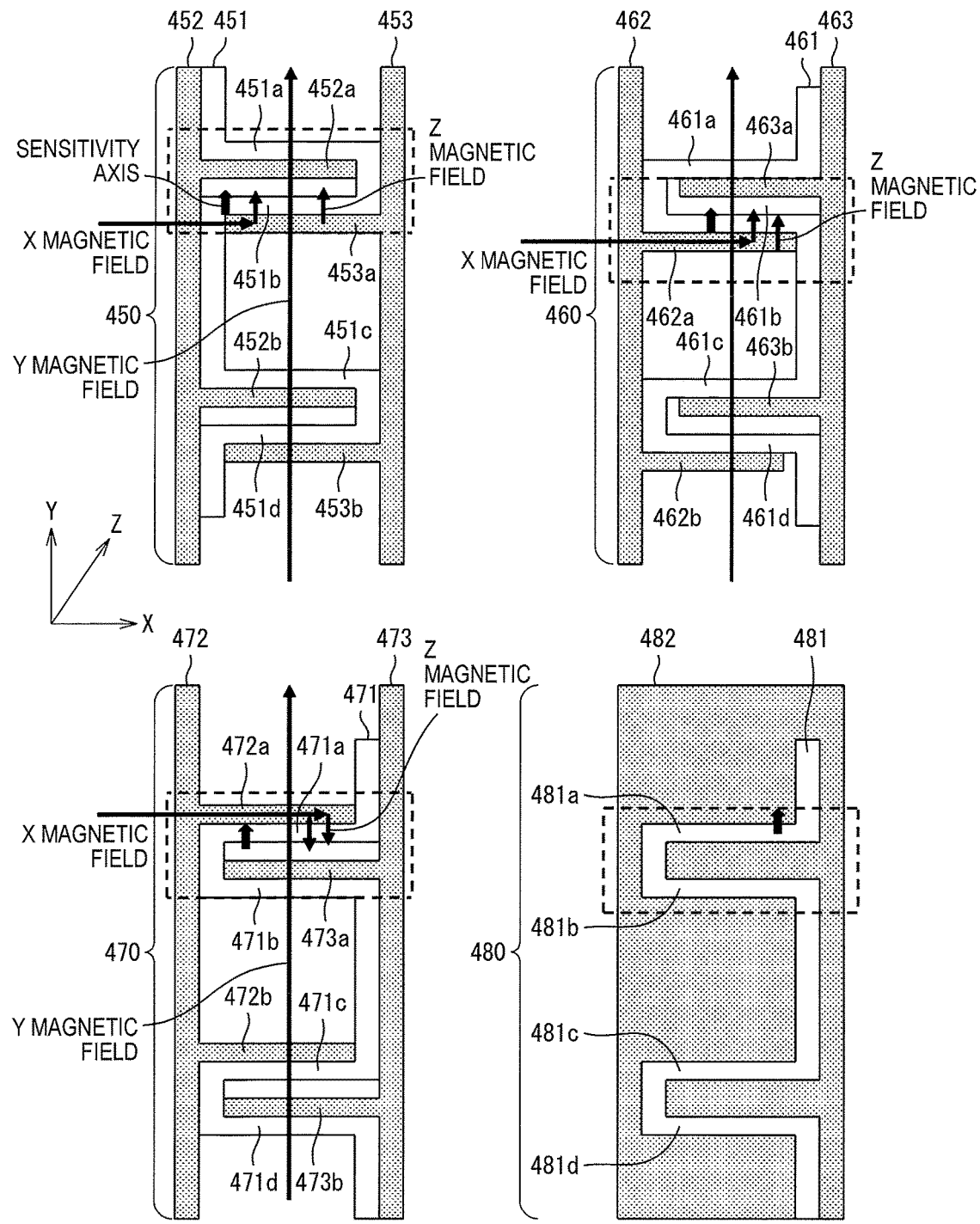
FIG. 46 is a drawing illustrative of embodiments of resistance changes in the seventh to tenth magnetic detection units, when the magnetic fields in X, Y, and Z directions are applied to the magnetic sensor of the present invention.

FIG. 46 is a drawing illustrative of resistance changes in the seventh to tenth magnetic detection units, when the magnetic fields in X, Y, and Z directions are applied to the magnetic sensor of the present invention. A direction from left to right for the magnetic field of the X axis, a direction from bottom to up for the magnetic field of the Y axis, a direction toward the paper plane for the magnetic field of the Z axis are defined as positive (+) directions.

When the magnetic field of Hx in the X direction is applied to the seventh magnetic sensor unit 450, the magnetic field in the X direction is bent to negative −Y direction by protruding magnetic convergence plates arranged next to each other. The direction of the bent magnetic field is the same direction as that of the GMR element sensitivity axis. Therefore, when assuming that c is an efficiency of magnetic field conversion for the X magnetic field of the magnetic convergence plates, the resistance change proportional to −cHx is exhibited. When Hy of magnetic field in +Y direction is applied, the direction is similar to the sensitivity axis direction of the GMR element 451. Therefore, when assuming that a is an efficiency of magnetic field conversion for the Y magnetic field of the magnetic convergence plates, the resistance change proportional to +aHy is exhibited. Furthermore, when the magnetic field of Hz is applied from the Z direction, the Z magnetic field is bent to both sides (+/−X direction) of the magnetic convergence plates. However, since the GMR 451 is arranged at a position of +Y direction to adjoin the comb-teeth magnetic convergence plates 452 and 453, when assuming that d is an efficiency of magnetic field conversion for the Z magnetic field of the magnetic convergence plates, the resistance change according to the Z magnetic field bent to +Y direction, i.e., the resistance change proportional to +dHz is exhibited. Summarizing these facts, the resistance of the seventh magnetic sensor unit 50 when the magnetic fields in X, Y, and Z directions are applied is represented by the following expression (1).

$$R1 = -cHx + aHy - dHz + R \tag{1}$$

Next, when the magnetic field of Hx in the X direction is applied to the eighth magnetic sensor unit 460, the magnetic field in the X direction is bent to +Y direction by the protruding magnetic convergence plates arranged next to each other. The direction of the bent magnetic field is the same direction as that of the GMR element sensitivity axis. Therefore, when assuming that c is an efficiency of magnetic field conversion for the X magnetic field of the magnetic convergence plates, the resistance change proportional to +cHx is exhibited. When of the magnetic field of Hy in +Y direction is applied, the direction is similar to the sensitivity axis direction of the GMR element 461. Therefore, when assuming that a is an efficiency of magnetic field conversion for the Y magnetic field of the magnetic convergence plates, the resistance change proportional to +aHy is exhibited. Furthermore, when the magnetic field of Hz is applied from the Z direction, the Z magnetic field is bent to both sides (+/−X direction) of the magnetic convergence plates. However, since the GMR 461 is arranged at a position of +Y direction to adjoin the comb-teeth magnetic convergence plates 462 and 463, when assuming that d is an efficiency of magnetic field conversion for the Z magnetic field of the magnetic convergence plates, the resistance change of the Z magnetic field bent to +Y direction, i.e., the resistance change proportional to +dHz is exhibited. Summarizing these facts, the resistance of the eighth magnetic sensor unit 460 when the magnetic fields in X, Y, and Z directions are applied is represented by the following expression (2).

$$R2 = cHx + aHy + dHz + R \tag{2}$$

When the magnetic field of Hx in the X direction is applied to the ninth magnetic sensor unit 470, the magnetic field in the X direction is bent to −Y direction by the protruding magnetic convergence plates arranged next to each other. The direction of the bent magnetic field is the same direction as that of the GMR element sensitivity axis. Therefore, when assuming that c is an efficiency of magnetic field conversion for the X magnetic field of the magnetic convergence plates, the resistance change proportional to −cHx is exhibited. When the magnetic field of Hy is applied to the magnetic field in +Y direction, the direction is similar to the sensitivity axis direction of the GMR element 471. Therefore, when assuming that a is an efficiency of magnetic field conversion for the Y magnetic field of the magnetic convergence plates, the resistance change proportional to +aHy is exhibited. Furthermore, when the magnetic field of Hz is applied from the Z direction, the Z magnetic field is bent to both sides (+/−X direction) of the magnetic convergence plates. However, the GMR 471 is arranged in −Y direction with respect to the comb-teeth magnetic convergence plates 472 and 473. Therefore, when assuming that d is an efficiency of magnetic field conversion for the Z magnetic field of the magnetic convergence plates, the resistance change of the Z magnetic field bent to −Y direction, i.e., the resistance change proportional to −dHz is exhibited. Summarizing these facts, the resistance of the ninth magnetic sensor unit 470 when the magnetic fields in X, Y, and Z directions are applied is represented by the following expression (3).

$$R3 = -cHx + aHy - dHz + R \tag{3}$$

Next, as for the tenth magnetic sensor unit 480, the magnetic convergence plate 482 fully covers the magnetic sensitivity unit of the GMR element 481. Therefore, even when the magnetic field of Hx in X direction and the magnetic field of Hy in Y direction are applied, the magnetic fields pass through the magnetic convergence plates, no magnetic field is applied to the GMR element and the resistance does not change. The magnetic field of Hx in Z direction exits from the magnetic convergence plates and reaches the GMR. However, since the GMR element has no sensitivity in a vertical magnetic field, no resistance change is exhibited in the tenth magnetic sensor unit 480 due to the X, Y, and Z magnetic fields, and the resistance of the tenth magnetic sensor unit 480 is represented by the following expression (4).

$$R4 = R \tag{4}$$

By calculating with the above-described expressions (1) to (4), the magnetic fields in X, Y, and Z directions can be separated.

When subtracting expression (1) from expression (2) in order to calculate the magnetic field in the X-axis direction, only the magnetic field in the Hx direction is calculable as represented by expression (5).

$$R2 - R1 = (cHx + aHy + dHz + R) - (-cHx + aHy + dHz + R)$$
$$= 2cHX \tag{5}$$

In other words, in a magnetic detecting method of a magnetic sensor including the seventh arrangement pattern and the eighth arrangement pattern, the magnetic field (i.e., X magnetic field) parallel to a longitudinal direction of the magnetic convergence material is converted into direction opposite to the seventh arrangement pattern and the eighth arrangement pattern, the magnetic field (i.e., Y magnetic field) perpendicular to the longitudinal direction of the magnetic convergence material is converted into the same direction, the magnetic field (i.e., Z magnetic fields) perpendicular to a plane direction of the magnetic convergence material is converted into the same direction against the seventh arrangement pattern and the eighth arrangement pattern. The difference between the resistance of the magnetic sensor including the seventh arrangement pattern and the resistance of the magnetic sensor including the eighth arrangement pattern is calculated, so that only the X magnetic field is calculated independently.

When subtracting expression (3) from expression (1) in order to calculate the magnetic field in the Z-axis direction, only the magnetic field in the HZ direction is calculable as represented by expression (6).

$$R1-R3=(-cHx+aHy+dHz+R)-(-cHx+aHy-dHz+R)$$
$$=2dHz \qquad (6)$$

In other words, in a detecting method of a magnetic sensor including the seventh arrangement pattern and the ninth arrangement pattern, the magnetic field (i.e., X magnetic field) parallel to the longitudinal direction of the magnetic convergence material is converted into the same direction as those of the seventh arrangement pattern and the ninth arrangement pattern, the magnetic field (Y magnetic field) perpendicular to the longitudinal direction of the magnetic convergence material is converted into the same direction, the magnetic field (i.e., Z magnetic field) perpendicular to a plane direction of the magnetic convergence material is converted into the direction opposite to those of the seventh arrangement pattern and the ninth arrangement pattern. The difference between the resistance of the magnetic sensor including the seventh arrangement pattern and the resistance of the magnetic sensor including the ninth arrangement pattern is calculated, so that only the Z magnetic field is calculated independently.

When adding expression (2) and expression (3) in order to calculate the magnetic field in the Y-axis direction, by doubling expression (4) and taking a difference of the results, only the magnetic field in the Hy direction is calculable.

$$R2+R3-2R4=(cHx+aHy+dHz+R)+(-cHx+aHy-dHz+R)-2R=2aHy \qquad (7)$$

In other words, in the detecting method of a magnetic sensor of including the eighth arrangement pattern, the ninth arrangement pattern, and the tenth arrangement pattern, the magnetic field (i.e., X magnetic field) parallel to the longitudinal direction of the magnetic convergence material is converted into the direction opposite to those of the eighth arrangement pattern and the ninth arrangement pattern, the magnetic field (i.e., Y magnetic field) perpendicular to the longitudinal direction of the magnetic convergence material is converted into the same direction, the magnetic field (Z magnetic field) perpendicular to a plane direction of the magnetic convergence material is converted into the direction opposite to those of the eighth arrangement pattern and the ninth arrangement pattern. By calculating a sum of the resistance of the magnetic sensor including the eighth arrangement pattern and the resistance of the magnetic sensor including the ninth arrangement pattern, and then subtracting the sum from a double of the resistance of the magnetic sensor including the tenth arrangement pattern, only the Y magnetic field is calculated independently.

In addition, it is also possible to detect the magnetic fields of the two axes or three axes by combining two or more magnetic detecting methods described above.

In this way, the seventh to the tenth magnetic sensor units 450, 460, 470, and 480 are arranged on the identical flat surface and calculation is performed with each of resistances when each of the magnetic fields in the X, Y, and Z directions is applied. Accurate detection of Hx, Hy, and Hz components of the magnetic field is enabled.

The seventh magnetic sensor unit 450 and the eighth magnetic sensor unit 460 may form a positional relationship of line symmetry, whereas the seventh magnetic sensor unit 450 and the ninth magnetic sensor unit 470 may form a positional relationship of point symmetry. However, each of the magnetic sensor units may be arranged at an arbitrary position on a chip as far as the above-described embodiments are satisfied.

Moreover, any magnetic convergence plate of the tenth magnetic sensor unit 480 may be used as far as it covers the entire GMR, and is not limited to a rectangular shape. An arbitrary shape such as a triangle or a round may be used.

According to the invention, the detection of the magnetic field in three axes of X, Y, and Z directions can be detected by four GMR elements. Thus, downsizing or cost reduction can be expected. Furthermore, the sensitivity axes of the GMR elements in the third and fourth examples are aligned in parallel, so that the number of film formation for the GMR element can also be simplified and simpler and cheaper manufacturing can be achieved.

The present invention has been made to achieve the above object, and provides a magnetic sensor, comprising a first structure including a first arrangement pattern and a second arrangement pattern (211, 213), capable of detecting a magnetic field in an arbitrary axis direction parallel to a plane of a substrate, wherein the first arrangement pattern (211) includes: a first magnetic detection unit (201) including a quadrangular magnetic sensitivity material (201$a$) and a quadrangular magnetic convergence material (201$b$) having a length different from a length of the magnetic sensitivity unit on the substrate, and arranged parallel to the substrate and arranged horizontally so that a median line (Ma) passing through a midpoint of the magnetic sensitivity material in a longitudinal direction and a median line (Mb) of the magnetic convergence material in the longitudinal direction do not cross with each other, a second magnetic detection unit (202) having a structure same as a structure of the first magnetic detection unit; and a connecting unit electrically connecting the magnetic sensitivity material of the first magnetic detection unit in series with the magnetic sensitivity material of the second magnetic detection unit, wherein both of the magnetic sensitivity material of the first magnetic detection unit and the magnetic sensitivity material of the second magnetic detection unit are arranged in a positional relationship of point symmetry to be sandwiched by the magnetic convergence material of the first magnetic detection unit, and the magnetic convergence material of the second magnetic detection unit, and are arranged so that the first magnetic detection unit and the second magnetic detection unit do not overlap each other, and the second arrangement pattern (213) is parallel to the plane of the substrate, and has a structure same as a structure of the first arrangement pattern, so that the magnetic convergence material and the magnetic sensitivity material form a symmetric positional relationship about a line parallel to a longitudinal direction of the magnetic convergence material of the first arrangement pattern and are arranged in an opposite manner and aspirated not to overlap each other. (FIG. 22)

In addition, there is provided a magnetic sensor comprising a third structure including a third arrangement pattern and a fourth arrangement pattern (212, 214), capable of detecting a magnetic field in a direction perpendicular to a plane of a substrate, wherein the third arrangement pattern (212) includes: a third magnetic detection unit (203) including a quadrangular magnetic sensitivity material (203$a$) and a quadrangular magnetic convergence material (203$b$) having a length different from a length of the magnetic sensitivity unit on the substrate, arranged parallel to the substrate, and arranged horizontally so that a median line (Mb) passing through a midpoint of the magnetic sensitivity material in a longitudinal direction does not cross with each other; a fourth magnetic detection unit (204) having a line symmetry structure about a line perpendicular to a longitudinal direction of the magnetic convergence material of the third magnetic detection unit; and a connecting unit electrically connecting the magnetic sensitivity material of the third magnetic detection unit in series with a magnetic sensitivity material of the fourth magnetic detection unit, wherein the magnetic sensitivity material of the third magnetic detection unit is arranged to be sandwiched by the magnetic convergence material of the third magnetic detection unit and a magnetic convergence material (204b) of the fourth magnetic detection unit, and is arranged so that the third magnetic detection unit and the fourth magnetic detection unit are arranged parallel to each other and not overlap each other, wherein the fourth arrangement pattern (214) has a structure same as the structure of the second arrangement pattern, and wherein the third structure has a structure in which the second arrangement pattern and the fourth arrangement pattern are arranged in an opposite manner and separated not to overlap each other, and has a positional relationship of symmetry with each other about a point Mo. (FIG. 24).

In addition, the first structure (A) and a second structure (B) having a structure same as the first structure (A) may be arranged not parallel to each other and not to overlap each other. (FIG. 23)

Further, the first structure (A) and the second structure (B) may be arranged in a positional relationship of being perpendicular to each other. (FIG. 25)

Moreover, the first structure (A) and the second structure (B), or the first structure (A) and the third structure (C), or the second structure (B) and the third structure (C), or the first structure (A), the second structure (B) and the third structure (C) may be arranged on the identical plane.

In addition, in each of the first arrangement pattern (211) to the fourth arrangement pattern (214), a plurality of the arrangement patterns having the same structure may be provided to be an arrangement pattern group, so that the arrangement pattern groups are arranged parallel to each other and not to overlap each other, and the magnetic sensitivity units included in an identical arrangement pattern may be electrically connected to be a single series connection. (FIG. 26)

Further, in each of the magnetic convergence materials of the first arrangement pattern (211) to the fourth arrangement pattern (214), the magnetic convergence materials (211c) may be arranged to contact a short side of the magnetic convergence material on a far side from a structural center point of the arrangement pattern to form a letter T shape, and may be arranged in a positional relationship where a distance (A) between the magnetic convergence material (211c) and an adjacent magnetic convergence material may be longer than a distance (B) between two of the magnetic convergence materials in the arrangement pattern. (FIG. 27)

Moreover, a distance (D) between the magnetic convergence materials in each of the arrangement patterns may be longer than a distance (E) between two of the magnetic convergence materials in the each of the arrangement patterns. (FIG. 28)

In addition, the magnetic sensor may have a structure (D) comprising the first arrangement pattern (211) and a sixth arrangement pattern (216), where in a fifth arrangement pattern (215) having a positional relationship of symmetry with the first arrangement pattern with respect to a straight line parallel to a direction of the plane of the substrate and passing through a structural center point (N) of one (202b) of the two magnetic convergence materials (201b, 202b) included in the first arrangement pattern to be parallel to a long side of the magnetic convergence material (202b), a connecting unit (216a) electrically connecting the magnetic sensitivity materials (201a, 202a) is arranged at an end portion of the magnetic sensitivity material (201a, 202a) on the opposite side to the connecting unit (215a) in the fifth arrangement pattern 215. (FIGS. 29A to 29C)

Moreover, a plurality of the first arrangement patterns (211) and a plurality of the sixth arrangement patterns (216) may be alternately arrayed in a repetitive manner, the magnetic sensitivity materials in the first arrangement pattern may be connected by a connecting unit (211b) to be an electrically single series connection, and the magnetic sensitivity materials in the sixth arrangement pattern may be connected by a connecting unit (216b) to be the electrically single series connection, and wherein a distance (F1) between the magnetic convergence materials (201b, 202b) in the first arrangement pattern is equal to a distance (F2) between the magnetic convergence materials (201b, 202b) in the sixth arrangement pattern may be equal to each other. (FIG. 30)

In addition, in a magnetic detecting method of using the magnetic sensor, the method comprises detecting a magnetic field in an arbitrary axis direction in space is detected independently, by utilizing that magnetic field components in two or more axis directions of magnetic field components of the magnetic field in space in arbitrary different three axis directions are bent by the magnetic convergence materials.

Further, in a magnetic detecting method of using the magnetic sensor, the method comprises by use of the magnetic sensor having a first structure (A) including the first arrangement pattern and the third arrangement pattern, converting a magnetic field parallel to a longitudinal direction of the magnetic convergence material into directions opposite to the first arrangement pattern and the third arrangement pattern; converting the magnetic fields perpendicular to the longitudinal direction of the magnetic convergence material into the same direction; cancelling the magnetic fields perpendicular to a plane direction of the magnetic convergence material, as the magnetic fields are applied so that the magnetic fields in the magnetic sensitivity units adjacent to each other in a single pattern are + and −, respectively; and calculating a difference of a resistance of the magnetic sensitivity unit of the magnetic sensor including the first arrangement pattern and a resistance of the magnetic sensitivity unit of the magnetic sensor including the third arrangement pattern, so that only the magnetic field parallel to the longitudinal direction of the magnetic convergence material is calculated independently.

In addition, in a magnetic detecting method of using the magnetic sensor, the method comprises by use of the magnetic sensor having a second structure (B) in which the arrangement patterns of the first structure (A) are arranged not to be parallel to each other and not to overlap each other, converting the magnetic fields parallel to a longitudinal direction of the magnetic convergence material into directions opposite to the first arrangement pattern and the third arrangement pattern; converting the magnetic fields perpendicular to the longitudinal direction of the magnetic convergence material into the same direction; cancelling the magnetic fields perpendicular to a plane direction of the magnetic convergence material, as the magnetic fields are applied so that the magnetic fields in the magnetic sensitivity units adjacent to each other in a single pattern are + and −, respectively; and calculating a difference between a resistance of the magnetic sensor including the second structure (B), so that only the magnetic field parallel to the longitudinal direction of the magnetic convergence material is calculated independently.

In addition, in a magnetic detecting method of using the magnetic sensor, the method comprises by use of the magnetic sensor including the second arrangement pattern and the fourth arrangement pattern, converting the magnetic fields parallel to a longitudinal direction of the magnetic convergence material into the same direction as the second arrangement pattern and the fourth arrangement pattern; converting the magnetic fields perpendicular to the longitudinal direction of the magnetic convergence material into the same direction; converting the magnetic fields perpendicular to a plane direction of the magnetic convergence material into directions opposite to the second arrangement pattern and the fourth arrangement pattern; and calculating a difference between a resistance of the magnetic sensor including the fourth arrangement pattern and a resistance of the magnetic sensor including the second arrangement pattern, so that only the magnetic field perpendicular to the plane direction of the magnetic convergence material is calculated independently.

Further, the magnetic field components of two axes or three axes may be detected independently by combining the magnetic detecting methods.

Moreover, there is provided a magnetic sensor capable of detecting a magnetic field in an arbitrary axis direction parallel to a plane of a substrate, the magnetic sensor comprising: a seventh magnetic detection unit including a quadrangular magnetic sensitivity material and a quadrangular magnetic convergence material having a length different from a length of the magnetic sensitivity unit on the plane of the substrate, and being arranged so that a median line parallel to the flat substrate and passing through a midpoint of the magnetic sensitivity material in the longitudinal direction and a median line passing through a midpoint of the magnetic convergence material in the longitudinal direction do not cross with each other; and an eighth magnetic detection unit having a structure same as a structure of the seventh magnetic detection unit, wherein a magnetic sensitivity material of the eighth magnetic detection unit is arranged to be sandwiched by the magnetic convergence material of the seventh magnetic detection unit and the magnetic convergence material of the eighth magnetic detection unit, wherein a seventh arrangement pattern (311) is provided such that the seventh magnetic detection unit and the eighth magnetic detection unit are arranged parallel to each other and not to overlap each other, and includes a connecting unit electrically connecting the magnetic sensitivity material of the seventh magnetic detection unit in series with the magnetic sensitivity material of the eighth magnetic detection unit, and wherein the eighth arrangement pattern (312) having the structure same as the structure of the seventh arrangement pattern is arranged parallel to the plane of the substrate, being symmetric about a line parallel to a short side direction of the magnetic convergence material of the seventh arrangement pattern, and being separated not to overlap each other in an opposite manner.

Further, the magnetic sensor may include a ninth arrangement pattern (313) having the structure same as the seventh arrangement pattern on the plane of the substrate so that a magnetic field in an axis direction perpendicular to the plane of the substrate can be detected, wherein the ninth arrangement pattern may be arranged symmetric with the seventh arrangement pattern about an arbitrary point, and may be arranged so that a longitudinal direction of the magnetic convergence material of the seventh arrangement pattern and a longitudinal direction of the ninth arrangement pattern are separated to be parallel to each other and do not overlap each other, and wherein the seventh arrangement pattern, the eighth arrangement pattern, and the ninth arrangement pattern may be parallel to one another, and may be arranged at different positions.

Moreover, the magnetic sensor may further comprise a tenth arrangement pattern (314) on the identical substrate, the tenth arrangement pattern including a magnetic sensitivity material having the arrangement pattern same as anyone of the magnetic sensitivity materials in the seventh to ninth arrangement patterns, and a magnetic convergence material covering the whole surface of the magnetic sensitivity material.

In addition, a plurality of arrangement patterns from any one of the seventh arrangement pattern to the tenth arrangement pattern may form arrangement pattern groups, the arrangement pattern groups may be arranged parallel to each other and not to overlap each other, and the magnetic sensitivity units in each of the arrangement pattern groups may be electrically connected by a connecting unit to be a single series connection.

Further, in a magnetic detecting method of a magnetic sensor including the seventh arrangement pattern and the eighth arrangement pattern, the method comprises: converting a magnetic field (i.e., X magnetic field) parallel to a longitudinal direction of the magnetic convergence material into directions opposite to the seventh arrangement pattern and the eighth arrangement pattern; converting a magnetic field (i.e., Y magnetic field) perpendicular to the longitudinal direction of the magnetic convergence material into the same direction; converting a magnetic field (i.e., Z magnetic field) perpendicular to a plane direction of the magnetic convergence material into the same direction as directions of the seventh arrangement pattern and the eighth arrangement pattern; and calculating a difference between a resistance of the magnetic sensor including the seventh arrangement pattern and a difference of the magnetic sensor including the eighth arrangement pattern, so that only the X magnetic field is calculated independently.

Moreover, in a detecting method of a magnetic sensor including the eighth arrangement pattern, the ninth arrangement pattern and the tenth arrangement pattern, the method comprises: converting a magnetic field (i.e., X magnetic field) parallel to a longitudinal direction of the magnetic convergence material into a direction opposite to the eighth arrangement pattern and the ninth arrangement pattern; converting a magnetic field (i.e., Y magnetic field) perpendicular to the longitudinal direction of the magnetic convergence material into the same direction; converting a magnetic field (i.e., Z magnetic field) perpendicular to a plane direction of the magnetic convergence material into directions opposite to the eighth arrangement pattern and the ninth arrangement pattern; calculating a sum of a resistances of the magnetic sensor including the eighth arrangement pattern and a resistance of the magnetic sensor including the ninth arrangement pattern; and calculating a difference between a sum and a double of the resistance of the magnetic sensor including the tenth arrangement pattern, so that only the Y magnetic field is calculated independently.

In addition, in a detecting method of a magnetic sensor including the seventh arrangement pattern and the ninth arrangement pattern in the magnetic sensor, the method comprising: converting a magnetic field (i.e., X magnetic field) parallel to a longitudinal direction of the magnetic convergence material into the direction same as the seventh arrangement pattern and the ninth arrangement pattern; converting a magnetic field (i.e., Y magnetic field) perpendicular to the longitudinal direction of the magnetic convergence material into the same direction; converting a magnetic field (i.e., Z magnetic field) perpendicular to a plane direction of the magnetic convergence material into the directions opposite to directions of the seventh arrangement pattern and the ninth arrangement pattern; and calculating a difference between a resistance of the magnetic sensor including the seventh arrangement pattern and a resistance of the magnetic sensor including the ninth arrangement pattern, so that only the Z magnetic field is calculated independently.

Further, the magnetic fields of two axes or three axes may be detected by combining the above-described two or more magnetic detecting methods.

Moreover, areas of the magnetic sensitivity materials (201a, 202a) forming two arrangement patterns, respectively, in the each structure may be equal to each other. (FIG. 31)

In addition, end portions of the magnetic sensitivity materials (201a, 202a) which are not electrically coupled by the connecting units (211a, 213a) may be electrically coupled to electrode pads (P1 to P4) or a signal processing circuit. (FIG. 32)

Further, in the single arrangement pattern (211), a median line (La) of the magnetic sensitivity material (201a, 202a), parallel to the plane of the substrate, in the longitudinal direction of the first and second magnetic detection units (201, 202) forming the single arrangement pattern may be arranged between a median line (Lb) of the magnetic convergence material (201b, 202b), in the longitudinal direction of the first and second magnetic detection units (201, 202) and a point of symmetry or a line of symmetry in the single arrangement pattern. (FIG. 33)

Moreover, the magnetic sensitivity materials (201a to 204a) and the magnetic convergence materials (201b to 204b) may be formed on the identical substrate, and a bottom surface of the magnetic sensitivity material may be arranged under a bottom surface of the magnetic convergence material. (FIG. 34)

In addition, the magnetic sensitivity material may be a Giant Magnet Resistance element (GMR) or a Tunnel MagnetoResistance element (TMR).

Further, a width of the magnetic sensitivity material in a short side direction may be ranging from 0.1 to 20 microns.

Moreover, the magnetic convergence units may be made of a soft magnetism material, such as NiFe, NiFeB, NiFeCo, CoFe, or the like.

In addition, the thickness of the magnetic convergence material may be ranging from 1 to 40 microns.

Further, there is provided a comb-like magnetic convergence plate (172) in which a plurality of protruding members are formed at equal interval; another comb-like magnetic convergence plate (173) which is provided opposite to the magnetic convergence plate and in which protrusions of a plurality of protruding members are formed at equal interval; and a magnetoresistance element (171) arranged in a meandering form along the protruding members of the magnetic convergence plates, wherein single arrangement patterns (G, H) are provided, in which a first part (172a) of the magnetic convergence plate (172) is arranged at outside of one part of a letter U-shaped part of the magnetoresistance element (171), and a first part (173a) of another magnetic convergence plate (173) is arranged at outside of another part of the letter U-shaped part of the magnetoresistance element (171). (FIG. 17A)

Further, the single arrangement patterns (G, H) may be line symmetry with each other. (FIG. 17A)

Moreover, when the magnetic convergence plates (172, 173) are removed, the first part (172a) and the second part (173a) of the magnetic convergence plates (172, 173) may project from the magnetoresistance element. (FIG. 17B)

In addition, a distance (E) between the first part (172a) of the magnetic convergence plate (172) sandwiching the magnetic sensitivity units (171a, 171b) of the magnetoresistance element (171) and the first part (173a) of another magnetic convergence plate (173) may be shorter than a distance (F) between the magnetic convergence plates over the arrangement patterns. (FIG. 17B)

Further, the connecting unit of the magnetic sensitivity units (171a, 171b) of the magnetoresistance element (171) may include a material which is not the same material as those of the magnetic sensitivity units (171a, 171b). (FIG. 17C)

Moreover, a letter T-shaped magnetic convergence members (172c, 173c) may be provided at the first part (172a) of the magnetic convergence plate (172) and the first part (173a) of the magnetic convergence plate (173), and may have a positional relationship where a distance (A) between the magnetic convergence members (172c, 173c) and adjacent magnetic convergence material is longer than a distance (B) between two magnetic convergence materials in the arrangement pattern. (FIG. 17D)

In addition, the single arrangement patterns (G, H) may be arranged with a shift in the X-axis direction. (FIG. 17E)

Further, the first part (172a) of the magnetic convergence plate (172) and the first part (173a) of another magnetic convergence plate (173) may be arranged at equal distance from the magnetic sensitivity units (171a, 171b), respectively, without the first part (172a) of the magnetic convergence plate (172) being in contact with the magnetic sensitivity unit (171a), or without the first part (173a) of the magnetic convergence plate (173) being in contact with the magnetic sensitivity unit (171b). (FIG. 18A)

Moreover, in the cross-section, the magnetic sensitivity units (171a, 171b) may be arranged under the first part (172a) of the magnetic convergence plate (172) and the first part (173a) of another magnetic convergence plate (173), and may not exceed a median line of the magnetic convergence plate. (FIG. 18B)

In addition, the shape of a tip portion of each of the first parts (172a, 173a) not connected with the magnetic convergence plates (172, 173) may be a rectangular. (FIG. 18C)

Additionally, there is provided a comb-like magnetic convergence plate (172) in which a plurality of protruding members are formed at equal interval; another comb-like magnetic convergence plate (173) which is provided opposite to the magnetic convergence plate and in which protrusions of a plurality of protruding members are formed at equal interval; and a magnetoresistance element arranged in a meandering form along the protruding members of the magnetic convergence plates, wherein single arrangement patterns (I, J) are provided, in which a first part (173a) of the magnetic convergence plate (173) is arranged at inside of one part of a letter U-shaped part of the magnetoresistance element (171), and a first part (172a) of the magnetic convergence plate (172) is arranged at outside of another part of the letter U-shaped part of the magnetoresistance element (171). (FIG. 19A)

Further, the single arrangement patterns (I, J) may be point symmetry to each other. (FIG. 19A)

Moreover, the distance (E) between the magnetic convergence plates of the single arrangement pattern may be shorter than the distance (F) between the same single arrangement patterns adjacent to each other. (FIG. 19B)

In addition, when the magnetic convergence plates (172, 173) are removed, the first part (172a) and the second part (173a) of the magnetic convergence plates (172, 173) may project from the magnetoresistance element. (FIG. 19C)

Further, a letter T-shaped magnetic convergence members (172c, 173c) may be provided at the first part (172a) of the magnetic convergence plate (172) and the first part (173a) of the magnetic convergence plate (173), and the arrangement may have a positional relationship where a distance (A) between the magnetic convergence member (172c, 173c) and adjacent magnetic convergence material may be longer than a distance (B) between the two magnetic convergence materials in the arrangement pattern. (FIG. 19D)

Moreover, in each of the magnetic convergence materials of the seventh arrangement pattern to the eighth arrangement pattern, the magnetic convergence member may be arranged to contact the short side of the magnetic convergence material on a far side from a structural center point of the first and eighth arrangement patterns to form a letter T shape, and may be arranged in a positional relationship where a distance between the magnetic convergence member and adjacent magnetic convergence material may be longer than a distance between two magnetic convergence materials in the arrangement pattern.

In addition, a distance between the magnetic convergence material over each of the arrangement patterns may be longer than a distance between two magnetic convergence materials in each arrangement pattern.

Furthermore, there is provided a magnetic sensor comprising a first arrangement pattern, capable of detecting a magnetic field in an arbitrary axis direction parallel to a plane of a substrate, wherein the first arrangement pattern comprises: a first magnetic detection unit including a quadrangular magnetic sensitivity material and a quadrangular magnetic convergence material having a length different from a length of the magnetic sensitivity unit on the substrate, and arranged parallel to the substrate and arranged horizontally so that a median line passing through a midpoint of the magnetic sensitivity material in a longitudinal direction and a median line of the magnetic convergence material in the longitudinal direction do not cross with each other; a second magnetic detection unit having a structure same as a structure of the first magnetic detection unit; and a connecting unit electrically connecting the magnetic sensitivity material of the first magnetic detection unit in series with the magnetic sensitivity material of the second magnetic detection unit, wherein both of the magnetic sensitivity material of the first magnetic detection unit and the magnetic sensitivity material of the second magnetic detection unit are arranged in a positional relationship of point symmetry to be sandwiched by the magnetic convergence material of the first magnetic detection unit and the magnetic convergence material of the second magnetic detection unit, and are arranged so that the first magnetic detection unit and the second magnetic detection unit do not overlap each other.

Moreover, there is provided a magnetic sensor comprising a second arrangement pattern, capable of detecting a magnetic field in a direction perpendicular to a plane of a substrate, wherein the second arrangement pattern comprises: a third magnetic detection unit including a quadrangular magnetic sensitivity material and a quadrangular magnetic convergence material having a length different from a length of the magnetic sensitivity unit on the substrate, and arranged parallel to the substrate and arranged horizontally so that a median line passing through a midpoint of the magnetic sensitivity material in a longitudinal direction does not cross with each other; a fourth magnetic detection unit including a line symmetry structure about a line perpendicular to a longitudinal direction of the magnetic convergence material of the third magnetic detection unit; and a connecting unit electrically connecting the magnetic sensitivity material of the third magnetic detection unit in series with the magnetic sensitivity material of the fourth magnetic detection unit, wherein the magnetic sensitivity material of the third magnetic detection unit is arranged to be sandwiched by the magnetic convergence material of the third magnetic detection unit and the magnetic convergence material of the fourth magnetic detection unit, and wherein the third magnetic detection unit and the fourth magnetic detection unit are arranged parallel to each other and not to overlap each other.

Advantageous Effects of Invention

According to the present invention, it is possible to achieve a magnetic sensor including a magnetoresistance element and being capable of detecting magnetic fields of X-, Y-, and Z-axis directions on the identical substrate without an increase of electric current consumption, and also to achieve a magnetic detecting method. Moreover, since a magnetic field of each axis are calculated by an operation on an output from a combined signal of X-, Y-, and Z-axis directions, a small-sized magnetic sensor can be provided without the need for forming abridged circuit. In addition, high sensitivity is achievable by the magnetic amplification effect of the magnetic convergence plates.

Moreover, a manufacturing process is simplified by aligning the sensitivity axes in the same direction, a smaller number of magnetic detection units are provided on the identical substrate as compared to an early technology, and therefore a magnetic sensor capable of detecting the magnetic fields of X-, Y-, and Z-axis directions and a magnetic detecting method are achievable.

REFERENCE SIGNS LIST

1 Antiferromagnetic layer
2 Pinned layer (Fixed layer)
3 Cu layer (Spacer layer)
4 Free layer (Free rotation layer)
21, 31, 41, 51, 61, 71, 81, 91, 101, 171 GMR element
22, 52, 62, 72, 82, 92, 102 A magnetic convergence plate
23, 53, 63, 73, 83, 93, 103 Another magnetic convergence plate
32, 33, 42, 43 Magnetic concentrator
50 First magnetic sensor unit
51a First part of GMR element 51
51b Second part of GMR element 51
51c Third part of GMR element 51
51d Fourth part of GMR element 51
51e Fifth part of GMR element 51
51f Sixth part of GMR element 51
52a First part of comb-teeth of a magnetic convergence plate 52
52b Second part of comb-teeth of the magnetic convergence plate 52
52c Third part of comb-teeth of the magnetic convergence plate 52
53a First part of comb-teeth of another magnetic convergence plate 53
53b Second part of comb-teeth of the magnetic convergence plate 53
53c Third part of comb-teeth of the magnetic convergence plate 53
60 Second magnetic sensor unit
61a First part of GMR element 61

61b Second part of GMR element 61
61c Third part of GMR element 61
61d Fourth part of GMR element 61
61e Fifth part of GMR element 61
61f Sixth part of GMR element 61
62a First part of comb-teeth of a magnetic convergence plate 62
62b Second part of comb-teeth of the magnetic convergence plate 62
62c Third part of comb-teeth of the magnetic convergence plate 62
63a First part of comb-teeth of another magnetic convergence plate 63
63b Second part of comb-teeth of the magnetic convergence plate 63
63c Third part of comb-teeth of the magnetic convergence plate 63
70 Third magnetic sensor unit
71, 81 GMR element
72, 82 One magnetic convergence plate
73, 83 Another magnetic convergence plate
80 Fourth magnetic sensor unit
90 Fifth magnetic sensor unit
91a First part of GMR element 91
91b Second part of GMR element 91
91e Third part of GMR element 91
91f Fourth part of GMR element 91
92a First part of a magnetic convergence plate 92
92b Second part of the magnetic convergence plate 92
93a First part of another magnetic convergence plate 93
93b Second part of the magnetic convergence plate 93
100 Sixth magnetic sensor unit
101a First part of GMR element 101
101b Second part of GMR element 101
101e Third part of GMR element 101
101f Fourth part of GMR element 101
102a First part of a magnetic convergence plate 102
102b Second part of the magnetic convergence plate 102
103a First part of another magnetic convergence plate 103
103b Second part of the magnetic convergence plate 103
110, 200 Same flat substrate
111 to 122 Electrode pad
112, 113, 115, 116, 117, 118, 119, 120, 121, 122 Electrode
131 to 142 Wiring
150, 180 X-axis sensor
160, 190 Y-axis sensor
170 Z-axis sensor
171a, 171b Magnetic sensitivity unit
172, 173 Magnetic concentrator
172a First part of magnetic convergence plate 172
173a First part of magnetic convergence plate 173
201 First magnetic detection unit
201a, 203a Magnetic sensitivity material
201b, 203b Magnetic convergence material
202 Second magnetic detection unit
203 Third magnetic detection unit
204 Fourth magnetic detection unit
204b Magnetic convergence material
211 First arrangement pattern
211a, 211b, 212a, 213a, 216b Connecting unit
211c Magnetic convergence member
212 Third arrangement pattern
213 Second arrangement pattern
214 Fourth arrangement pattern
215 Fifth arrangement pattern
216 Sixth arrangement pattern
301 Seventh magnetic sensing unit
301a, 302a Magnetic sensitivity material
301b, 302b Magnetic convergence material
302 Eighth magnetic sensing unit
311 Seventh arrangement pattern
311a, 311b, 312a Connecting unit
311c Magnetic convergence member
312 Eighth arrangement pattern
313 Ninth arrangement pattern
314 Tenth arrangement pattern
450 Seventh magnetic sensor unit
451a First part of GMR element 451
451b Second part of GMR element 451
451c Third part of GMR element 451
451d Fourth part of GMR element 451
452a First part of comb-teeth of a magnetic convergence plate 452
452b Second part of comb-teeth of the magnetic convergence plate 452
453a First part of comb-teeth of another magnetic convergence plate 453
453b Second part of comb-teeth of the magnetic convergence plate 453
460 Eighth magnetic sensor unit
461a First part of GMR element 461
461b Second part of GMR element 461
461c Third part of GMR element 461
461d Fourth part of GMR element 461
462a First part of comb-teeth of a magnetic convergence plate 462
462b Second part of comb-teeth of the magnetic convergence plate 462
463a First part of comb-teeth of another magnetic convergence plate 463
463b Second part of comb-teeth of the magnetic convergence plate 463
470 Ninth magnetic sensor unit
471a First part of GMR element 471
471b Second part of GMR element 471
471c Third part of GMR element 471
471d Fourth part of GMR element 471
472a First part of comb-teeth of a magnetic convergence plate 472
472b Second part of comb-teeth of the magnetic convergence plate 472
473a First part of comb-teeth of another magnetic convergence plate 473
473b Second part of comb-teeth of the magnetic convergence plate 473
480 Tenth magnetic sensor unit
481a First part of GMR element 481
481b Second part of GMR element 481
481c Third part of GMR element 481
481d Fourth part of GMR element 481

The invention claimed is:

1. A magnetic sensor comprising a first structure, the first structure comprising:
    a first arrangement pattern; and
    a second arrangement pattern,
    wherein each of the first arrangement pattern and the second arrangement pattern comprises:
        a first magnetic detection unit;
        a second magnetic detection unit; and
        a connecting unit configured to electrically connect the first magnetic detection unit and the second magnetic detection unit,
    wherein each of the first magnetic detection unit and the second magnetic detection unit comprises:

a quadrangular magnetic sensitivity material having a first length in a longitudinal direction; and a quadrangular magnetic convergence material having a second length in a longitudinal direction different from the first length of the quadrangular magnetic sensitivity material, wherein the first magnetic detection unit and the second magnetic detection unit of each of the first arrangement pattern and the second arrangement pattern are arranged such that a first virtual line and a second virtual line are parallel to each other, the first virtual line passing to be parallel to a plane of a substrate and passing through a midpoint in the longitudinal direction of the quadrangular magnetic sensitivity material perpendicularly to the longitudinal direction of the quadrangular magnetic sensitivity material, the second virtual line passing to be parallel to the plane of the substrate and passing through a midpoint in the longitudinal direction of the quadrangular magnetic convergence material perpendicularly to the longitudinal direction of the quadrangular magnetic convergence material, wherein in each of the first arrangement pattern and the second arrangement pattern, the connecting unit is configured to electrically connect the quadrangular magnetic sensitivity material of the first magnetic detection unit and the quadrangular magnetic sensitivity material of the second magnetic detection unit in series with each other, wherein in each of the first arrangement pattern and the second arrangement pattern, the quadrangular magnetic sensitivity material of the first magnetic detection unit and the quadrangular magnetic sensitivity material of the second magnetic detection unit are arranged between the quadrangular magnetic convergence material of the first magnetic detection unit and the quadrangular magnetic convergence material of the second magnetic detection unit, and wherein in each of the first arrangement pattern and the second arrangement pattern, the first magnetic detection unit and the second magnetic detection unit are arranged to be line-symmetric to each other.

2. The magnetic sensor according to claim 1, further comprising:

a plurality of first arrangement patterns form a first arrangement pattern group and a plurality of second arrangement patterns form a second arrangement pattern group such that the first arrangement pattern group and the second arrangement pattern group are arranged to be parallel to each other and not to overlap each other; and wherein a plurality of magnetic sensitivity units are included in each of the plurality of first arrangement patterns and the plurality of second arrangement patterns, and are electrically connected in series with each other.

3. A magnetic detecting method of using the magnetic sensor according to claim 1, the method comprising: by use of the magnetic sensor comprising the first structure comprising the first arrangement pattern and the second arrangement pattern, converting magnetic fields parallel to a longitudinal direction of magnetic convergence material into magnetic fields in directions opposite to the first arrangement pattern and the second arrangement pattern; converting magnetic fields perpendicular to the longitudinal direction of the magnetic convergence material into magnetic fields in the same direction of the first arrangement pattern and the second arrangement pattern; cancelling the magnetic fields perpendicular to a plane of the magnetic convergence material, as the magnetic fields are applied so that the magnetic fields in magnetic sensitivity units adjacent to each other in a single pattern are e + and −, respectively; and calculating a difference between a resistance of a magnetic sensitivity unit of the magnetic sensor comprising the first arrangement pattern and a resistance of the a magnetic sensitivity unit of the magnetic sensor comprising the second arrangement pattern, so that only the magnetic field parallel to the longitudinal direction of the magnetic convergence material is calculated independently.

4. The magnetic sensor according to claim 1, further comprising a second structure comprising a third arrangement pattern that is structurally identical to the first arrangement pattern, and a fourth arrangement pattern that is structurally identical to the second arrangement pattern, wherein the first structure and the second structure are arranged not to be parallel to each other and not to overlap each other.

5. The magnetic sensor according to claim 4, wherein the first structure and the second structure are arranged to be perpendicular to each other.

6. The magnetic sensor according to claim 4, wherein the first structure and the second structure are arranged on the plane of the substrate.

7. A magnetic detecting method of using the magnetic sensor according to claim 4, the method comprising: by use of the magnetic sensor further comprising the second structure in which the third arrangement pattern and the fourth arrangement pattern of the second structure are arranged not to be parallel to each other and not to overlap each other, converting magnetic fields parallel to a longitudinal direction of magnetic convergence material into magnetic fields in directions opposite to the third arrangement pattern and the fourth arrangement pattern; converting magnetic fields perpendicular to the longitudinal direction of the magnetic convergence material into magnetic fields in the same direction of the third arrangement pattern and the fourth arrangement pattern; cancelling the magnetic fields perpendicular to a plane of the magnetic convergence material, as the magnetic fields are applied so that the magnetic fields in magnetic sensitivity units adjacent to each other in a single pattern are + and −, respectively; and calculating a difference between resistances of the magnetic sensor comprising the second structure, so that only the magnetic field parallel to the longitudinal direction of the magnetic convergence material is calculated independently.

8. A magnetic sensor comprising a first structure, the first structure comprising:

a first arrangement pattern; and a second arrangement pattern, wherein each of the first arrangement pattern and the fourth second arrangement pattern comprises:

a first magnetic detection unit;

a second magnetic detection unit; and a connecting unit configured to electrically connect the first magnetic detection unit and the second magnetic detection unit, wherein each of the first magnetic detection unit and the second magnetic detection unit comprises:

a quadrangular magnetic sensitivity material having a first length in a longitudinal direction; and a quadrangular magnetic convergence material having a second length in a longitudinal direction different from the first length of the quadrangular magnetic sensitivity material, wherein the first magnetic detection unit and the second magnetic detection unit of each of the first arrangement pattern and the second arrangement pattern are arranged such that a first virtual line and a second virtual line are parallel to each other, the first virtual line passing to be parallel to a plane of a substrate and passing through a midpoint in the longitudinal direction of the quadrangular magnetic sensitivity material perpendicularly to the longitudinal direction of the quadrangular magnetic sensitivity material, the second virtual line passing to be parallel to the plane of the substrate and passing through a midpoint in the longitudinal direction of the quadrangular magnetic convergence material perpendicularly to the longitudinal direction of the quadrangular magnetic convergence material, wherein in each of the first arrangement pattern and the second arrangement pattern, the connecting unit is configured to electrically connect the quadrangular magnetic sensitivity material of the first magnetic detection unit and the quadrangular magnetic sensitivity material of the second magnetic detection unit in series with each other, wherein in each of the first arrangement pattern and the second arrangement pattern, the quadrangular magnetic sensitivity material of the first magnetic detection unit and the quadrangular magnetic convergence material of the second magnetic detection unit are arranged between the quadrangular magnetic sensitivity material of the second magnetic detection unit and the quadrangular magnetic convergence material of the first magnetic detection unit, and wherein in each of the first arrangement pattern and the second arrangement pattern, the first magnetic detection unit and the second magnetic detection unit are arranged to be point-symmetric to each other.

9. A magnetic detecting method of using the magnetic sensor according to claim 8, the method comprising: by use of the magnetic sensor comprising the first structure comprising the first arrangement pattern and the second arrangement pattern, converting magnetic fields parallel to a longitudinal direction of magnetic convergence material into magnetic fields in the same direction as the first arrangement pattern and the second arrangement pattern; converting magnetic fields perpendicular to the longitudinal direction of the magnetic convergence material into magnetic fields in the same direction of the first arrangement pattern and the second arrangement pattern; converting the magnetic fields perpendicular to a plane of the magnetic convergence material into magnetic fields in directions opposite to the first arrangement pattern and the second arrangement pattern; and calculating a difference between a resistance of the magnetic sensor comprising the second arrangement pattern and a resistance of the magnetic sensor comprising the first arrangement pattern, so that only the magnetic fields perpendicular to the plane of the magnetic convergence material is calculated independently.

10. The magnetic sensor according to claim 8, further comprising a third arrangement pattern, which is structurally identical to the second arrangement pattern, on the plane of the substrate, wherein the third arrangement pattern is arranged parallel to the plane of the substrate, to be line-symmetric to a virtual line perpendicular to the longitudinal direction of the magnetic convergence material of the second arrangement pattern, and to be apart from the second arrangement pattern not to overlap the second arrangement pattern.

11. A detecting method of the magnetic sensor comprising the first arrangement pattern and the second arrangement pattern in the magnetic sensor according to claim 10, the method comprising: converting a magnetic field in the X axis direction parallel to the longitudinal direction of the magnetic convergence material into the magnetic field by applying a magnetic field in the same direction as the first arrangement pattern and the second arrangement pattern; converting a magnetic field in the Y axis direction perpendicular to the longitudinal direction of the magnetic convergence material by applying a magnetic field in the same direction as the first arrangement pattern and the second arrangement pattern; converting a magnetic field in the Z axis direction perpendicular to a plane direction of the magnetic convergence material into the magnetic field in a direction opposite to the first arrangement pattern and the second arrangement pattern; calculating a difference between a resistance of the magnetic sensor comprising the first arrangement pattern and a resistance of the magnetic sensor comprising the second arrangement pattern, so that only the Z magnetic field is calculated independently.

12. The magnetic sensor according to claim 10, further comprising a fourth arrangement pattern on the plane of the substrate, wherein the fourth arrangement pattern comprises: a magnetic sensitivity material; and a magnetic convergence material covering the magnetic sensitivity material.

13. A detecting method of the magnetic sensor comprising the first arrangement pattern, the third arrangement pattern and the fourth arrangement pattern in the magnetic sensor according to claim 12, the method comprising: converting a magnetic field in the X axis direction parallel to the longitudinal direction of the magnetic convergence material by applying a magnetic field in a direction opposite a magnetic field of the first arrangement pattern and the third arrangement pattern; converting a magnetic field in the Y axis direction perpendicular to the longitudinal direction of the magnetic convergence material by applying a magnetic field in the same direction as the first arrangement pattern and the third arrangement pattern; converting a magnetic field in the Z axis direction perpendicular to a plane direction of the magnetic convergence material into the magnetic field in a direction opposite to the first arrangement pattern and the third arrangement pattern; calculating a sum of a resistance of the magnetic sensor comprising the first arrangement pattern and a resistance of the magnetic sensor comprising the third arrangement pattern; and calculating a difference between a sum and a double the resistance of the magnetic sensor comprising the fourth arrangement pattern, so that only the Y magnetic field is calculated independently.

14. The magnetic sensor according to claim 12,
wherein at least two of a plurality of the second arrangement patterns to a plurality of the third arrangement patterns form at least two arrangement pattern groups,
wherein the at least two arrangement pattern groups are arranged to be parallel to each other and not to overlap each other, and
wherein the magnetic sensitivity units in the at least two of the arrangement pattern groups are electrically connected in series with each other.

15. A magnetic detecting method of the magnetic sensor comprising the second arrangement pattern and the third arrangement pattern in the magnetic sensor according to claim 14, the method comprising: converting a magnetic field in the X axis direction parallel to the longitudinal direction of the magnetic convergence material by applying a magnetic field in a direction opposite a magnetic field of the second arrangement pattern and the third arrangement pattern; converting a magnetic field in the Y axis direction perpendicular to the longitudinal direction of the magnetic convergence material by applying a magnetic field in the same direction of the second arrangement pattern and the third arrangement pattern; converting a magnetic field in the Z axis direction perpendicular to a plane direction of the magnetic convergence material into the magnetic field in the same direction as the second arrangement pattern and the third arrangement pattern; and calculating a difference between a resistance of the magnetic sensor comprising the second arrangement pattern and a resistance of the magnetic sensor comprising the third arrangement pattern, so that only the X magnetic field is calculated independently.

* * * * *